(12) United States Patent
Thom et al.

(10) Patent No.: US 8,279,022 B2
(45) Date of Patent: Oct. 2, 2012

(54) INPUT/OUTPUT SYSTEMS AND DEVICES FOR USE WITH SUPERCONDUCTING DEVICES

(75) Inventors: Murray C. Thom, Vancouver (CA); Alexander M. Tcaciuc, New Westminster (CA); Gordon Lamont, New Westminster (CA); Jacob Craig Petroff, Vancouver (CA); Richard David Neufeld, Burnaby (CA); David S. Bruce, Burnaby (CA); Sergey V. Uchaykin, Burnaby (CA)

(73) Assignee: D-Wave Systems Inc., Burnaby (CA)

( * ) Notice: Subject to any disclaimer, the term of this patent is extended or adjusted under 35 U.S.C. 154(b) by 449 days.

(21) Appl. No.: 12/503,671

(22) Filed: Jul. 15, 2009

(65) Prior Publication Data

US 2010/0157552 A1    Jun. 24, 2010

Related U.S. Application Data

(60) Provisional application No. 61/080,996, filed on Jul. 15, 2008, provisional application No. 61/080,997, filed on Jul. 15, 2008, provisional application No. 61/110,382, filed on Oct. 31, 2008.

(51) Int. Cl.
*H03H 7/01* (2006.01)

(52) U.S. Cl. ........ 333/168; 333/175; 333/185; 333/99 S

(58) Field of Classification Search ............. 333/12, 333/167, 168, 177, 181, 182, 185, 99 S
See application file for complete search history.

(56) References Cited

U.S. PATENT DOCUMENTS

| | | | | |
|---|---|---|---|---|
| 2,865,006 A | * | 12/1958 | Sabaroff | 333/33 |
| 3,783,417 A | * | 1/1974 | Osada et al. | 333/185 |
| 4,761,623 A | * | 8/1988 | Schneider | 333/167 |
| 5,083,101 A | * | 1/1992 | Frederick | 333/181 |
| 5,313,176 A | * | 5/1994 | Upadhyay | 333/181 |
| 5,319,343 A | * | 6/1994 | Jeffries | 336/181 |
| 5,939,955 A | * | 8/1999 | Chen et al. | 333/185 |
| 2006/0225165 A1 | | 10/2006 | Maassen van den Brink et al. | 977/933 |
| 2008/0176750 A1 | | 7/2008 | Rose et al. | 505/170 |
| 2008/0176751 A1 | | 7/2008 | Tcaciuc et al. | 505/210 |
| 2008/0215850 A1 | | 9/2008 | Berkley et al. | 712/1 |
| 2009/0122508 A1 | | 5/2009 | Uchaykin et al. | 361/818 |
| 2009/0168286 A1 | | 7/2009 | Berkley et al. | 361/141 |

OTHER PUBLICATIONS

Milliken, et al., "50 Ω Characteristic Impedance Low-Pass Metal Powder Filters," *Review of Scientific Instruments* 78(024701) 5 pp., 2007.
Pobell, Matter and Methods at Low Temperatures, Springer-Verlag, Second Edition, 120-156, 1996.

(Continued)

*Primary Examiner* — Seungsook Ham
(74) *Attorney, Agent, or Firm* — Seed IP Law Group PLLC

(57) ABSTRACT

Systems and devices for providing differential input/output communication with a superconducting device are described. Each differential I/O communication is electrically filtered using a respective tubular filter structure incorporating superconducting lumped element devices and high frequency dissipation by metal powder epoxy. A plurality of such tubular filter structures is arranged in a cryogenic, multi-tiered assembly further including structural/thermalization supports and a device sample holder assembly for securing a device sample, for example a superconducting quantum processor. The interface between the cryogenic tubular filter assembly and room temperature electronics is achieved using hermetically sealed vacuum feed-through structures designed to receive flexible printed circuit board cable.

21 Claims, 35 Drawing Sheets

OTHER PUBLICATIONS

PCT Application Serial No. PCT/US2009/032744, filed Jan. 30, 2009 in the name of Sergey V. Uchaykin et al., 33 pages.
PCT Application Serial No. PCT/US2009/37984, filed Mar. 23, 2009 in the name of Paul Bunyk et al., 62 pages.
U.S. Appl. No. 12/016,801, filed Jan. 18, 2008, Thom et al.
U.S. Appl. No. 12/256,332, filed Oct. 22, 2008, Uchaykin.
U.S. Appl. No. 12/266,378, filed Nov. 6, 2008, Choi.
U.S. Appl. No. 60/080,996, filed Jul. 15, 2008, Thom et al.
U.S. Appl. No. 61/080,997, filed Jul. 15, 2008, Thom et al.
U.S. Appl. No. 60/104,179, filed Oct. 9, 2008, Lanting et al.
U.S. Appl. No. 61/110,382, filed Oct. 31, 2008, Uchaykin et al.

* cited by examiner

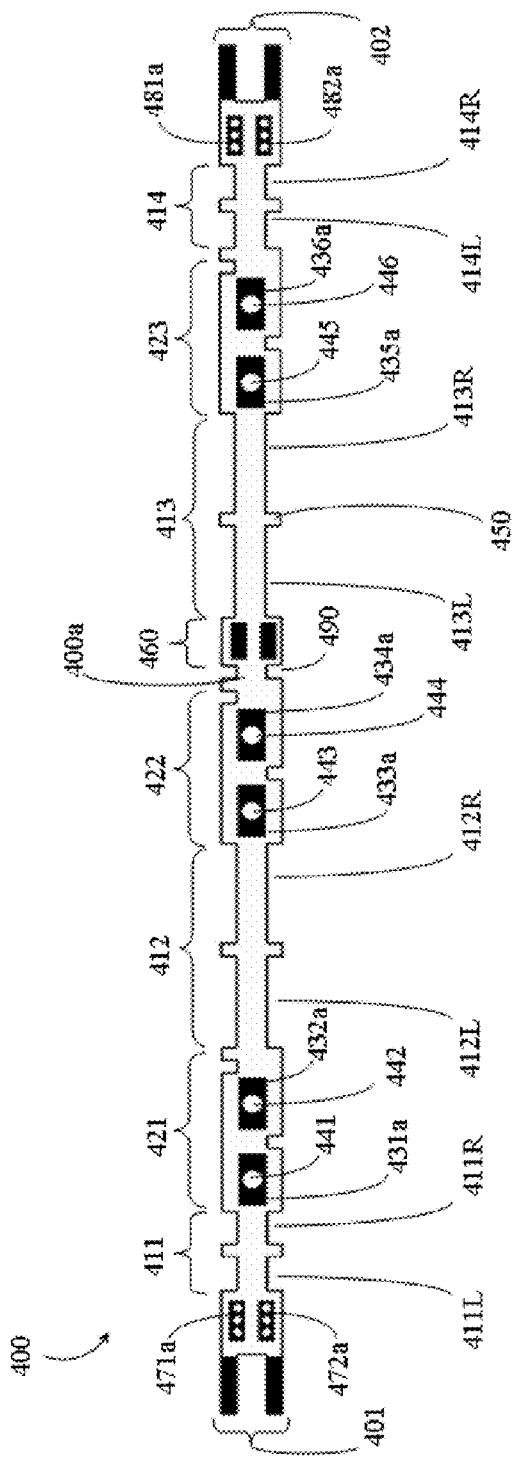
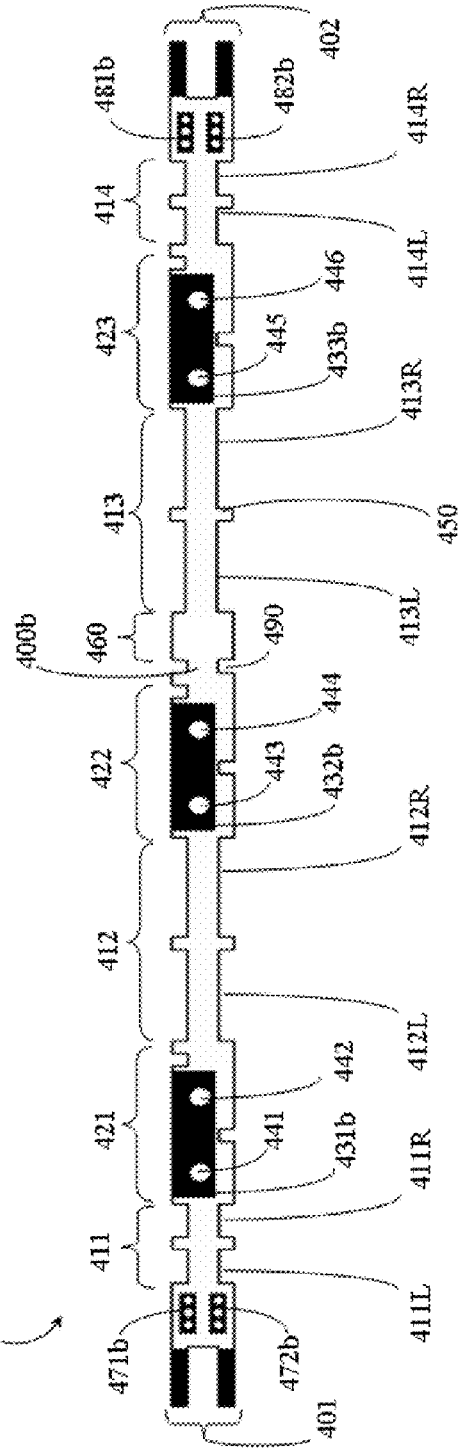
FIGURE 4A
FIGURE 4B

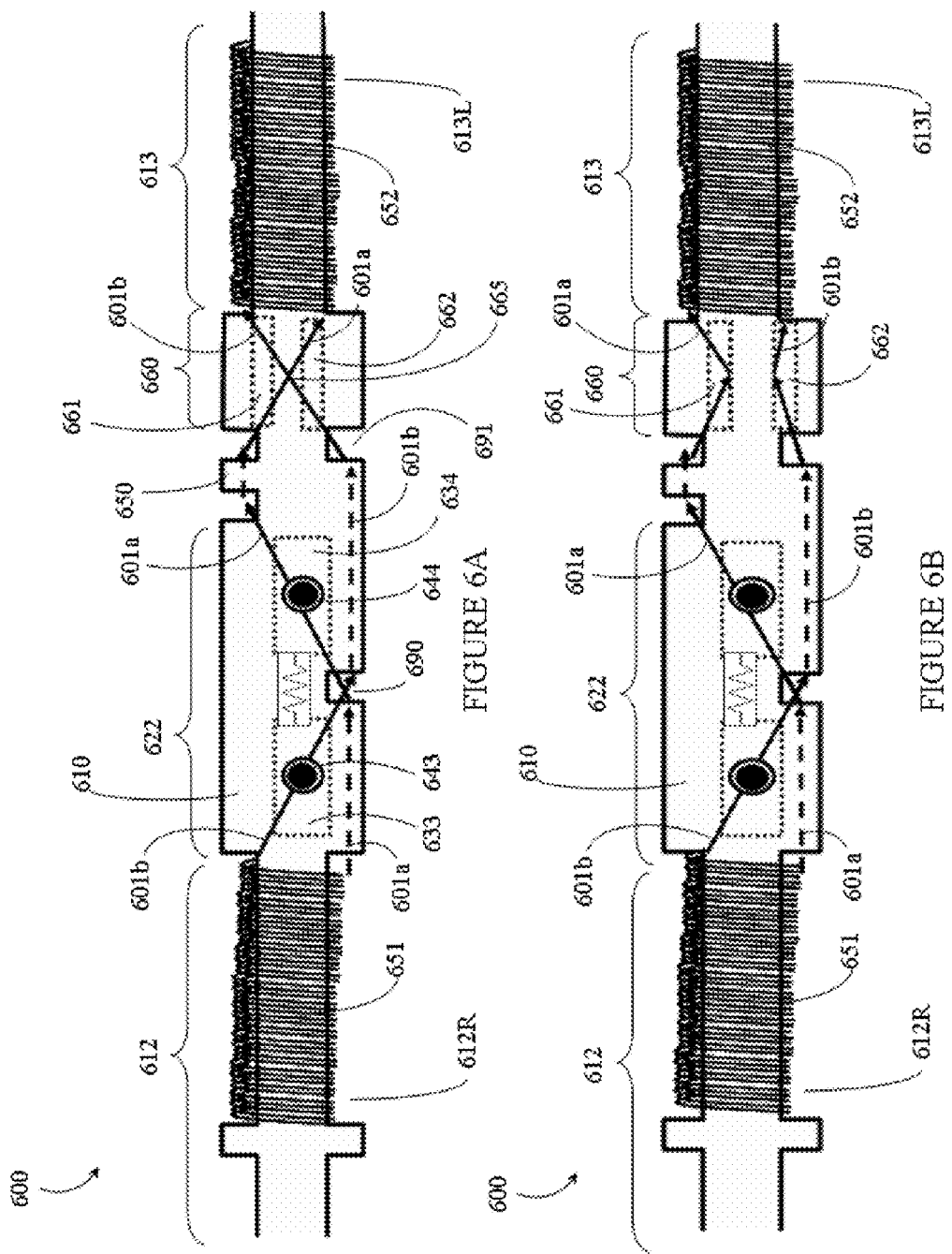

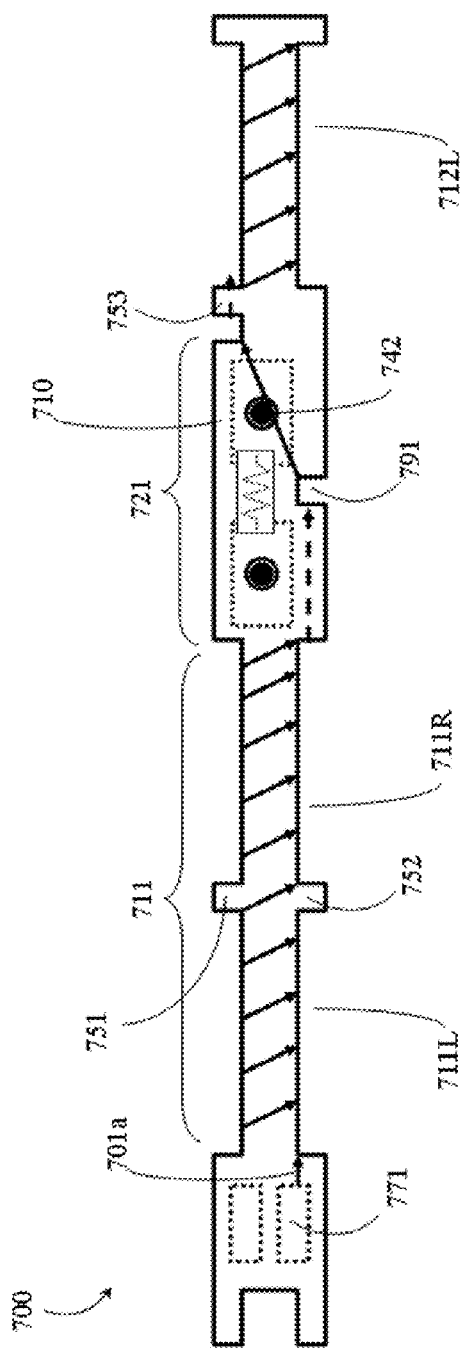
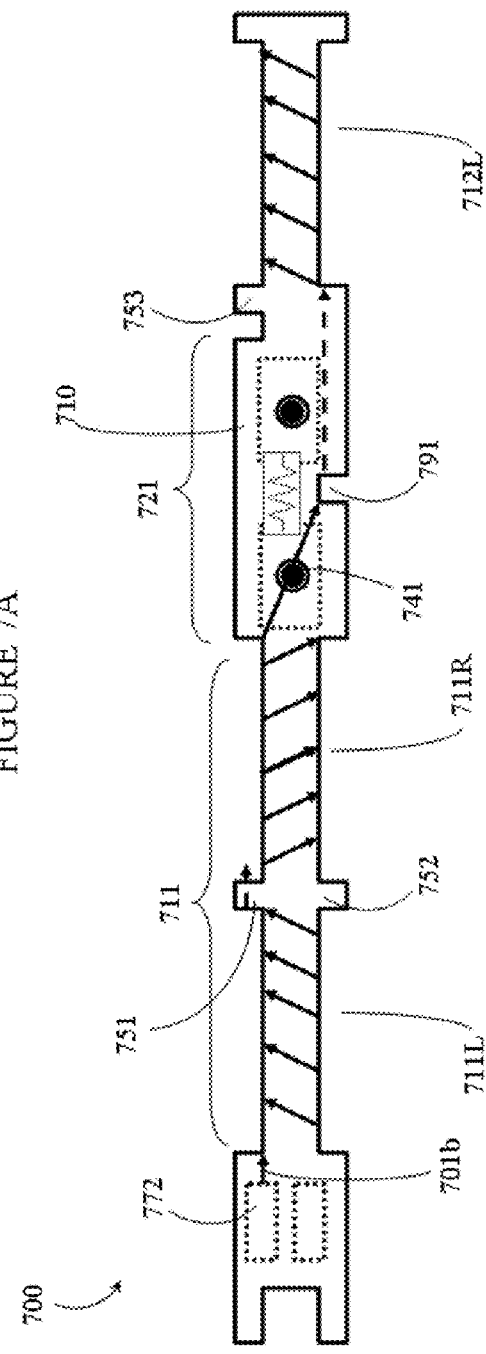
FIGURE 7A
FIGURE 7B

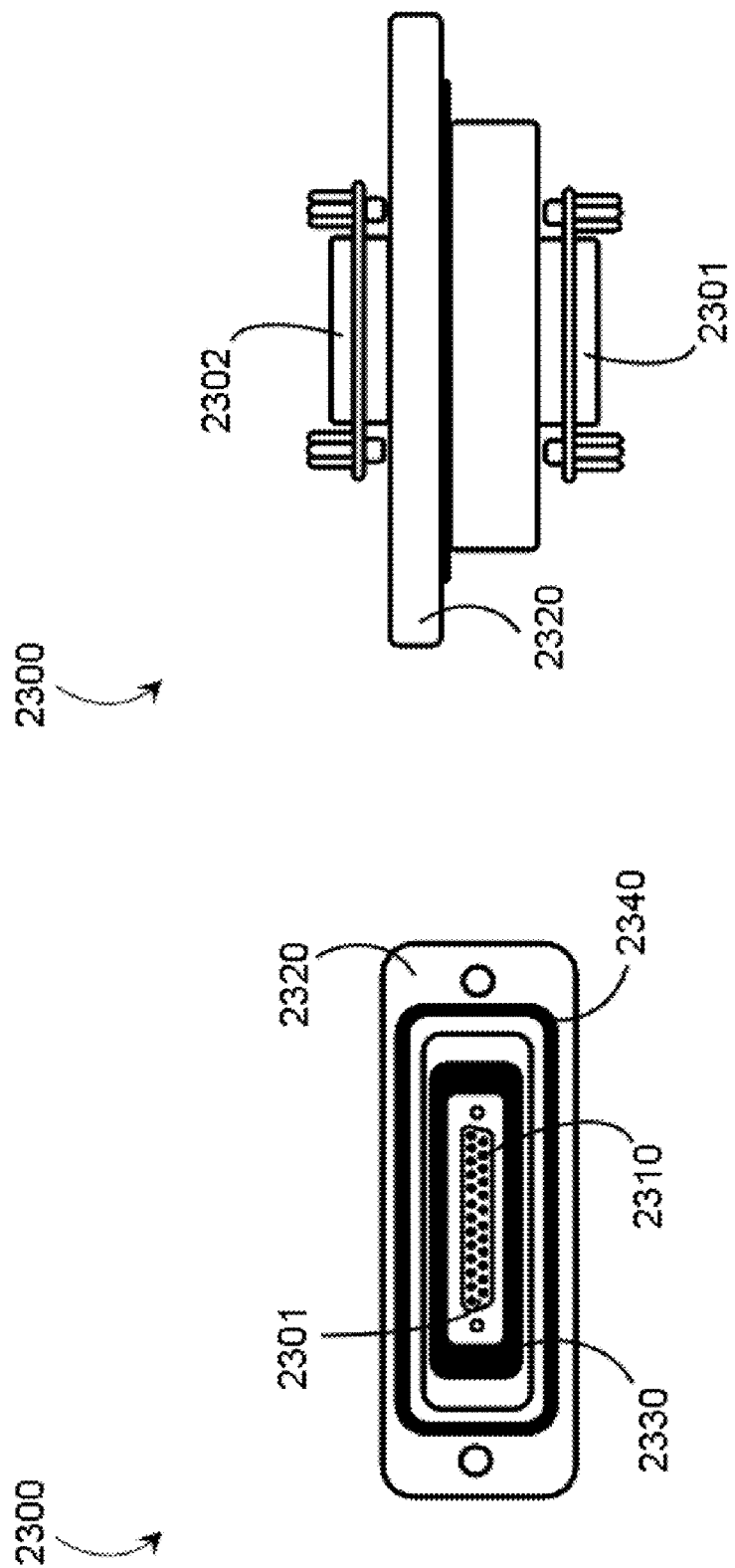

INPUT/OUTPUT SYSTEMS AND DEVICES FOR USE WITH SUPERCONDUCTING DEVICES

CROSS REFERENCE TO RELATED APPLICATIONS

This application claims benefit under 35 U.S.C. 119(e) of U.S. Provisional Patent Application Ser. No. 61/080,996, filed Jul. 15, 2008, entitled "Input/Output System and Devices for Use with Superconducting Devices," U.S. Provisional Patent Application Ser. No. 61/080,997, filed Jul. 15, 2008, entitled "Systems, Methods, and Apparatus for Differential Electrical Filters," and U.S. Provisional Patent Application Ser. No. 61/110,382, filed Oct. 31, 2008 and entitled "Systems and Devices for Hermetically Sealed Electrical Feed-Throughs," all of which are incorporated herein by reference in their entirety.

BACKGROUND

Field

This disclosure generally relates to input/output (I/O) systems and devices for use with superconducting devices, and particularly relates to electrical filters and I/O systems for use with superconducting-based computing systems.

Superconducting Qubits

There are many different hardware and software approaches under consideration for use in quantum computers. One hardware approach employs integrated circuits formed of superconducting material, such as aluminum and/or niobium, to define superconducting qubits. Superconducting qubits can be separated into several categories depending on the physical property used to encode information. For example, they may be separated into charge, flux and phase devices. Charge devices store and manipulate information in the charge states of the device; flux devices store and manipulate information in a variable related to the magnetic flux through some part of the device; and phase devices store and manipulate information in a variable related to the difference in superconducting phase between two regions of the phase device.

Quantum Processor

A computer processor may take the form of a quantum processor such as a superconducting quantum processor. A superconducting quantum processor may include a number of qubits and associated local bias devices, for instance two or more superconducting qubits. Further detail and embodiments of exemplary quantum processors that may be used in conjunction with the present systems, methods, and apparatus are described in US Patent Publication No. 2006-0225165, US Patent Publication 2008-0176750, U.S. patent application Ser. No. 12/266,378, and PCT Patent Application Serial No. PCT/US09/37984.

When operating highly sensitive electronics such as superconducting qubits, coupling devices and/or readout devices, it is highly desirable to eliminate or at least reduce any noise which would otherwise adversely affect the operation of such electronics. For example, it is highly desirable to eliminate or reduce noise when operating a quantum processor that includes a number of qubits and coupling devices.

When operating superconducting components in refrigerated environments, it is highly desirable to maintain all various components at suitably low temperatures such that those components operate as superconductors or have superconducting characteristics. For example, it is highly desirable to maintain the qubits and coupling devices of a quantum processor at superconducting temperatures. It may also be highly desirable to maintain the local bias devices and/or read out devices of a quantum processor at superconducting temperatures. Also for example, it is highly desirable to maintain signal paths in an I/O system for the superconducting quantum processor at or around superconducting temperatures. Further, it may be desirable to provide a structure that allows easy placement and removal of a superconducting processor from a refrigerated environment. Such may allow simplification of testing, analysis, and/or repair.

Maintaining superconducting temperatures may be difficult since many materials that are capable of superconducting do not provide good thermally conductive paths. Such may be particularly difficult with I/O systems since such I/O systems interface with non-refrigerated environments. Such difficulties are compounded where the structure is also to provide for the easy placement and removal of a superconducting processor. The various embodiments discussed herein address these problems.

Superconducting Processor

A device sample may take the form of a superconducting processor, where the superconducting processor may not be a quantum processor in the traditional sense. For instance, some embodiments of a superconducting processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting processors. Due to their natural physical properties, superconducting processors in general may be capable of higher switching speeds and shorter computation times than non-superconducting processors, and therefore it may be more practical to solve certain problems on superconducting processors.

Refrigeration

According to the present state of the art, a superconducting material may generally only act as a superconductor if it is cooled below a critical temperature that is characteristic of the specific material in question. For this reason, those of skill in the art will appreciate that a computer system that implements superconducting processors may implicitly include a refrigeration system for cooling the superconducting materials in the system. Systems and methods for such refrigeration systems are well known in the art. A dilution refrigerator is an example of a refrigeration system that is commonly implemented for cooling a superconducting material to a temperature at which it may act as a superconductor. In common practice, the cooling process in a dilution refrigerator may use a mixture of at least two isotopes of helium (such as helium-3 and helium-4). Full details on the operation of typical dilution refrigerators may be found in F. Pobell, *Matter and Methods at Low Temperatures*, Springer-Verlag Second Edition, 1996, pp. 120-156. However, those of skill in the art will appreciate that the present systems, methods and apparatus are not limited to applications involving dilution refrigerators, but rather may be applied using any type of refrigeration system.

Electrical Signal Filtering

During transmission, an electrical signal typically comprises a plurality of components each transmitting at a different frequency. The "filtering" of an electrical signal typically involves the selective removal of certain frequencies from the electrical signal during transmission. Such filtering may be accomplished "passively" or "actively." A passive electrical filter is one that operates without additional power input; that is, the filtering is accomplished by the natural characteristics of the materials or devices through which the electrical signal is transmitted. Many such passive filters are known in the art, including filters that implement lumped elements such as inductors and capacitors, collectively referred to as lumped element filters (LEFs).

Simple, passive lumped element filters include low-pass and high-pass filters. A low-pass filter is one that substantially filters out higher frequencies and substantially allows lower frequencies to pass through. Conversely, a high-pass filter is one that substantially filters out lower frequencies and substantially allows higher frequencies to pass through. The concepts of low-pass and high-pass filters may be combined to produce "band-pass" filters, which effectively transmit a given range of frequencies and filter out frequencies that fall outside (above or below) of that range. Similarly, "band-stop" filters may be implemented which effectively transmit most frequencies and filter out frequencies that fall inside a given range.

Single-Ended Signaling Vs. Differential Signaling

Single-ended signaling is a term used to describe a simple wiring approach whereby a varying voltage that represents a signal is transmitted using a single wire. This single-ended signal is typically referenced to an absolute reference voltage provided by a positive or negative ground or another signal somewhere in the system. For a system that necessitates the transmission of multiple signals (each on a separate signal path), the main advantage of single-ended signaling is that the number of wires required to transmit multiple signals is simply equal to the number of signals plus one for a common ground. However, single-ended signaling can be highly susceptible to noise that is picked up (during transmission) by the signal wire and/or the ground path, as well as noise that results from fluctuations in the ground voltage level throughout the system. In single-ended signaling, the signal that is ultimately received and utilized by a receiving circuit is equal to the difference between the signal voltage and the ground or reference voltage at the receiving circuit. Thus, any fluctuations in the signal and/or reference voltage that occur between sending and receiving the signal can result in a discrepancy between the signal that enters the signal wire and the signal that is received by the receiving circuit.

Differential signaling is a term used to describe a wiring approach whereby a data signal is transmitted using two complementary electrical signals propagated through two separate wires. A first wire carries a varying voltage (and/or current) that represents the data signal and a second wire carries a complementary signal that may be equal and opposite to the data signal. The complementary signal in the second wire is typically used as the particular reference voltage for each differential signal, as opposed to an absolute reference voltage throughout the system. In single-ended signaling, a single ground is typically used as a common signal return path. In differential signaling, a single ground may also be provided as a common return path for both the first wire and the second wire, although because the two signals are substantially equal and opposite they may cancel each other out in the return path.

Differential signaling has the advantage that it is less susceptible to noise that is picked up during signal transmission and it does not rely on a constant absolute reference voltage. In differential signaling, the signal that is ultimately received and utilized by a receiving circuit is equal to the difference between the data signal voltage (and/or current) carried by the first wire and the complementary signal voltage (and/or current) carried by the second wire. There is no absolute ground reference voltage. Thus, if the first wire and the second wire are maintained in close proximity throughout the signal transmission, any noise coupled to the data signal is likely also to couple to the reference signal and therefore any such noise may be cancelled out in the receiving circuit. Furthermore, because the data signal and the complementary signal are, typically, roughly equal in magnitude but opposite in sign, the signal that is ultimately received and utilized by the receiving circuit may be approximately twice the magnitude of the data signal alone. These effects can help to allow differential signaling to realize a higher signal-to-noise ratio than single-ended signaling. The main disadvantage of differential signaling is that it uses approximately twice as many wires as single-ended signaling. However, in some applications this disadvantage is more than compensated by the improved signal-to-noise ratio of differential signaling.

BRIEF SUMMARY

At least one embodiment may be summarized as an electrical filter device including a dielectric substrate including a signal surface and a ground surface distinct from the signal surface, the dielectric substrate having an input end and an output end, at least a first wide region between the input and the output ends, the first wide region having a first through-hole and a second through-hole, and at least a first narrow region between the input and the output ends; a first input conductive trace and a second input conductive trace carried by the signal surface at least proximate the input end of the dielectric substrate; a first output conductive trace and a second output conductive trace carried by the signal surface at least proximate the output end of the dielectric substrate; a first signal conductive trace and a second signal conductive trace carried by the signal surface in the first wide region of the dielectric substrate; a first ground conductive trace carried by the ground surface in the first wide region of the dielectric substrate, such that the first and the second signal conductive traces are electrically insulated from the first ground conductive trace; a first length of conductor, wherein at least a portion of the first length of conductor is wound about the first narrow region of the dielectric medium to form a first bottom coil; a second length of conductor, wherein at least a portion of the second length of conductor is wound about the at least a portion of the first length of conductor that is wound about the first narrow region of the dielectric medium to form a first top coil, wherein the first top coil is wound about the first bottom coil to form a first top-bottom coil pair; a first capacitor and a second capacitor; an enclosure including a first open end and a second open end, wherein the enclosure is formed by substantially non-magnetic metal that separates an inner volume of the enclosure from an exterior thereof, and wherein the dielectric substrate, the first top-bottom coil pair, the first capacitor, and the second capacitor are received in the inner volume of the enclosure; an input connector electrically connected to at least one of the first and the second input conductive traces, wherein the input connector physically couples to the enclosure, thereby closing the first open end of the enclosure; and an output connector electrically connected to at least one of the first and the second output conductive traces, wherein the output connector physically couples to the enclosure, thereby closing the second open end of the enclosure. The first narrow region may be interrupted by a first coiling tab that divides the first narrow region into a first leftmost section and a first rightmost section; the first length of conductor may be wound about both the first leftmost section and the first rightmost section in a first coiling direction, such that the first bottom coil is wound entirely in the first coiling direction about the first narrow region; The second length of conductor may wound about the first leftmost section in the first coiling direction such that a first section of the first top coil is wound in the first coiling direction on top of the first bottom coil; the second length of conductor may wound at least partially around the first coiling tab; and the second length of conductor may be wound about the first rightmost section in a second coiling direction that is opposite to the first coiling direction, such that a second section of the first top coil is wound in the second coiling direction on top of the first bottom coil.

The first capacitor may be at least partially received in the first through-hole of the first wide region and the second capacitor may be at least partially received in the second through-hole of the first wide region, and may further include an electrical connection between a first end of the first capacitor and the first signal conductive trace and an electrical connection between a second end of the first capacitor and the first ground conductive trace, thereby providing a capacitive coupling between the first signal conductive trace and the first ground conductive trace; and an electrical connection between a first end of the second capacitor and the second signal conductive trace and an electrical connection between a second end of the second capacitor and the first ground conductive trace, thereby providing a capacitive coupling between the second signal conductive trace and the first ground conductive trace.

The electrical filter device may further include a damping resistor electrically coupled to both the first signal conductive trace and the second signal conductive trace.

The enclosure may include a first hole that connects the inner volume of the enclosure to the exterior thereof, and wherein the dielectric substrate may be positioned inside the enclosure such that the first wide region aligns with the first hole in the enclosure, and may further include a piece of solder that seals the first hole in the enclosure and that provides an electrical connection between the first ground conductive trace and the enclosure.

The electrical filter device may further include an epoxy mixture that includes an epoxy and a metal powder that is predominately non-superconducting and substantially non-magnetic, wherein at least a portion of the inner volume of the enclosure is filled with the epoxy mixture such that at least a portion of the first top-bottom coil pair is embedded in the epoxy mixture.

The electrical filter device may further include an electrical connection between the first length of conductor and the first input conductive trace; an electrical connection between the first length of conductor and the first signal conductive trace; an electrical connection between the second length of conductor and the second input conductive trace; and an electrical connection between the second length of conductor and the second signal conductive trace.

The electrical filter device may further include an electrical connection between the first length of conductor and the first output conductive trace; and an electrical connection between the second length of conductor and the second output conductive trace. At least one of the lengths of conductor may include a material that is superconducting below a critical temperature. At least one of the conductive traces may include a material that is superconducting below a critical temperature.

The dielectric substrate may further have a second wide region between the first wide region and the output end, the second wide region having a third and a fourth through-hole, and a second narrow region between the first and the second wide regions, the electrical filter device further including a third signal conductive trace and a fourth signal conductive trace carried by the signal surface of the second wide region of the dielectric substrate; a second ground conductive trace carried by the ground surface of the second wide region of the dielectric substrate, such that the third and the fourth signal conductive traces are electrically insulated form the second ground conductive trace; a third length of conductor, wherein at least a portion of the third length of conductor is wound about the second narrow region of the dielectric medium to form a second bottom coil; a fourth length of conductor, wherein at least a portion of the fourth length of conductor is wound about the at least a portion of the third length of conductor that is wound about the second narrow region of the dielectric medium to form a second top coil, wherein the second top coil is wound about the second bottom coil to form a second top-bottom coil pair; a third capacitor and a fourth capacitor. The second narrow region may interrupted by a second coiling tab that divides the second narrow region into a second leftmost section and a second rightmost section; the third length of conductor may be wound about both the second leftmost section and the second rightmost section in the first coiling direction, such that the second bottom coil is wound entirely in the first coiling direction about the second narrow region; the fourth length of conductor may be wound about the second leftmost section in the first coiling direction such that a first section of the second top coil is wound in the first coiling direction on top of the second bottom coil; the fourth length of conductor may be wound at least partially around the second coiling tab; and the fourth length of conductor may be wound about the second rightmost section in the second coiling direction that is opposite to the first coiling direction, such that a second section of the second top coil is wound in the second coiling direction on top of the second bottom coil.

The third capacitor may be at least partially received in the third through-hole of the second wide region and the fourth capacitor may be at least partially received in the fourth through-hole of the second wide region, and may further include an electrical connection between a first end of the third capacitor and the third signal conductive trace and an electrical connection between a second end of the third capacitor and the second ground conductive trace, thereby providing a capacitive coupling between the third signal conductive trace and the second ground conductive trace; and an electrical connection between a first end of the fourth capacitor and the fourth signal conductive trace and an electrical connection between a second end of the fourth capacitor and the second ground conductive trace, thereby providing a capacitive coupling between the fourth signal conductive trace and the second ground conductive trace.

The electrical filter device may further include a first damping resistor electrically coupled to both the first signal conductive trace and the second signal conductive trace; and a second damping resistor electrically coupled to both the third signal conductive trace and the fourth signal conductive trace.

The enclosure may include a first hole and a second hole that each connect the inner volume of the enclosure to the exterior thereof, and wherein the dielectric substrate may be positioned inside the enclosure such that the first wide region aligns with the first hole in the enclosure and the second wide region aligns with the second hole in the enclosure, and may further include a first piece of solder that seals the first hole in the enclosure and that provides an electrical connection between the first ground conductive trace and the enclosure and a second piece of solder that seals the second hole in the enclosure and that provides an electrical connection between the second ground conductive trace and the enclosure.

The electrical filter device may further include an epoxy mixture that includes an epoxy and a metal powder that is predominately non-superconducting and substantially non-magnetic, wherein at least a portion of the inner volume of the enclosure is filled with the epoxy mixture such that at least a portion of the second top-bottom coil pair is embedded in the epoxy mixture.

The electrical filter device may further include an electrical connection between the third length of conductor and the first length of conductor; an electrical connection between the third length of conductor and the third signal conductive trace; an electrical connection between the fourth length of conductor and the second length of conductor; and an electrical connection between the fourth length of conductor and the fourth signal conductive trace.

The electrical filter device of may further include an electrical connection between the third length of conductor and the first output conductive trace; and an electrical connection between the fourth length of conductor and the second output conductive trace. At least one of the first, the second, the third and the fourth lengths of conductors may be a conductive wire includes a material that is superconducting below a critical temperature. At least one of the conductive traces may include a material that is superconducting below a critical temperature.

The electrical filter device may further include an electrical connection between the third length of conductor and the second length of conductor; an electrical connection between the third length of conductor and the third signal conductive trace; an electrical connection between the fourth length of conductor and the first length of conductor; and an electrical connection between the fourth length of conductor and the fourth signal conductive trace.

The electrical filter device may further include an electrical connection between the third length of conductor and the first output conductive trace; and an electrical connection between the fourth length of conductor and the second output conductive trace. At least one of the first, the second, the third and the fourth lengths of conductor may be a conductive wire including a material that is superconducting below a critical temperature. At least one of the conductive traces may include a material that is superconducting below a critical temperature.

The dielectric substrate may further have a plurality of additional wide regions, each having a respective pair of through-holes and a plurality of additional narrow regions, the additional wide regions and the additional narrow regions alternatively positioned along a longitudinal length of the dielectric substrate between the input end and the output end, the electrical filter device may further include a plurality of additional signal conductive traces carried in pairs at respective ones of the additional wide regions by the signal surface of the dielectric substrate; a plurality of ground conductive traces each carried at a respective one of the additional wide regions of the ground surface of the dielectric substrate, such that each pair of the additional signal conductive traces is electrically insulated from a respective one of the additional ground conductive traces; a first set of additional lengths of conductor, wherein at least a portion of each of the additional lengths of conductor in the first set of additional lengths of conductor is wound about a respective one of the additional narrow regions of the dielectric medium to form a respective additional bottom coil; a second set of additional lengths of conductor, wherein at least a portion of each of the additional lengths of conductor in the second set of additional lengths of conductor is wound about a respective at least a portion of each of the additional lengths of conductor in the first set of additional lengths of conductor that is wound about a respective one of the additional narrow regions of the dielectric medium to form a respective additional top coil, wherein the each additional top coil is wound about a respective additional bottom coil to form a respective additional top-bottom coil pair; and a plurality of additional capacitors. Each additional narrow region may be interrupted by a respective additional coiling tab that divides each additional narrow region into a respective additional leftmost section and a respective additional rightmost section; each additional length of conductor in the first set of additional lengths of conductor may be wound about each additional leftmost section and each additional rightmost section in the first coiling direction, such that each additional bottom coil is wound entirely in the first coiling direction about each additional narrow region; each additional length of conductor in the second set of additional lengths of conductor may be wound about each additional leftmost section in the first coiling direction such that a first section of each additional top coil is wound in the first coiling direction on top of a respective additional bottom coil; each additional length of conductor in the second set of additional lengths of conductor may be wound at least partially around each additional coiling tab; and each additional length of conductor in the second set of additional lengths of conductor may be wound about each additional rightmost section in the second coiling direction that is opposite to the first coiling direction, such that a second section of each additional top coil is wound in the second coiling direction about a respective additional bottom coil.

Respective ones of each of the additional capacitors may be at least partially received in respective ones of the additional through-holes, and may further include a plurality of electrical connections, a respective one of the electrical connections between a first end of each of the additional capacitors and a respective one of the additional signal conductive traces; a plurality of electrical connections, a respective one of the electrical connections between a second end of each additional capacitor and an additional ground conductive trace, to capacitively couple each respective one of the additional signal conductive traces to an additional ground conductive trace.

The electrical filter device may further include a first damping resistor that is electrically coupled to both the first signal conductive trace and the second signal conductive trace; a second damping resistor that is electrically coupled to both the third signal conductive trace and the fourth signal conductive trace; and a plurality of additional damping resistors, wherein the two additional signal conductive traces that form a pair carried by each additional wide region are electrically connected together through a respective additional damping resistor.

The enclosure may include a first hole, a second hole and a plurality of additional holes that connect the inner volume of the enclosure to the exterior thereof and the dielectric substrate may be positioned inside the enclosure such that the first wide region aligns with the first hole, the second wide region aligns with the second hole and each of the additional wide regions aligns with at least a respective one of the additional holes in the enclosure, and may further include first piece of solder that seals the first hole in the enclosure and that provides an electrical connection between the first ground conductive trace and the enclosure and a second piece of solder that seals the second hole in the enclosure and that provides an electrical connection between the second ground conductive trace and the enclosure, and a plurality of additional pieces of solder that each seal a respective one of the additional holes in the enclosure and that each provide an electrical connection between respective ones of each of the additional ground conductive traces and the enclosure.

The electrical filter device may further include an epoxy mixture that includes an epoxy and a metal powder that is predominately non-superconducting and substantially non-magnetic, wherein at least a portion of the inner volume of the enclosure is filled with the epoxy mixture such that at least a portion of at least one additional top-bottom coil pair is embedded in the epoxy mixture. Each of the additional lengths of conductor in the first set of additional lengths of conductor may be electrically connected in series with one another and at least one of the additional lengths of conductor in the first set of additional lengths of conductor may be electrically connected in series with the third length of conductor, and each of the additional lengths of conductor in the second set of additional lengths of conductor may be electrically connected in series with one another and at least one of the additional lengths of conductor in the second set of additional lengths of conductor may be electrically connected in series with the fourth length of conductor, and may further include a respective electrical connection between each of the additional lengths of conductor in the first set of additional lengths of conductor and a respective one of the additional signal conductive traces; and a respective electrical connection between each of the additional lengths of conductor in the second set of additional lengths of conductor and a respective one of the additional signal conductive traces. The first length of conductor, the third length of conductor, and each of the additional lengths of conductor in the first set of additional lengths of conductor may form respective lengths of a first continuous conductive wire, and the second length of conductor, the fourth length of conductor, and each of the additional lengths of conductor in the second set of additional lengths of conductor may form respective lengths of a second continuous conductive wire. The first length of conductor, the fourth length of conductor, and each of the additional lengths of conductor in the first set of additional lengths of conductor may form respective lengths of a first continuous conductive wire, and the second length of conductor, the third length of conductor, and each of the additional lengths of conductor in the second set of additional lengths of conductor may form respective lengths of a second continuous conductive wire.

The electrical filter device may further include an electrical connection between at least one of the additional lengths of conductor in the first set of additional lengths of conductor and the first output conductive traces; and an electrical connection between at least one of the additional lengths of conductor in the second set of additional lengths of conductor and the second output conductive traces. At least one of the additional lengths of conductors may be a conductive wire that includes a material that is superconducting below a critical temperature. At least one of the conductive traces may include a material that is superconducting below a critical temperature. At least one of the lengths of conductors may be a conductive wire that includes a material that is superconducting below a critical temperature. At least one of the conductive traces may include a material that is superconducting below a critical temperature. At least one of the input connector and the output connector may be selected from the group consisting of: a coaxial cable, a coaxial connector, an ultra-miniature coaxial cable, an ultra-miniature coaxial cable connector, a single conductor wire, a conductive pin, a solder connection, a spring contact, and an SMA connector.

At least one embodiment may be summarized as an electrical filter device for use with differential signals, the electrical filter device including a first signal path, wherein the first signal path includes a first coil of conductive wire that is wound in a first coiling direction; a first capacitor that capacitively couples the first signal path to ground; a second signal path, wherein the second signal path includes a second coil of conductive wire that is wound about the first coil of conductive wire to form a first top-bottom coil pair, wherein the second coil includes a leftmost section and a rightmost section and the leftmost section is wound in the first coiling direction and the rightmost section is wound in a second coiling direction that is opposite to the first coiling direction: a second capacitor that capacitively couples the second signal path to ground; and means for changing the coiling direction of the second coil of conductive wire in between the leftmost section and the rightmost section.

The electrical filter device may further include a dielectric substrate, wherein the first coil of conductive wire is wound about a first narrow region of the dielectric substrate, and wherein the first capacitor and the second capacitor are each at least partially received in a respective through-hole in the dielectric substrate. The means for changing the coiling direction of the second coil of conductive wire may include a protrusion of the dielectric substrate. The dielectric substrate may carry a plurality of conductive traces such that both the first signal path and the second signal path each include at least one conductive trace.

The electrical filter device may further include a first damping resistor that is electrically connected in between the first and second capacitors.

The electrical filter device may further include an enclosure formed by a substantially non-magnetic material, wherein the dielectric substrate, the first top-bottom coil pair, and the first and the second capacitors are all positioned within the enclosure. The enclosure may be at least partially filled with an epoxy mixture that includes an epoxy and a metal powder that is predominately non-superconducting and substantially non-magnetic.

The first signal path may further include a third coil of conductive wire that is wound in a first coiling direction about a second narrow region of the dielectric substrate; a third capacitor that capacitively couples the first signal path to ground, the third capacitor at least partially received in a respective through-hole in the dielectric substrate; the second signal path may further include a fourth coil of conductive wire that is wound about the third coil of conductive wire to form a second top-bottom coil pair, wherein the fourth coil includes a leftmost section and a rightmost section and the leftmost section is wound in the first coiling direction and the rightmost section is wound in a second coiling direction that is opposite to the first coiling direction: a fourth capacitor that may capacitively couple the second signal path to ground; and means for changing the coiling direction of the fourth coil of conductive wire in between the leftmost section and the rightmost section. The means for changing the coiling direction of the fourth coil of conductive wire may include a protrusion of the dielectric substrate.

The electrical filter device may further include a second damping resistor that is electrically connected in between the third and the fourth capacitors.

The electrical filter device may further include an enclosure formed by a substantially non-magnetic material, wherein the dielectric substrate, the first top-bottom coil pair, the second-top-bottom coil pair, and the first, the second, the third and the fourth capacitors are all positioned within the enclosure. The enclosure may be at least partially filled with an epoxy mixture that includes an epoxy and a metal powder that is predominately non-superconducting and substantially non-magnetic.

At least one embodiment may be summarized as an input/output system for use with a superconducting device sample, the input/output system including a first tier including a first set of electrical filter structures, wherein each of the electrical filter structures in the first set of electrical filter structures comprises a respective lumped element filter that is at least partially contained within a respective enclosure, and wherein each of the electrical filter structures in the first set of electrical filter structures has an input end and an output end; a first set of electrical signal paths, each of the electrical signal paths in the first set of electrical signal paths including a filter input portion, a filter portion, and a filter output portion, wherein the filter input portion of each respective one of the electrical signal paths in the first set of electrical signal paths communicably couples to the input end of a respective one of the electrical filter structures from the first set of electrical filter structures, the filter portion of each respective one of the electrical signal paths in the first set of electrical signal paths includes at least a portion of the lumped element filter of a respective one of the electrical filter structures from the first set of electrical filter structures, and the filter output portion of each respective one of the electrical signal paths in the first set of electrical signal paths communicably couples to the output end of a respective one of the electrical filter structures from the first set of electrical filter structures, wherein at least a portion of each one of the electrical signal paths in the first set of electrical signal paths is superconducting and each one of the electrical signal paths in the first set of electrical signal paths provides electrical communication with at least a portion of the superconducting device sample; a first composite plate structure having a first top plate and a first bottom plate, wherein the first top plate and the first bottom plate mate to form a first inner volume therebetween on a first side of the first top plate, and wherein each of the electrical filter structures in the first set of electrical filter structures is carried by a second side of the first top plate that is opposite the first side of the first top plate such that the filter output portion of at least one of the electrical signal paths from the first set of electrical signal paths extends from the second side of the first top plate, through the first top plate, and into the first inner volume; a pedestal mounted to the first side of the first top plate inside the first inner volume; and a device sample holder assembly selectively mountable to and dismountable from the pedestal inside the first inner volume, wherein the device sample holder assembly includes at least one printed circuit board, at least a portion of the device sample holder assembly superconductingly electrically couples to at least one of the electrical signal paths from the first set of electrical signal paths, and at least a portion of the device sample holder assembly superconductingly electrically couples to the superconducting device sample.

The enclosure of at least one of the electrical filter structures may be at least partially filled with a mixture of metal powder and epoxy. The metal powder may include at least one of brass powder and copper powder.

The input/output system may further include a mounting plate for mounting to a refrigeration system. The respective enclosure of each of the electrical filter structures in the first set of electrical filter structures and the first composite plate structure may all be formed of material that is substantially non-magnetic and predominately non-superconducting. At least one of the electrical signal paths in the first set of electrical signal paths may be configured to carry differential signals. At least a portion of the filter input portion of at least one of the electrical signal paths in the first set of electrical signal paths may include a shielded twisted pair cable, and at least a portion of the filter output portion of at least one of the electrical signal paths in the first set of electrical signal paths may include a shielded twisted pair cable.

The input/output system may further include a second tier including a second set of electrical filter structures, wherein each of the electrical filter structures in the second set of electrical filter structures comprises a respective lumped element filter that is at least partially contained within a respective enclosure, and wherein each of the electrical filter structures in the second set of electrical filter structures has an input end and an output end; a second set of electrical signal paths, each of the electrical signal paths in the second set of electrical signal paths including a filter input portion, a filter portion, and a filter output portion, wherein the filter input portion of each respective one of the electrical signal paths in the second set of electrical signal paths communicably couples to the input end of a respective one of the electrical filter structures from the second set of electrical filter structures, the filter portion of each respective one of the electrical signal paths in the second set of electrical signal paths includes at least a portion of the lumped element filter of a respective one of the electrical filter structures from the second set of electrical filter structures, and the filter output portion of each respective one of the electrical signal paths in the second set of electrical signal paths communicably couples to the output end of a respective one of the electrical filter structures from the second set of electrical filter structures, wherein at least a portion of each of the electrical signal paths in the second set of electrical signal paths is superconducting and each of the electrical signal paths in the second set of electrical signal paths provides electrical communication with at least a portion of the superconducting device sample; a second composite plate structure having a second top plate and a second bottom plate, wherein the second top plate and the second bottom plate mate to form a second inner volume therebetween on a first side of the second top plate, and wherein each of the electrical filter structures in the second set of electrical filter structures is carried by a second side of the second top plate that is opposite the first side of the second top plate such that the filter output portion of at least one of the electrical signal paths from the second set of electrical signal paths extends from the second side of the second top plate, through the second top plate, and into the second inner volume; wherein the first inner volume and the second inner volume both form respective parts of a shielded enclosure that contains the pedestal and device sample holder assembly.

The enclosure of at least one of the electrical filter structures may be at least partially filled with a mixture of metal powder and epoxy. The metal powder may include at least one of brass powder and copper powder. The respective enclosure of each of the electrical filter structures in the second set of electrical filter structures and the second composite plate structure may all be formed of material that is substantially non-magnetic and predominately non-superconducting.

The input/output system may further include a hollow conduit that extends between the first inner volume and the second inner volume and provides a shielded channel through which at least a portion of at least one electrical signal path from at least one of the first set of electrical signal paths and the second set of electrical signal paths may pass between the first inner volume and the second inner volume.

A first end of the first tier may be positioned adjacent to the first top plate of the first composite plate structure and a second end of the first tier may be positioned adjacent to the second bottom plate of the second composite plate structure, and the second top plate of the second composite plate structure may be positioned adjacent to the second tier, and the hollow conduit may extend through the first tier and the shielded channel may extend between the first inner volume within the first composite plate structure and the second inner volume within the second composite plate structure. At least a portion of the filter output portion of at least one of the electrical signal paths from the second set of electrical signal paths may enter the second inner volume in the second composite plate structure from the output end of a respective one of the electrical filter structures from the second set of electrical filter structures that is mounted on the second side of the second top plate, and the at least a portion of the filter output portion of the at least one electrical signal path may extend through the shielded channel of the hollow conduit into the first inner volume in the first composite plate structure where the at least a portion of the filter output portion of the at least one electrical signal path is superconductingly electrically coupled to at least a portion of the device sample holder assembly. The hollow conduit may be formed of a material that is substantially non-magnetic and predominately non-superconducting. At least one of the electrical signal paths in the first set of electrical signal paths may be configured to carry differential signals. At least a portion of the filter input portion of at least one of the electrical signal paths in the first set of electrical signal paths may include a shielded twisted pair cable, and at least a portion of the filter output portion of at least one of the electrical signal paths in the first set of electrical signal paths may include a shielded twisted pair cable. The superconducting device sample may include a superconducting processor. The superconducting processor may include a superconducting quantum processor.

At least one embodiment may be summarized as a feed-through structure to receive flexible printed circuit board cable, including a plate having a first surface and a second surface opposite the first surface, wherein the first surface of the plate includes at least one elongated through-hole sized and dimensioned to receive a flexible printed circuit board cable, and wherein the at least one elongated through-hole extends through the second surface of the plate; wherein the feed-through structure includes a cavity adjacent to the second surface of the plate such that the at least one elongated through-hole extends through the plate and into the cavity, and wherein the cavity includes an open end to receive a sealing agent to establish a substantially hermetic seal in the at least one elongated through-hole.

The plate may further comprise at least one additional elongated through-hole, wherein each of the at least one additional elongated through-holes is sized and dimensioned to receive a respective flexible printed circuit board cable. Each of the elongated through-holes may extend through the plate and into the cavity. The cavity may be formed in a volume of the plate and the open end of the cavity may extend through the second surface of the plate. The feed-through structure may further comprise a flange that includes a through-hole, wherein the plate is mated with the flange such that the plate covers a first end of the through-hole and the cavity is formed by the through-hole in the flange. The feed-through structure may further comprise a hollow vacuum box, wherein a surface of the vacuum box includes an opening and the flange is mounted in the opening such that the at least one elongated through-hole in the plate opens through the cavity into the vacuum box.

At least one embodiment may be summarized as a system to provide electrical communication between a first environment at a first pressure and a second environment at a second pressure, wherein the second pressure is substantially different from the first pressure, the system including a first flexible printed circuit board cable; and a first feed-through structure having a first side and a second side, the first feed-through structure comprising: a plate having a first surface and a second surface opposite the first surface, wherein the first surface of the plate includes a first elongated through-hole that extends through the second surface of the plate, and wherein the first surface of the plate corresponds to the first side of the first feed-through structure; wherein the first feed-through structure includes a cavity adjacent to the second surface of the plate such that the first elongated through-hole extends through the plate and into the cavity, and wherein the cavity includes an open end that corresponds to the second side of the first feed-through structure; and wherein a portion of the first flexible printed circuit board cable is received through the first elongated through-hole such that the first flexible printed circuit board cable passes through the first elongated through-hole and extends into the cavity, and wherein the cavity is potted with a sealing agent to establish a substantially hermetic seal between the first and second sides of the first feed-through structure.

The system of may further include a second flexible printed circuit board cable, wherein the first surface of the plate includes a second elongated through-hole that extends through the second surface of the plate and into the cavity, and wherein a portion of the second flexible printed circuit board cable is received through the second elongated through-hole such that the second flexible printed circuit board cable passes through the second elongated through-hole and extends into the cavity. The system may further include at least one additional flexible printed circuit board cable, wherein the first surface of the plate includes at least one additional elongated through-hole that extends through the second surface of the plate and into the cavity, and wherein each flexible printed circuit board cable is received through a respective elongated through-hole such that each flexible printed circuit board cable passes through a respective elongated through-hole and extends into the cavity. The cavity may be formed in a volume of the plate and the open end of the cavity extends through the second surface of the plate. A segment of the first flexible printed circuit board cable may extend out the open end of the cavity on the second side of the first feed-through structure, and an electrical connection may be established between the segment and at least one conductive current path. The at least one conductive current path may be superconductive below a critical temperature. The at least one conductive current path may be carried by an additional flexible printed circuit board cable. The electrical connection may be established between the first flexible printed circuit board cable and the additional flexible printed circuit board cable. The sealing agent may include an epoxy mixture. The epoxy mixture may include a mixture of metal powder and epoxy. The first elongated through-hole may have a cross-sectional area that is larger than a cross-sectional area of the first flexible printed circuit board cable such that a gap exists between a perimeter of the first elongated through-hole and a surface of the first flexible printed circuit board, and wherein the gap is sealed with a sealing agent. The first feed-through structure may comprise a flange that includes a through-hole, and wherein the plate is mated with the flange such that the plate covers a first end of the through-hole and the cavity is formed by the through-hole in the flange. The system of may further comprise a hollow vacuum box, wherein a surface of the vacuum box includes a first opening and the flange of the first feed-through structure is mounted in the first opening such that the at least one elongated through-hole in the plate opens through the cavity into the vacuum box. The first side of the first feed-through structure may be outside of the vacuum box, and the first flexible printed circuit board cable may extend into the vacuum box. The system may further comprise a second feed-through structure having a first side and a second side, the second feed-through structure comprising: a plate having a first surface and a second surface opposite the first surface, wherein the first surface of the plate includes a first elongated through-hole that extends through the second surface of the plate, and wherein the first surface of the plate corresponds to the first side of the second feed-through structure; a flange that includes a through-hole, wherein the plate is mated with the flange such that the plate covers a first end of the through-hole and a cavity is formed by the through-hole in the flange, wherein the cavity is adjacent to the second surface of the plate such that the first elongated through-hole extends through the plate and into the cavity; wherein a portion of the first flexible printed circuit board cable is received through the first elongated through-hole such that the first flexible printed circuit board cable passes through the first elongated through-hole and extends into the cavity, and wherein the cavity is potted with a sealing agent to establish a substantially hermetic seal between the first and second sides of the second feed-through structure; and wherein a surface of the vacuum box includes a second opening and the flange of the second feed-through structure is mounted in the second opening such that the at least one elongated through-hole in the plate opens through the cavity into the vacuum box.

BRIEF DESCRIPTION OF THE SEVERAL VIEWS OF THE DRAWINGS

In the figures, identical reference numbers identify similar elements or acts. The sizes and relative positions of elements in the figures are not necessarily drawn to scale. For example, the shapes of various elements and angles are not drawn to scale, and some of these elements are arbitrarily enlarged and positioned to improve legibility. Further, the particular shapes of the elements as drawn are not intended to convey any information regarding the actual shape of the particular elements and have been solely selected for ease of recognition in the figures. Furthermore, while the figures may show specific layouts, one skilled in the art will appreciate that variations in design, layout, and fabrication are possible and the shown layouts are not to be construed as limiting the geometry of the present systems, devices, and methods.

FIG. 4A is a top plan view of an embodiment of a printed circuit board for use in a differential tubular filter structure, showing a first surface upon which at least a respective portion of each of the two signal paths is carried.

FIG. 4B is a bottom plan view of the printed circuit board from FIG. 4A, showing a second surface upon which at least a portion of the ground path is carried.

FIG. 6A is a top plan view of a portion an embodiment of a filtering device comprising a printed circuit board with lumped elements, for use in a tubular filter structure.

FIG. 6B is another top plan view of a portion an embodiment of a filtering device comprising a printed circuit board with lumped elements, showing the effect of removing wire cross-over point.

FIG. 7A is a top plan view of a portion of an embodiment of a filtering device 700 comprising a printed circuit board with lumped elements, highlighting the use of coiling tabs with a first signal path.

FIG. 7B is a top plan view of a portion of an embodiment of a filtering device comprising a printed circuit board with lumped elements, highlighting the use of coiling tabs with a second signal path.

FIG. 23A is a bottom plan view of a hermetically sealed D-Sub connector according to the known art.

FIG. 23B is a side elevational view of the hermetically sealed D-Sub connector from FIG. 23A, showing the D-Sub receptacle connecting through the flange to the D-Sub plug according to the known art.

DETAILED DESCRIPTION

Figure 1:
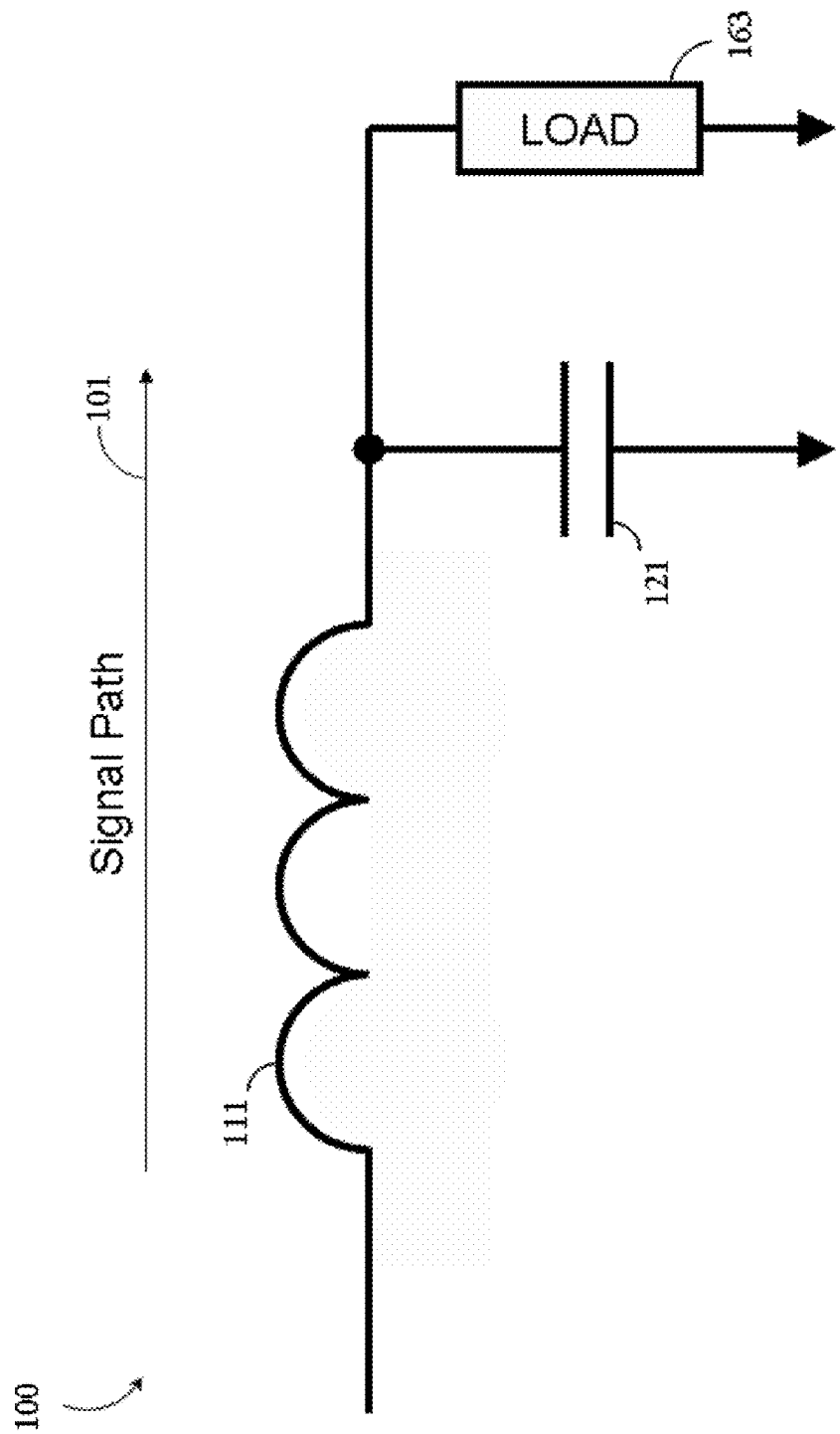
FIG. 1 is a schematic diagram of a typical conventional passive low-pass lumped element filter for use with a single-ended signal.

In the following description, some specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with electrical filters, printed circuit boards, and/or superconducting processors, such as superconducting devices, coupling devices, and control systems including microprocessors and drive circuitry have not been shown or described in detail to avoid unnecessarily obscuring descriptions of the embodiments of the systems, devices, and methods.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment," or "an embodiment," or "another embodiment" means that a particular referent feature, structure, or characteristic described in connection with the embodiment is included in at least one embodiment. Thus, the appearances of the phrases "in one embodiment," or "in an embodiment," or "another embodiment" in various places throughout this specification are not necessarily all referring to the same embodiment. Furthermore, the particular features, structures, or characteristics may be combined in any suitable manner in one or more embodiments.

It should be noted that, as used in this specification and the appended claims, the singular forms "a," "an," and "the" include plural referents unless the content clearly dictates otherwise. Thus, for example, reference to a problem-solving system including "a quantum processor" includes a single quantum processor, or two or more quantum processors. It should also be noted that the term "or" is generally employed in its sense including "and/or" unless the content clearly dictates otherwise.

The headings provided herein are for convenience only and do not interpret the scope or meaning of the embodiments.

The present systems, methods and apparatus describe techniques for the filtering of differential electrical signals. Specifically, the techniques described herein implement passive electrical filters based on tubular filter geometries. Many different devices exist for the purpose of passive electrical signal filtering. These devices include filters that implement lumped elements such as inductors and capacitors (lumped element filters, or LEFs) and metal powder filters (MPFs). Various embodiments described herein provide passive electrical filter devices that combine lumped element filtering and metal powder filtering into one tubular filter geometry that is adapted for use with differential signaling.

As previously described, differential signaling involves using two signal paths (e.g., wires) to transmit one signal, where a first signal path carries a first signal and a second signal path carries a second signal that is substantially complementary (i.e., substantially equal and opposite) to the first signal. According to this scheme, the signal that is ultimately received and utilized by a receiving circuit or receiving device is the difference between the first signal and the second signal. Differential signaling is robust against noise picked up during transmission, since such noise is typically picked up by both the first and second signal paths and cancelled out in the receiving circuit or receiving device. Furthermore, differential signaling is well-suited for low-power applications, since the signal that is ultimately utilized by a receiving circuit or receiving device (i.e., the difference between the first signal and the complementary second signal) has a magnitude that is twice that of either of the transmitted signals, thereby increasing the signal-to-noise ratio of the utilized signal.

A known disadvantage to differential signaling is that it necessitates approximately twice as many signal paths (e.g., wires) compared to a similar application of single-ended signaling. Thus, in the filtering of differential signals, it is typically necessary to implement approximately twice as many filtering devices compared to what would be needed if single-ended signaling were used. As is typically seen in the art, this can result in an overly complicated wiring system with many devices and in an inefficient use of space. In some applications implementing differential signaling, efficient use of space is an important factor. For instance, in an application of superconducting differential signaling, at least a portion of the electronics may be confined within the dimensions of a refrigeration system, and as more and more wires are needed it can be advantageous to reduce the size and complexity of the filtering structures. Thus, there is a need in the art for passive differential signal filtering devices that may be readily manufactured or assembled within a compact volume, while still providing the desired performance and range of frequency response for a wide variety of applications. Accordingly, various embodiments described herein provide individual tubular filter structures that each jointly filter the two signal paths of a differential signal. In some embodiments, high performance filtering is achieved through both lumped element filtering and metal powder filtering within a single tubular filter device.

Those of skill in the art will appreciate that some or all of the various concepts taught in the present systems, methods and apparatus may be applied in designs of low-pass, high-pass, band-pass, and band-stop applications. Throughout the remainder of this specification, specific structures relating to passive low-pass filters are described; however, those of skill in the art will appreciate that the concepts taught herein may be adapted to meet other filtering requirements, such as high-pass, band-pass, and band-stop filtering.

FIG. 1 is a schematic diagram of a typical conventional passive low-pass lumped element filter (LEF) 100 for use with a single-ended signal. LEF 100 includes an inductor 111 that is serially coupled within the signal path represented by arrow 101 (i.e., in series with a load 163) and a capacitor 121 that couples the signal path 101 to ground (i.e., in parallel with the load 163). An impedance of inductor 111 naturally increases as the frequency of the signal passing through it increases. This means that inductor 111 allows low-frequency signals to pass through but naturally blocks high-frequency signals from propagating along the signal path 101. Conversely, an impedance of capacitor 121 naturally decreases as the frequency of the signal passing through it increases. This means that capacitor 121 couples high-frequency signals directly to ground and naturally forces low-frequency signals to propagate along the signal path 101. Thus, LEF 100 has two mechanisms by which high-frequency components are filtered out of the electrical signal: inductor 111 blocks the flow of some high-frequency components but permits low-frequency components to pass through, and capacitor 121 provides a short to ground for some high-frequency components of the signal but forces low-frequency components to carry-on along the signal path 101 towards the load 163.

Throughout this specification and the appended claims, the term "signal path" is used to describe a conductive, superconductive, and/or semi-conductive conduit through or upon which an electrical signal may be propagated. In the illustrated embodiments, such paths are realized by conductive wires and/or conductive traces on printed circuit boards (PCBs). However, as previously described a typical electrical signal may comprise multiple signal frequencies or components and, during filtering, various frequencies or components may follow different signal paths. An electrical filter may be designed such that the signal frequency-range of interest propagates through the filter while substantially all undesirable frequencies are, ideally, filtered out. Thus, the term "signal path" is used herein to describe the route traveled by the particular electrical signal for which filtering is desired as the electrical signal passes through an electrical filter.

The present systems, methods and apparatus describe embodiments of electrical filter structures, where each structure may be used to jointly filter the two signal paths of a differential signal. As previously discussed, differential signaling typically involves implementing two signal paths (e.g., wires) per signal, which typically necessitates two separate filtering devices per signal. Various embodiments described herein provide systems, methods and apparatus for jointly filtering the two signal paths of a differential signal within one tubular filter structure.

Figure 2:
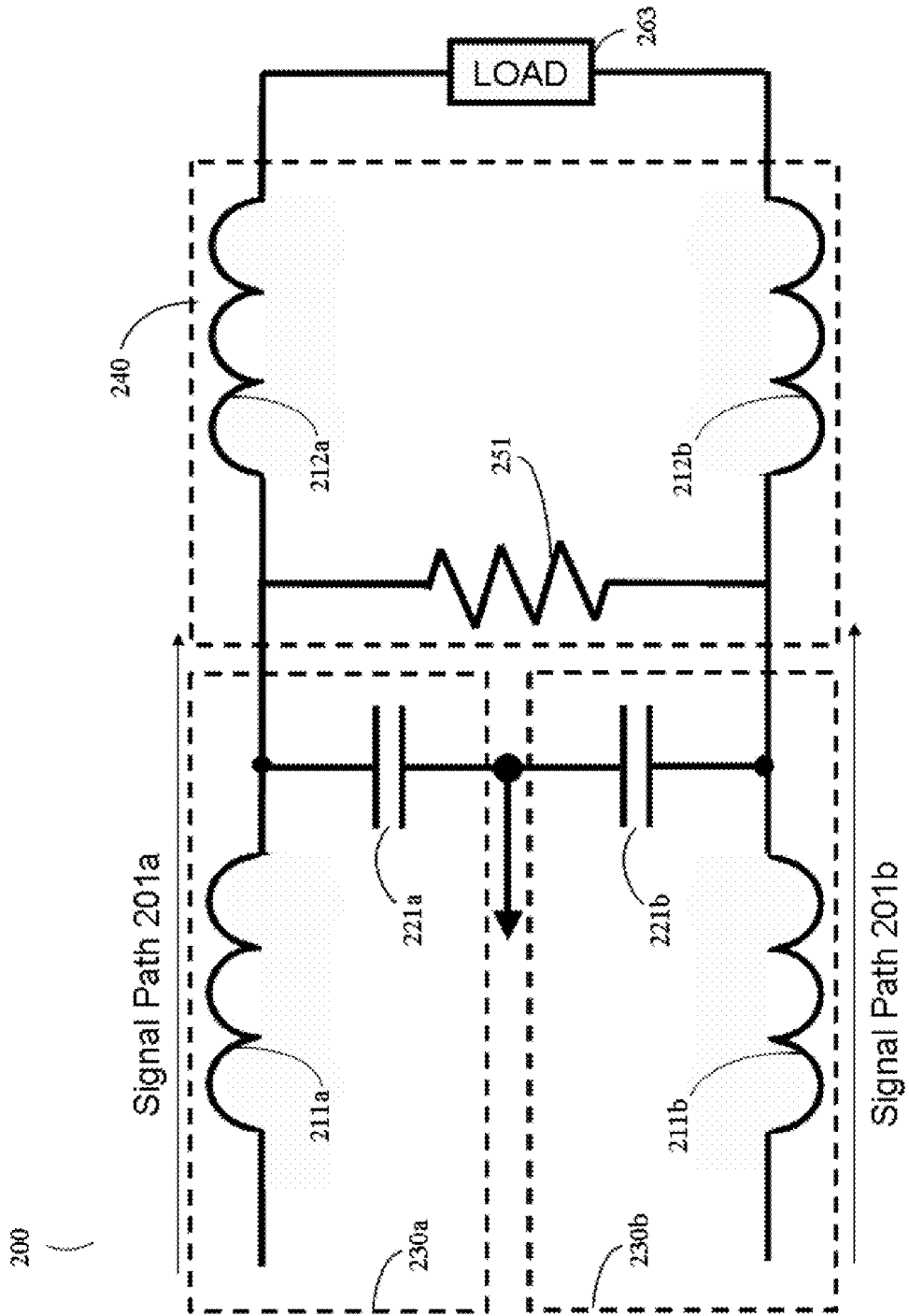
FIG. 2 is a schematic diagram of an embodiment of a passive low-pass lumped element filter for use in jointly filtering the two signal paths of a differential signal, in accordance with the present systems methods and apparatus.

FIG. 2 is a schematic diagram of an embodiment of a passive low-pass lumped element filter (LEF) 200 for use in jointly filtering the two signal paths of a differential signal, in accordance with the present systems, methods and apparatus. LEF 200 includes two signal paths represented by arrows 201a, 201b for use in transmitting a differential signal. Each of signal paths 201a, 201b includes at least one inductor 211a, 211b, respectively, that is electrically coupled in series with a load 263. Each of signal paths 201a and 201b is also coupled to a shared ground by at least one capacitor 221a and 221b, respectively. Thus, each of signal paths 201a and 201b includes a respective portion delimitated by broken line boxes 230a, 230b, where both portions 230a and 230b capacitively couple to the same ground. LEF 200 accomplishes filtering jointly for two signal paths 201a, 201b. In some embodiments, LEF 200 may also include a damping resistor 251 that is electrically coupled in parallel with the load 263 in between signal paths 201a and 201b. A filter for which the source impedance and the filter/load impedance are unmatched may produce an unwanted spike in its passband. Damping resistor 251 may be included to better align the source impedance and the load/filter impedance (if they are unequal) in LEF 200. Damping resistor 251 also helps to reduce the spike (e.g., dissipate tank resonance) in the passband that may be present if the impedance is otherwise unmatched. LEF 200 also includes portion delimitated by broken line box 240, where each of signal paths 201a and 201b includes at least one additional inductor 212a and 212b, respectively. Thus, LEF 200 uses passive low-pass filter principles to jointly filter undesired frequencies out of two signal paths 201a, 201b, while some embodiments also incorporate a damping resistor 251 to flatten out the spike in the passband that may be produced if the source impedance and the load/filter impedance are unmatched.

Rather than using two single-ended filter structures to each individually filter a respective one of the two signal paths of a differential signal, various embodiments described herein provide a single tubular differential filter structure for jointly filtering the two signal paths of a differential signal. In this way, twice as many signal paths (e.g., wires) may be filtered, and with better performance, within any given spatial dimensions. In some embodiments, a tubular differential filter structure to jointly filter the two signal paths of a differential signal may include lumped elements to provide lumped element filtering. In applications where it is desirable to remove frequencies in the microwave range, such a tubular differential filter structure may include one or more structures that cause high frequency dissipation, such as a metal powder epoxy mixture to realize a metal powder filter. The principles governing the operation of typical metal powder filters are described in F. P. Milliken et al., 2007, *Review of Scientific Instruments* 78, 024701 and U.S. patent application Ser. No. 12/016,801.

Figure 3:
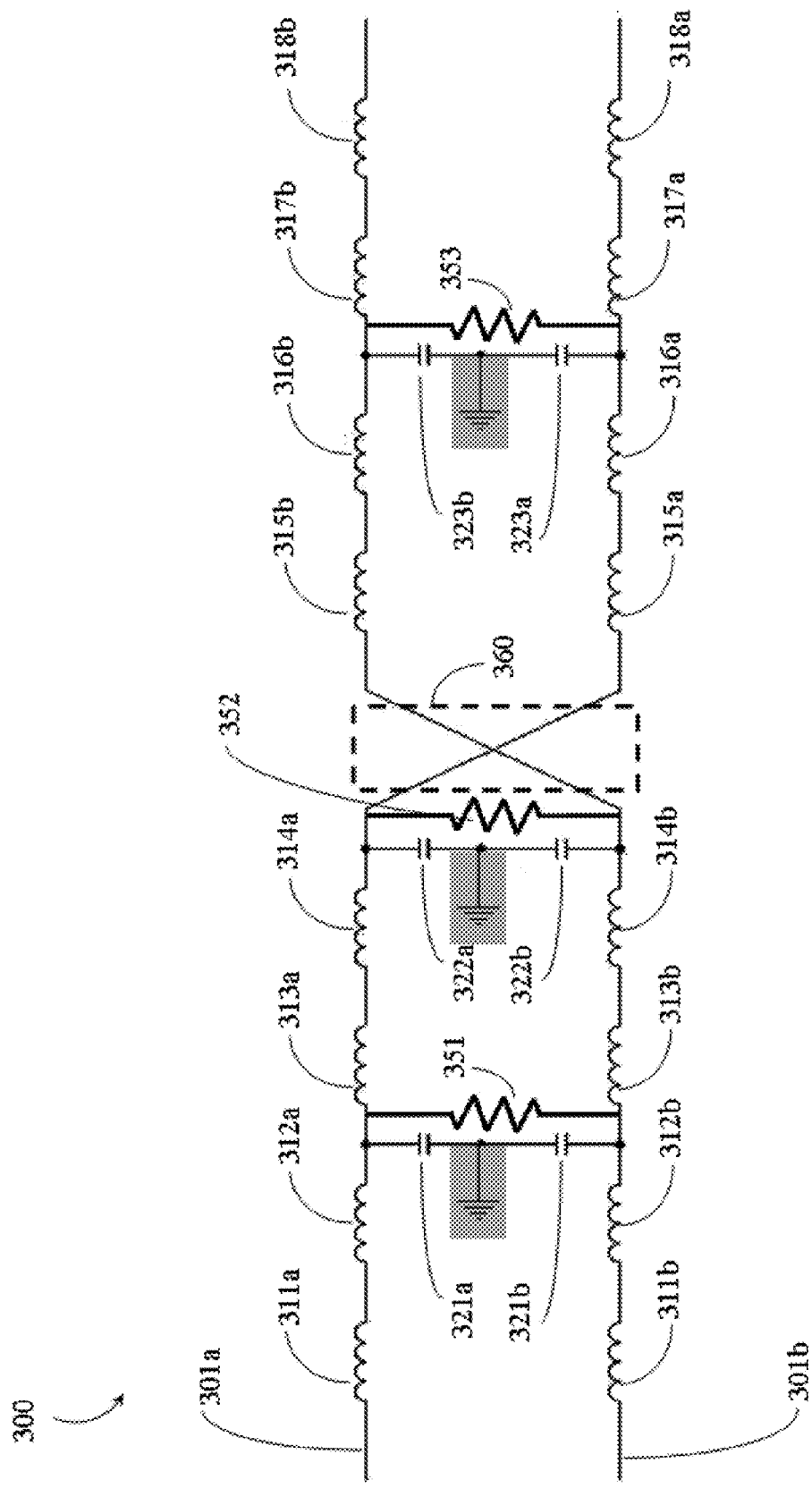
FIG. 3 is a schematic diagram of another embodiment of a differential filter for jointly filtering the two signal paths of a differential signal, in accordance with the present systems, methods and apparatus.

FIG. 3 is a schematic diagram of an embodiment of a differential filter 300 for jointly filtering the two signal paths 301a, 301b of a differential signal. Similar to LEF 200 from FIG. 2, each of signal paths 301a and 301b includes a plurality of serially connected inductors 311a-318a and 311b-318b, respectively, and a plurality of capacitive couplings to ground through capacitors 321a-323a and 321b-323b, respectively. In this way, filter 300 provides lumped element filtering. Each of inductors 311a-318a and 311b-318b may, for example, be formed by a respective coil(s) of conductor (e.g., conductive wire).

Those of skill in the art will appreciate that filter 300 is a multi-stage low-pass filter, where each stage includes a respective set of inductors and capacitors. In typical single-ended low-pass filter circuits, a first stage is formed by an inductor coupled in series in the signal path and a capacitive coupling to ground. This definition may be extended from single-ended signal filtering to differential signal filtering. For example, LEF 100 from FIG. 1 is a single-stage low-pass filter for filtering single-ended signals and LEF 200 is a single-stage low-pass filter for filtering differential signals. The performance of a filter may be adjusted by incorporating multiple such stages in series. Filter 300 is a three-stage low-pass filter for filtering differential signals. The first stage includes inductors 311*a*, 312*a* in the first signal path 301*a*, inductors 311*b*, 312*b* in the second signal path 301*b*, and capacitors 321*a*, 321*b* that each capacitively couple a respective one of signal paths 301*a*, 301*b* to ground. In some embodiments, the first stage may also include a damping resistor 351 electrically coupled between signal paths 301*a* and 301*b* across capacitors 321*a* and 321*b*. In a manner similar to that described for LEF 200 from FIG. 2, a filter for which source impedance and the load/filter impedance are unmatched may produce at least one spike in its passband. In some instances, each stage in a multi-stage filter may produce a spike at a different frequency. Thus, some embodiments of filter 300 may include a damping resistor 351, 352, 353 coupled across the capacitors (321*a* and 321*b*, 322*a* and 322*b*, 323*a* and 323*b*, respectively) in each stage in order to reduce the particular spike in the passband that may be produced by each respective stage. Those of skill in the art will appreciate that, while filter 300 includes three-stages, a similar filter may be constructed comprising any number of stages.

As previously described, filter 300 may be used for jointly filtering the two signal paths 301*a*, 301*b* of a differential signal. Space may be conserved by coiling each inductor in one signal path (e.g., path 301*a*) on top of or about (e.g., coaxially with) a respective inductor in the other signal path (e.g., path 301*b*). Throughout this specification and the appended claims, to coil a first inductor on top of a second inductor means to wind the first or "outer" inductor over the outer surface of the second or "inner" inductor, such that the second inductor serves as a core upon or about which the first inductor is wound. Thus, the term "top coil" or "outer coil" is used to refer to the first coil that is wound on top of or about the second coil, and the term "bottom coil" or "inner coil" is used to refer to the second coil upon or about which the top or outer coil is wound. Together, a top or outer coil and the bottom or inner coil upon or about which it is wound form a top-bottom or outer-inner coil pair.

In some embodiments, the two signal paths 301*a*, 301*b* may be substantially symmetrical such that any two inductors that are in the same relative position in both signal paths (i.e., any two inductors with the same number and a different suffix in FIG. 3; for instance, inductors 311*a* and 311*b*, or inductors 316*a* and 316*b*) are positioned with one inductor on top of or about the other to form a top-bottom coil pair. For example, inductors 311*a* and 311*b* may form a top-bottom coil pair. In FIG. 3, each inductor in the top row (i.e., inductors 311*a*-314*a* to the left of region 360 and inductors 315*b*-318*b* to the right of region 360) may be coiled on top of or about its counterpart in the bottom row (i.e., inductors 311*b*-314*b* to the left of region 360 and inductors 315*a*-318*a* to the right of region 360), respectively. For example, inductor 312*a* may be coiled on top of or about inductor 312*b*, and inductor 317*b* may be coiled on top of or about inductor 317*a*.

In filter 300, the two signal paths 301*a*, 301*b* may be substantially symmetrical not only in their respective number and configuration of lumped elements, but also in their respective number of top or outer coils and bottom or inner coils. That is, approximately half of each of the inductors in signal path 301*a* may be wound on top of or about a respective inductor in signal path 301*b*, and approximately half of each of the inductors in signal path 301*b* may be wound on top of or about a respective inductor in signal path 301*a*. The purpose of the region delineated by broken line box 360 in filter 300, therefore, is to switch the relative physical positions of the two signal paths 301*a* and 301*b*. To the left of region 360, signal path 301*a* is on top of signal path 301*b* and therefore each of inductors 311*a*-314*a* in signal path 301*a* may be coiled on top of or about its respective symmetrical counterpart 311*b*-314*b* in signal path 301*b*. In region 360, the two signal paths 301*a*, 301*b* cross and switch their relative positions. To the right of region 360, signal path 301*b* is on top of signal path 301*a* and therefore each of inductors 315*b*-318*b* in signal path 301*b* may be coiled on top of or about its respective symmetrical counterpart 315*a*-318*a* in signal path 301*a*.

In embodiments of the present systems, methods and apparatus that incorporate metal powder filtering, approximately the same number of top coils may be implemented in each signal path 301*a*, 301*b* in order to ensure substantially similar high frequency dissipation in both signal paths. In some embodiments, filter 300 may be potted in a mixture of metal powder and epoxy such that high frequency signals carried in signal paths 301*a* and 301*b* are at least partially dissipated by the metal powder epoxy mixture. The mechanism for this dissipation is described in F. P. Milliken et al., 2007, *Review of Scientific Instruments* 78, 024701. In general, such high frequency dissipation is improved by ensuring that the metal powder particles are as close as possible to the wire of the inductors in the signal path(s). For this reason, filter 300 uses region 360 to provide approximately the same number of top coils in each signal path 301*a*, 301*b*. For example, in embodiments where filter 300 is potted in a metal powder epoxy mixture, top coils 311*a*-314*a* provide a large surface area for direct contact between the metal powder epoxy mixture and signal path 301*a*, and top coils 315*b*-318*b* provide a large surface area for direct contact between the metal powder epoxy mixture and signal path 301*b*.

In some embodiments, the metal powder epoxy mixture may include copper powder. In some embodiments, the metal powder epoxy mixture may include brass powder.

Those of skill in the art will appreciate that any two inductors connected directly in series with one another, with no current branches in between, may generally be replaced by one inductor whose inductance is equal to the sum of the two serially connected inductors. For example, inductors 311*a* and 312*a* may, in some respects, be equivalently replaced by a single inductor whose inductance is equal to the sum of the inductances of inductors 311*a* and 312*a*. However, in filter 300 each inductance is purposefully provided by two serially-connected inductors. At least part of the reason for this is directly related to the implementation of top and bottom coils in filter 300. Because each inductor in filter 300 is either coiled on top of or about another inductor (i.e., a top or outer coil) or has another inductor coiled on top of or about it (i.e., a bottom or inner coil) the mutual inductance between inductors can have a significant impact on the performance of filter 300. In particular, the relative directions of current flow in the two inductors that form a top-bottom coil pair can influence the performance of filter 300. The relative directions of current flow in the two inductors that form a top-bottom coil pair depends on the relative directions in which the top/outer coil and bottom/inner coil are respectively wound. Attenuation of common-mode signals in a top-bottom coil pair may be achieved, at least in part, by coiling both the top coil and the bottom coil in the same direction. Alternatively, attenuation of differential-mode signals in a top-bottom coil pair may be achieved, at least in part, by coiling the top coil and the bottom coil in opposite directions. Thus, in filter 300 each inductance is purposefully provided by two serially-connected inductors so that each inductance may include a portion for which the top or outer coil and bottom or inner coil are coiled in the same direction and a portion for which the top or outer coil and the bottom or inner coil are coiled in opposite directions. For example, inductor 311*b* may be coiled in a first coiling direction and inductor 311*a* may be coiled in a second coiling direction on top of inductor 311*b* to form a top-bottom coil pair where the top or outer coil 311*a* and the bottom or inner coil 311*b* are coiled in opposite directions to achieve differential-mode signal attenuation. Then, inductor 312*b* may be coiled in a first coiling direction and inductor 312*a* may be coiled in the same coiling direction on top of or about inductor 312*b* to form a top-bottom coil pair where the top or outer coil 312*a* and the bottom or inner coil 312*b* are both coiled in the same direction to achieve common-mode signal attenuation. By jointly filtering the two signal paths of a differential signal in one filter structure, filter 300 provides a mechanism for the attenuation of unwanted signal frequencies that is not achievable by implementing a separate and distinct filter structure for each signal path.

Throughout this specification and the appended claims, various inductors are described as being formed of a conductive wire coiled in either a first direction or a second direction. The coil of an inductor may be wound around a core or an axis, and the distinction between a first coiling direction and a second coiling direction may be understood by considering a cross-section of the core. Coiling in a first direction may be understood as clockwise coiling around a cross section of the core or about the axis, and coiling in a second direction may be understood as counter-clockwise coiling around the same cross section of the core or about the same axis.

The present systems, methods and apparatus describe embodiments of a differential electrical filter that is tubular in geometry (hereinafter referred to as a "differential tubular filter structure"). The filter device itself comprises a plurality of lumped elements (e.g., inductors and capacitors) connected to at least one printed circuit board (PCB), while the tubular aspect relates to a cylindrical shield in which the filter device may be enclosed. In accordance with the present systems, methods and apparatus, at least a portion of a PCB may serve as the core for at least the bottom coils (i.e., inductors 311*b*-314*b* and 315*a*-318*a* of filter 300) of an electrical filter for use in jointly filtering the two signal paths of a differential signal. As previously discussed, bottom or inner coils may each serve as a respective core for a respective top or outer coil (e.g., inductors 311*a*-314*a* and 315*b*-318*b* of filter 300). In some embodiments, the PCB may include a dielectric substrate, such as FR4. In some embodiments, the PCB may serve as both a signal-carrying device and as a structural device in a manner similar to that described in US Patent Publication No. 2008-0176751. Various embodiments described herein provide adaptations and modifications to the teachings of US Patent Publication No. 2008-0176751 in order to achieve joint filtering of the two signal paths of a differential signal. For illustrative purposes, the embodiments described herein are passive low-pass filters such as LEF 200 from FIG. 2; however, as previously discussed those of skill in the art will appreciate that the concepts taught herein may be adapted to meet other filtering requirements, such as high-pass, band-pass, and band-stop filtering. The top or outer coils or windings may be electrically insulated from the bottom or inner coils or windings by any suitable electrically insulating material.

FIG. 4A is a top plan view of an embodiment of a PCB 400 for use in a differential tubular filter structure, showing a first surface 400*a* upon which at least a respective portion of each of the two signal paths is carried. PCB 400 includes a dielectric substrate (e.g., FR4, represented by white regions of PCB 400) and a plurality of conductive traces (represented by solid dark regions of PCB 400). While illustrated as a top outer surface of the PCB 400, in some embodiments the first surface 400*a* may be an inner surface, formed as one of multiple layers of PCB 400. PCB 400 also includes an input end 401, an output end 402, as well as a plurality of necked or narrow regions 411-414 and wide regions 421-423. In a manner similar to that described in US Patent Publication No. 2008-0176751, each narrow region 411-414 may serve as a core for at least one inductor coil. Each of narrow regions 411-414 is divided into a leftmost section (labeled "_L" in the Figure) and a rightmost section (labeled "_R" in the Figure) by a respective coiling tab 450 (only one called out in the Figure). For example, narrow region 413 is divided into a leftmost section 413L and a rightmost section 413R by coiling tab 450 (only one called out in FIG. 4A). In some embodiments, each respective rightmost section and each respective leftmost section of each narrow region 411-414 may serve as a respective core for at least one respective inductor coil.

Those of skill in the art will appreciate that the number and relative lengths of each of narrow regions 411-414, and each of their respective leftmost and rightmost sections, may vary in different embodiments. In some embodiments, the length of a particular narrow region 411-414 may influence the maximum length of an inductor coil (and, as a result, the maximum inductance of the inductor coil) that can be wound about PCB 400 within that particular narrow region. Those of skill in the art will appreciate that a longer narrow region may allow for an inductor coil of greater inductance than a shorter narrow region. For example, narrow region 412 is longer, in the illustrated embodiment, than narrow region 411. Thus, narrow region 412 may accommodate a longer inductor coil (and therefore a greater inductance) than narrow region 411.

In a manner similar to that described in US Patent Publication No. 2008-0176751 each of the wide regions 421-423 may include at least one respective through-hole 441-446 for receiving a respective lumped element capacitor (not shown in the Figure). In PCB 400, each wide region includes two respective through-holes and at least one respective coiling cut 490 (only one called out in the Figure). For example, wide region 421 includes through-holes 441 and 442. On the first surface 400*a* of PCB 400, each of wide regions 421-423 includes two respective conductive traces 431*a*-436*a* (shown as solid black rectangles in the Figure), where each conductive trace 431*a*-436*a* covers only a portion of a respective wide region 421-423. In some embodiments, each of through-holes 441-446 passes through a respective one of conductive traces 431*a*-436*a*. For example, wide region 422 includes two conductive traces, 433*a* and 434*a* such that through-hole 443 passes through conductive trace 433*a* and through-hole 444 passes through conductive trace 434*a*. In some embodiments, each of narrow regions 411-414 includes only dielectric substrate (e.g., FR4). PCB 400 also includes a switching tab 460 which may be wider than narrow regions 411-414 and includes two conductive traces (not called out, though shown as black rectangles in the Figure).

In alternative embodiments, through-holes 441-446 may be omitted and lumped element capacitors (not shown in the Figure) may be positioned on a surface (e.g., first surface 400*a*) of PCB 400.

Figure 8:
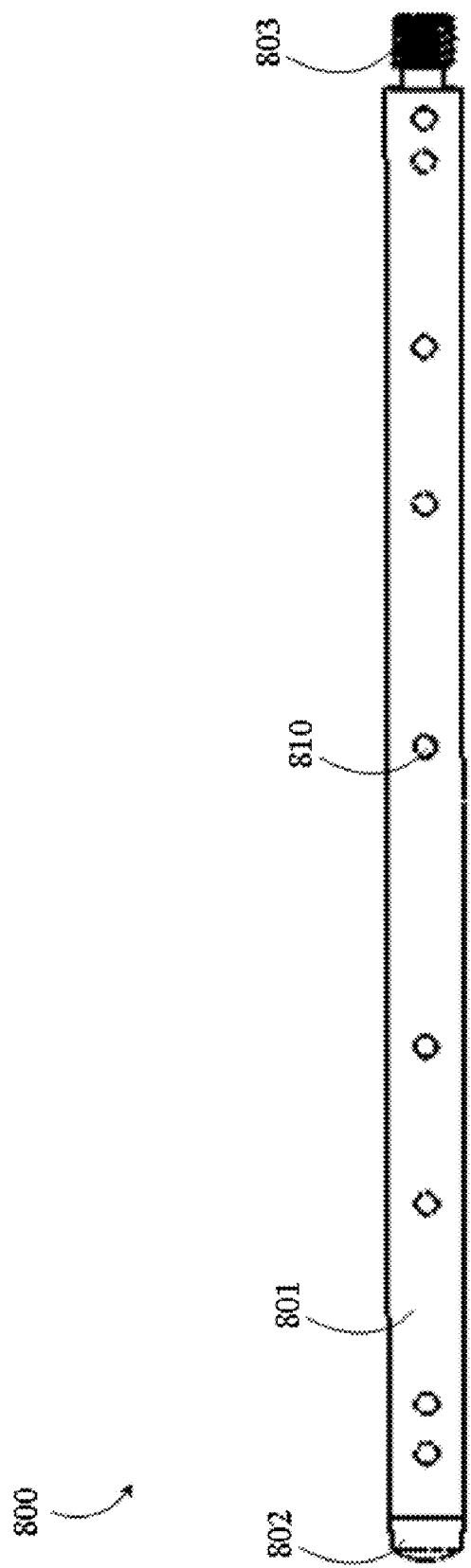
FIG. 8 is a plan view of an embodiment of a tubular filter structure.

Both input end 401 and output end 402 may be wider than narrow regions 411-414 to improve support of the PCB 400 when placed within a shielded enclosure (see FIG. 8). As illustrated, input end 401 carries two conductive traces 471*a* and 472*a* on side 400*a*, each of which has three respective through-holes (drawn as white circles in the Figure, though not called out to reduce clutter). In some embodiments, conductive trace 471a may couple to a first input wire of a differential signal and conductive trace 472a may couple to a second input wire of a differential signal. Similarly, output end 402 carries two conductive traces 481a and 482a on side 400a, each of which has three respective through-holes (drawn as white circles in the Figure, though not called out to reduce clutter). In some embodiments, conductive trace 481a may couple to a first output wire of a differential signal and conductive trace 482a may couple to a second output wire of a differential signal.

FIG. 4B is a bottom plan view of PCB 400, showing a second surface 400b upon which at least a portion of the ground path is carried. While illustrated as a bottom outer surface of the PCB 400, in some embodiments the second surface 400b may be an inner surface, formed as one of multiple layers of PCB 400. The second surface 400b is substantially similar to the first surface 400a of PCB 400. The second surface 400b includes the same narrow regions 411-414 and wide regions 421-423 with through-holes 441-446 as the first surface 400a. However, surface 400b of PCB 400 is distinguishable from surface 400a in the nature of the conductive traces 431b-433b respectively carried by each of wide regions 421-423. Each of conductive traces 431b-433b on the second surface 400b covers a greater surface area of wide regions 421-423, respectively, than that covered by conductive traces 431a-436a on the first surface 400a. In some embodiments, conductive traces 431b-433b may extend over and cover at least a portion of at least one side (e.g., thickness or perimeter edge) of each of wide regions 421-423. Furthermore, in the illustrated embodiment each of wide regions 421-423 carries one large conductive trace 431b-433b, respectively, on surface 400b, whereas each of wide regions 421-423 carries two small conductive traces 431a-436a on surface 400a. However, it is important to note that there is no direct electrically conductive path connection between conductive traces on the first surface 400a of PCB 400 and those on second surface 400b of PCB 400.

Figure 5:
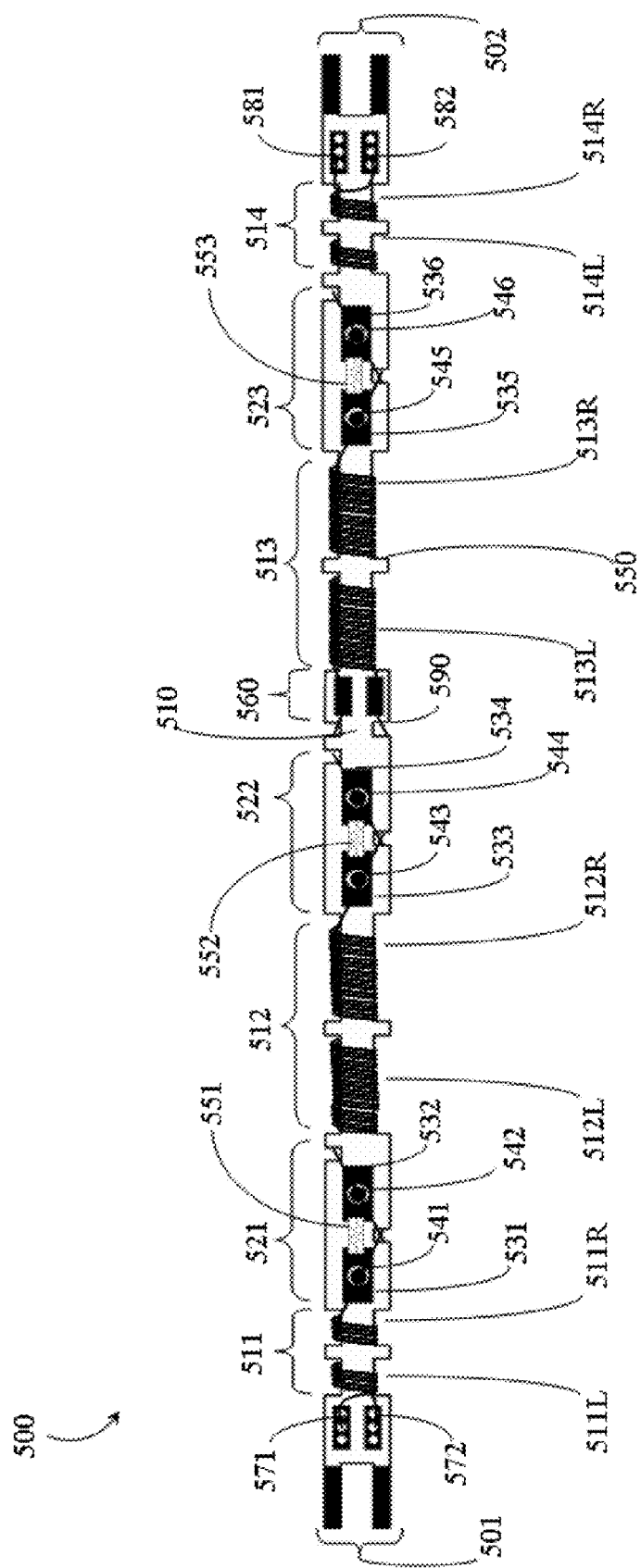
FIG. 5 is a top plan view of an embodiment of a filtering device comprising a printed circuit board with lumped elements, for use in a tubular filter structure.

PCB 400 provides some signal-carrying functionality on a structural base for lumped element devices (e.g., inductors and capacitors) in a tubular filter structure. FIG. 5 is a top plan view of an embodiment of a filtering device 500 comprising a PCB 510 with lumped elements, for use in a tubular filter structure. Note that PCB 510 is, for all intents and purposes, the same as PCB 400 from FIGS. 4A and 4B, and FIG. 5 shows the signal surface (400a) of PCB 510 as distinguishable by the widths of the conductive traces 531-536 on the wide regions 521-523. In filtering device 500, each of through-holes 541-546 receives a respective lumped element capacitor (not called out in the Figure, though represented by solid black circles, each received within a respective one of through-holes 541-546). While the capacitors are illustrated as being cylindrical, those of skill in the art will appreciate that capacitors of other geometries (such as rectangular, cubic, hexagonal, etc.) may similarly be used. Each capacitor may include two contact points, with one contact point on each of two opposing ends (such as in, for example, an SMD capacitor), and they may be soldered in place by connections to the conductive traces on both surfaces of PCB 510. Thus, the capacitors provide capacitive coupling between the conductive traces on both surfaces of wide regions 521-523. More specifically, the capacitors may provide capacitive coupling from the signal path (carried on the surface shown in FIG. 5; i.e., surface 400a) and the ground path (carried on the surface opposing that shown in FIG. 5; i.e., surface 400b), thereby realizing the same capacitive coupling to ground as that illustrated for LEF 200 in FIG. 2. In some embodiments, each capacitor may be sized to provide an interference fit in a respective through-hole 541-546.

As is also shown in FIG. 5, each of narrow regions 511-514 is wound by a respective section of conductive wire to form lumped element inductors (not called out in the Figure, though represented by curved black lines wound about PCB 510). In some embodiments, each lumped element inductor may be realized by a separate wound length of one continuous conductive wire. In such embodiments, the continuous conductive wire may be soldered to the conductive trace on each of wide regions 521-523, or the continuous conductive wire may simply pass over and electrically contact (as is shown in the Figure) the conductive trace and/or capacitor at each of wide regions 521-523. In order to establish an electrical connection with the conductive trace and/or capacitor, any resistive/insulative cladding that may cover the continuous conductive wire may need to be stripped from the portion of the continuous conductive wire that passes over the conductive trace and/or capacitor. In other embodiments, each lumped element inductor may be realized by a separate piece of wound conductive wire. In such embodiments, each lumped element inductor is soldered at both ends to a conductive trace on the signal surface of PCB 510. In still further embodiments, the lumped element inductors may be formed by conductive traces carried by one or more layers of the PCB 510.

In some embodiments, filtering device 500 may also include a set of damping resistors 551-553 (represented by white boxes bearing a "resistor" symbol), each serving to flatten out a respective spike that may be produced in the passband of filtering device 500, as described for damping resistor 251 in LEF 200. Damping resistor 551 may be coupled in between capacitors 541 and 542 on the signal surface (e.g., 400a) of PCB 510 by soldering a first end of damping resistor 551 to conductive trace 531 and soldering a second end of damping resistor 551 to conductive trace 532. Similarly, damping resistor 552 may be coupled in between capacitors 543 and 544, and damping resistor 553 may be coupled in between capacitors 545 and 546.

The input end 501 of filtering device 500 includes two conductive traces 571, 572, each of which may electrically couple to a respective differential signal input line. Similarly, the output end of filtering device 500 includes two conductive traces 581, 582, each of which may electrically couple to a respective differential signal output line. In order to jointly filter the two signal paths of a differential signal, PCB 510 may jointly electrically couple to and carry two signal paths. A first signal path may include a plurality of inductors electrically coupled in series and a plurality of capacitive couplings to ground. Similarly, a second signal path may also include a plurality of inductors electrically coupled in series and a plurality of capacitive couplings to ground. In some embodiments, the first signal path and the second signal path may be coupled together through at least one damping resistor. In some embodiments, the first signal path and the second signal path may be substantially electrically symmetrical is in LEF 200 from FIG. 2. In some embodiments, each of narrow regions 511-514 may serve as a core for a respective inductor in the first signal path. In some embodiments, each of narrow regions 511-514 may also serve as a core for a respective inductor in the second signal path. In the latter case, each narrow region 511-514 may include at least two inductors that are wound one on top of or about the other to form a top-bottom coil pair, where the first signal path includes one of the two coils and the second signal path includes the other of the two coils. Each of narrow regions 511-514 may include a respective coiling tab 550 (only one called out in the Figure) which may be used to switch the relative coiling directions of the two coils in a top-bottom coil pair for the reasons described for filter 300 of FIG. 3.

As previously stated, both the first signal path and the second signal path may include a plurality of capacitive couplings to ground. These capacitive couplings are realized in wide regions 521-523 of PCB 510, where capacitors in through-holes 541-546 each couple between a respective conductive trace 531-536 on the signal side of PCB 510 (i.e., the side shown in FIG. 5) and a respective conductive trace (e.g., conductive traces 431*b*-433*b* of FIG. 4) on the ground side of PCB 510 (i.e., the side opposite the side shown in FIG. 5). In some embodiments, each of the two signal paths may electrically couple to a respective one of the two capacitors in each wide region 521-523 on the signal side of PCB 510. For example, in wide region 521 the first signal line may electrically couple to a capacitor in through-hole 541 and the second signal line may electrically couple to a capacitor in through-hole 542.

Filtering device 500 may be used to physically realize the filter 300 shown schematically in FIG. 3. For clarification, a description of how filtering device 500 may embody filter 300 is now provided.

Signal path 301*a* from filter 300 may begin in filtering device 500 at conductive trace 571 and signal path 301*b* from filter 300 may begin in filtering device 500 at conductive trace 572. The leftmost section 511L of narrow region 511 may serve as a core about which bottom coil 311*b* and top coil 311*a* may be wound. Similarly, the rightmost section 511R of narrow region 511 may serve as a core about which bottom coil 312*b* and top coil 312*a* may be wound. As previously described, the inductance realized by serially-connected inductors 311*a* and 311*b* in signal path 301*a* (and similarly, the inductance realized by serially-connected inductors 311*b* and 312*b* in signal path 301*b*) is schematically divided into two inductors in order to switch the relative coiling directions of the two coils in a top-bottom coil pair. For instance, inductors 311*a* and 311*b* may be coiled in opposite directions in a first top-bottom coil pair and inductors 312*a* and 312*b* may both be coiled in the same direction in a top-bottom coil pair. In filtering device 500, the two coils wound about leftmost section 511L of narrow region 511 may be coiled in opposite directions and the two coils wound about rightmost region 511R of narrow region 511 may both be coiled in the same direction. A coiling tab, such as coiling tab 550, may be used to switch the direction of coiling in one of the two signal paths.

From rightmost section 511R of narrow region 511, the first signal path may pass over the capacitor in through-hole 541 and couple to conductive trace 531, thereby realizing the capacitive coupling to ground schematically represented by capacitor 321*a* in FIG. 3. Similarly, the second signal path may pass over the capacitor in through-hole 542 and couple to conductive trace 532, thereby realizing the capacitive coupling to ground schematically represented by capacitor 321*b* in FIG. 3. In some embodiments, conductive traces 531 and 532 may be coupled together through a damping resistor 551, which is schematically represented by damping resistor 351 in FIG. 3.

In a manner similar to that described above, inductors wound about narrow regions 512-514 may similarly embody inductors 313*a*-318*a* and 313*b*-318*b*, capacitors in through-holes 543-546 may similarly embody capacitors 322*a*, 322*b*, 323*a*, and 323*b*, and, in some embodiments, damping resistors 552 and 553 may similarly embody damping resistors 352 and 353. In filter 300, region 360 is used to switch which signal path has top or outer coils and which signal path has bottom or inner coils in each top-bottom or outer-inner coil pair. In filtering device 500, this switching is achieved using switching tab 560, as illustrated in FIGS. 6A and 6B.

FIG. 6A is a top plan view of a portion an embodiment of a filtering device 600 comprising a PCB 610 with lumped elements, for use in a tubular filter structure. The portion of filtering device 600 shown in FIG. 6 includes a rightmost section 612R of a first narrow region 612 and a leftmost region 613L of a second narrow region 613. Rightmost section 612R of narrow region 612 is wound by a top-bottom coil pair 651 in which one signal path (e.g., a first coil of conductive wire) corresponds to the bottom coil and the other signal path (e.g., a second coil of conductive wire) corresponds to the top coil. Top-bottom coil pair 651 is wound about narrow region 612 of PCB 610 and ends where narrow region 612 connects to wide region 622 of PCB 610.

At the output of top-bottom coil pair 651, the two signal paths, 601*a* and 601*b*, follow separate routes across wide region 622. Signal path 601*a* passes over the back surface (the surface opposite to that shown in FIG. 6A) of a first section of wide region 622 and up through coiling cut 690. Signal path 601*a* then passes over the front surface (the surface shown in FIG. 6A) of a second section of wide region 622, where it passes over conductive trace 634 and couples to capacitor 644. Signal path 601*a* then pass behind coiling tab 650 and across the front surface of switching region 660. The front surface of switching region 660 includes two conductive traces, 661 and 662, and signal path 601*a* couples to both. In some embodiments, the wire that forms signal path 601*a* may be soldered (and stripped, if necessary) to both conductive traces 661 and 662. Signal path 601*a* then passes into top-bottom coil pair 652 where it is wound about leftmost section 613L of narrow region 613. In FIGS. 6A and 6B, conductive wires drawn with sold lines represent wires that pass over the front surface of PCB 610 and conductive wires drawn with broken lines represent wires that pass over the back surface of PCB 610.

Similarly, from the output of top-bottom coil pair 651, signal path 601*b* passes over the front surface of a first section of wide region 622, where it passes over conductive trace 633 and couples to capacitor 643. Signal path 601*b* then extends down through coiling cut 690 and passes over the back surface of a second section of wide region 622. Signal path 601*b* then extends up through coiling cut 691 and passes over the front surface of switching region 660, where it is coupled to the two conductive traces 661 and 662 in a manner similar to that described for signal path 601*b*. Signal path 601*b* then passes into top-bottom coil pair 652 where it is wound about leftmost section 613L of narrow region 613.

The fabrication of filtering device 600 (and, similarly, filtering device 500 from FIG. 5) can be simplified by coiling a first continuous wire over each respective narrow region (e.g., narrow regions 511-514) and subsequently coiling a second continuous wire over each respective narrow region. In this example, the first continuous wire may provide a first continuous signal path which, as illustrated in FIGS. 5A, 5B, and 6, may pass over the wide regions (e.g., wide regions 521-523) and capacitively couple to ground. Similarly, the second continuous wire may provide a second continuous signal path which, as illustrated in FIGS. 5A, 5B, and 6, may pass over the wide regions (e.g., wide regions 521-523) and capacitively couple to ground. Because the first continuous wire is, for each inductor, the first to be wound, this implementation means that the first continuous wire will provide the bottom coil in each top-bottom coil pair and the second continuous wire will provide the top coil in each top-bottom coil pair. However, as described for filter 300 from FIG. 3, in some embodiments it may be advantageous to ensure that each signal path includes path top coils and bottom coils. In particular, in embodiments for which the filtering device (e.g., filtering device 500 or filtering device 600) is immersed in metal powder epoxy to realize high frequency dissipation, it can be advantageous to ensure that both signal paths include approximately the same number of top coils and bottom coils such that both signal paths have approximately the same surface area exposed to the metal powder epoxy. During fabrication, it can be impractical to switch between which of the first continuous wire and the second continuous wire is wound as the bottom coil in each top-bottom coil pair. To this end, switching region 660 is used to effectively route the first signal path from the first continuous wire to the second continuous wire, and to route the second signal path from the second continuous wire to the first continuous wire. This is accomplish by soldering each of the two wires to each of the two conductive traces 661, 662 of switching region 660, and then removing (e.g., cutting) the wire cross-over point 665.

In some embodiments, PCB 610 may include at least one slot and/or through-hole designed to allow epoxy to flow therethrough. For example, narrow region 612 may include at least one slot therethrough to improve surface area contact between the bottom coil in top-bottom coil pair 651 and a metal powder epoxy mixture in which PCB 610 is immersed.

FIG. 6B is another top plan view of a portion an embodiment of a filtering device 600 comprising a PCB 610 with lumped elements, showing the effect of removing wire cross-over point 665. As previously described, during fabrication it can be easier to completely wind a first wire over PCB 610 and subsequently completely wind a second wire over PCB 610. In FIG. 6A, signal path 601*a* corresponds to the first continuous wire and signal path 601*b* corresponds to the second continuous wire. This means that, in FIG. 6A, signal path 601*a* passes through the bottom coil in each top-bottom coil pair (e.g., top bottom coil pairs 651 and 652) and signal path 601*b* passes through the top coil in each top-bottom coil pair. FIG. 6B shows how, by using switching region 660, signal path 601*a* may be routed from the first wire to second wire, and signal path 601*b* may be routed from the second wire to the first wire. In order to achieve this routing, the cross-over point 665 where the first continuous wire and the second continuous wire in switching region 660 is removed after the wires have been wound about PCB 610. Since both wires are coupled to conductive trace 661 and both wires are coupled to conductive trace 662, signal path 601*a* may couple from the first wire to the second wire through conductive trace 661 and signal path 601*b* may couple from the second wire to the first wire through conductive trace 662. In this way, the relative "top" and "bottom" positions of the coils in each of signal paths 601 and 601*b* may be switched at switching region 660.

Another detail described schematically in filter 300 of FIG. 3 which may be embodied in filtering device 500 is the realization of common-mode attenuation by winding both the top coil and the bottom coil in a top-bottom coil pair in the same direction, and differential-mode attenuation by winding the top coil and the bottom coil in a top-bottom coil pair in opposite directions. This is achieved in filter 500 by using the coiling tabs 550 (only one called out in FIG. 5) that divide each narrow region 511-514 into a leftmost section and a rightmost section.

FIG. 7A is a top plan view of a portion of an embodiment of a filtering device 700 comprising a PCB 710 with lumped elements, highlighting the use of coiling tabs 751-753 with a first signal path 701*a*. FIG. 7A shows one signal path 701*a* which is input by coupling to conductive trace 771. As previously described, conductive trace 771 may include at least one through-hole (not shown) to act as an anchoring point for the wire that forms signal path 701*a*. The wire that forms signal path 701*a* is wound about leftmost section 711L of narrow region 711 in the direction indicated by the arrows, thereby forming a first inductor coil. This winding extends across coiling tabs 751 and 752 (as illustrated by arrows in regions 711L and 711R) and continues in the same direction through rightmost section 711R of narrow region 711. When the wire that forms signal path 701*a* reaches wide region 721, it passes over the back surface of a first section of wide region 721 and then extends up through coiling cut 791. From coiling cut 791, the wire that forms signal path 701*a* passes over the front surface of a second section of wide region 721 and couples to capacitor 742. The wire that forms signal path 701*a* then wraps around the back surface of coiling tab 753 and is wound about leftmost section 712L in the same direction (as illustrated by arrow in regions 712L) as it was wound about narrow region 711.

FIG. 7B is a top plan view of a portion of an embodiment of a filtering device 700 comprising a PCB 710 with lumped elements, highlighting the use of coiling tabs 751-753 with a second signal path 701*b*. FIG. 7B shows one signal path 701*b* which is input by coupling to conductive trace 772. As previously described, conductive trace 772 may include at least one through-hole (not shown) to act as an anchoring point for the wire that forms signal path 701*b*. The wire that forms signal path 701*b* is wound about leftmost section 711L of narrow region 711 in the direction indicated by the arrows in region 711L, thereby forming a first inductor coil. The wire that forms signal path 701*b* is wound about leftmost section 711L of narrow region 711 in the opposite direction to that shown for the wire that forms signal path 701*a* in FIG. 7A. Thus, the top-bottom coil pair formed over leftmost section 711L of narrow region 711 may achieve differential-mode attenuation. The wire that forms signal path 701*b* then wraps around the back surface of coiling tab 751 and is wound about the rightmost section 711R of narrow region 711 in a direction (as illustrated by arrows in region 711R) that is opposite to that in which it was wound about leftmost section 711L. Thus, the wire that forms signal path 701*b* is wound about rightmost section 711R of narrow region 711 in the same direction as that shown for the wire that forms signal path 701*a* in FIG. 7A. Thus, the top-bottom coil pair formed over rightmost section 711R of narrow region 711 may achieve common-mode attenuation. Therefore, coiling tab 751 (and similarly, coiling tabs 752 and 753) may be used to switch the coiling direction of the wire that forms at least one signal path in a narrow region of PCB 710. When the wire that forms signal path 701*b* reaches wide region 721, it passes over the front surface of a first section of wide region 721, couples to capacitor 741, and extends down through coiling cut 791. From coiling cut 791, the wire that forms signal path 701*b* passes over the back surface of a second section of wide region 721. The wire that forms signal path 701*b* is then wound about leftmost section 712L in the same direction (as illustrated by arrows in region 712L) as it was wound about leftmost section 711L.

Those of skill in the art will appreciate that the embodiments shown in the Figures are intended for illustrative purposes only and do not limit the present systems, methods and apparatus. Specifically, the order and arrangement of relative coiling directions, the number and size of lumped elements, and the relative top and bottom positioning of the two signal paths in each top-bottom coil pair as described for the Figures may differ in alternative embodiments. For example, while differential-mode attenuation is achieved in leftmost section 711L and common-mode attenuation is achieved in rightmost section 711R, alternative embodiments may be designed achieve common-mode attenuation in leftmost section 711L and differential-mode attenuation in rightmost section 711R.

In filtering device 500, lumped element inductors are electrically coupled in series with each of the two signal paths, thereby realizing the low-pass filtering characteristics of LEF 200 illustrated in FIG. 2. As will be apparent to those of skill in the art, filtering device 500 realizes a multi-stage low-pass filter that may be adapted to incorporate any number of inductors and/or capacitors. FIG. 5 shows inductors corresponding to narrow regions 511-514 of PCB 510, and capacitors 541-546 corresponding to wide regions 521-523 of PCB 510. Those of skill in the art will appreciate that more or fewer inductors and/or capacitors may be incorporated into a similar filter device structure by incorporating the appropriate corresponding narrow/wide regions in PCB 510. Furthermore, those of skill in the art will appreciate that each inductor may be any size (where a larger inductor may require a longer stretch of narrow region in the PCB) and each capacitor may similarly be any size (where a larger capacitor may require a larger diameter through-hole). Both the size and number of lumped element devices may be adapted to provide the filtering performance desired in any specific implementation.

In a low-pass configuration, filtering device 500 is well-suited to remove frequencies up to several GHz. However, beyond that, the lumped elements of filtering device 500 may be unable to provide satisfactory filtering by themselves. In applications where it is desirable to remove frequencies in, for example, the microwave range, filtering device 500 may be combined with a high frequency dissipative filter, such as a metal powder filter. As discussed previously, the principles governing the operation of typical metal powder filters are described in F. P. Milliken et al., 2007, *Review of Scientific Instruments* 78, 024701 and U.S. patent application Ser. No. 12/016,801.

As previously described, the various embodiments of filtering devices described herein may be enclosed in a cylindrical shield to form a tubular filter structure. In such embodiments, the high frequency dissipation of metal powder filtering may be achieved by potting the cylindrical field with a metal powder/epoxy mixture, thereby immersing the filtering device 500. The metal powder epoxy mix provides a medium for high frequency signals to flow from the wires forming the two signal paths and dissipate, for example via eddy currents. The metal powder/epoxy mixture also helps to thermalize the components of filtering device 500.

Throughout this specification and the appended claims, the term "epoxy" is frequently used to describe an insulating compound; however, those of skill in the art will appreciate that this term is not intended to limit the various embodiments described herein, and embodiments that include epoxy material may alternatively employ resin or another insulating compound in a similar fashion.

In some embodiments, high frequency dissipation may be achieved by enclosing filtering device 500 in an enclosure and potting the enclosure with a metal powder epoxy. In some embodiments, the enclosure may be tubular in geometry. Furthermore, in some embodiments the performance of high frequency dissipation may be improved by cladding the wires that form the two signal paths with, for example, a resistive material such as copper-nickel alloy.

FIG. 8 is a plan view of an embodiment of a tubular filter structure 800. Tubular filter structure 800 includes a substantially cylindrical body 801 that is connected to an input connection adapter 802 and an output connection adapter 803. In some embodiments, either or both of adapters 802 and 803 may take the form of any electrical connector, including but not limited to: SMA connectors, coaxial connectors, or ultra-miniature coaxial connectors, conductive pins, solder connections, and spring contacts. In some embodiments, adapters 802, 803 may each connect directly to a conducting wire, coaxial cable, or ultra-miniature coaxial cable. Typically, a differential signal may be transmitted using two signal paths twisted together in a shielded cable (e.g., a "twisted pair"). Thus, in some embodiments adapters 802 and 803 are designed to interface with twisted pair cable.

In embodiments incorporating many differential signal lines, each with a respective tubular filter structure, the packing density of tubular filter structures 800 may be limited by the diameter (or width) of adapters 802, 803. Thus, tubular filter structure 800 may be advantageous because it may be coupled to small, space-conserving electrical cables or connection adapters.

Though not visible in the Figure, cylindrical body 801 is hollow, having a cavity that contains a filtering device similar to filtering device 500 from FIG. 5. In some embodiments, it is advantageous to ensure that the cavity of cylindrical body 801 has an inner diameter that is approximately equal to the width of the wide regions (i.e., wide regions 521-523) of the filtering device, or at least sized such that the filtering device fits securely therein (e.g., interference fit, shrink fit, or the like). The filtering device 500 is inserted into the cavity of cylindrical body 801 such that an edge of each wide region (i.e., wide regions 521-523) of PCB 510 aligns with a respective hole 810 (only one called out in FIG. 8) in the cylindrical body 801. In some embodiments, each hole 810 may align with the edge of PCB 510 at a position adjacent to a respective capacitor 541-546. The input conductive traces (i.e., 571 and 572) of the filtering device 500 are electrically connected to input connection adapter 802 and the output conductive traces (i.e., 581 and 582) are electrically connected to the output connection adapter 803.

With the filtering device 500 contained in the cylindrical body 801 such that the edges of the wide regions (i.e., wide regions 521-523) align with holes 810, the holes 810 may be sealed with solder. This solder provides electrical connections between the cylindrical body 801 and the respective conductive traces on the "ground" surface (i.e., second surface 400b) and, in some embodiments, on the sides of the PCB 510. This solder also serves to seal the holes 810, such that the cylindrical body 801 and input and output connection adapters 802, 803 form a sealed enclosure about the filtering device 500. This sealed enclosure can advantageously help to shield the filtering device 500 from E&M or EMI noise. In order to enhance this effect, in some embodiments it is advantageous to ensure that tubular filter structure 800 is formed of substantially non-magnetic materials. In some embodiments, copper metal may be used to form cylindrical body 801. In some embodiments, brass may be used to form cylindrical body 801.

Embodiments of electrical filters that are adapted to achieve high frequency dissipation may similarly be enclosed within a cylindrical body 800. In such embodiments, at least a portion of cylindrical body 801 may be filled with a metal powder/epoxy mixture as previously discussed. To this end, once the majority of the holes 810 are filled with solder, one hole 810 at a first end of cylindrical body 801 may be left unsoldered and used as a fill hole for filling the enclosure with the metal powder epoxy. In order to facilitate the filling of cylindrical body 801, one hole at a second end opposite the first end of cylindrical body 801 may be left unsoldered and used as a vent hole while the cylindrical body 801 is filled with metal powder epoxy. For example, metal powder epoxy may be injected by a syringe that is inserted into the fill hole while the vent hole provides a path for air trapped within the cylindrical body 801 to escape as cylindrical body 801 fills with metal powder epoxy. Once the desired volume of metal powder epoxy has been injected into tubular filter structure 800, both the vent hole and the fill hole may be sealed (e.g., with solder).

In embodiments that are adapted to achieve high frequency dissipation, an epoxy mixture comprising an epoxy and a metal powder that is predominately non-superconducting and substantially non-magnetic may be employed. The metal powder may include at least one of copper and brass. In some embodiments, a ratio of the epoxy mixture may be selected from the group consisting of: approximately two to one by weight of metal powder to epoxy, approximately four to one by weight of metal powder to epoxy, and approximately eight to one by weight of metal powder to epoxy.

Figure 9:
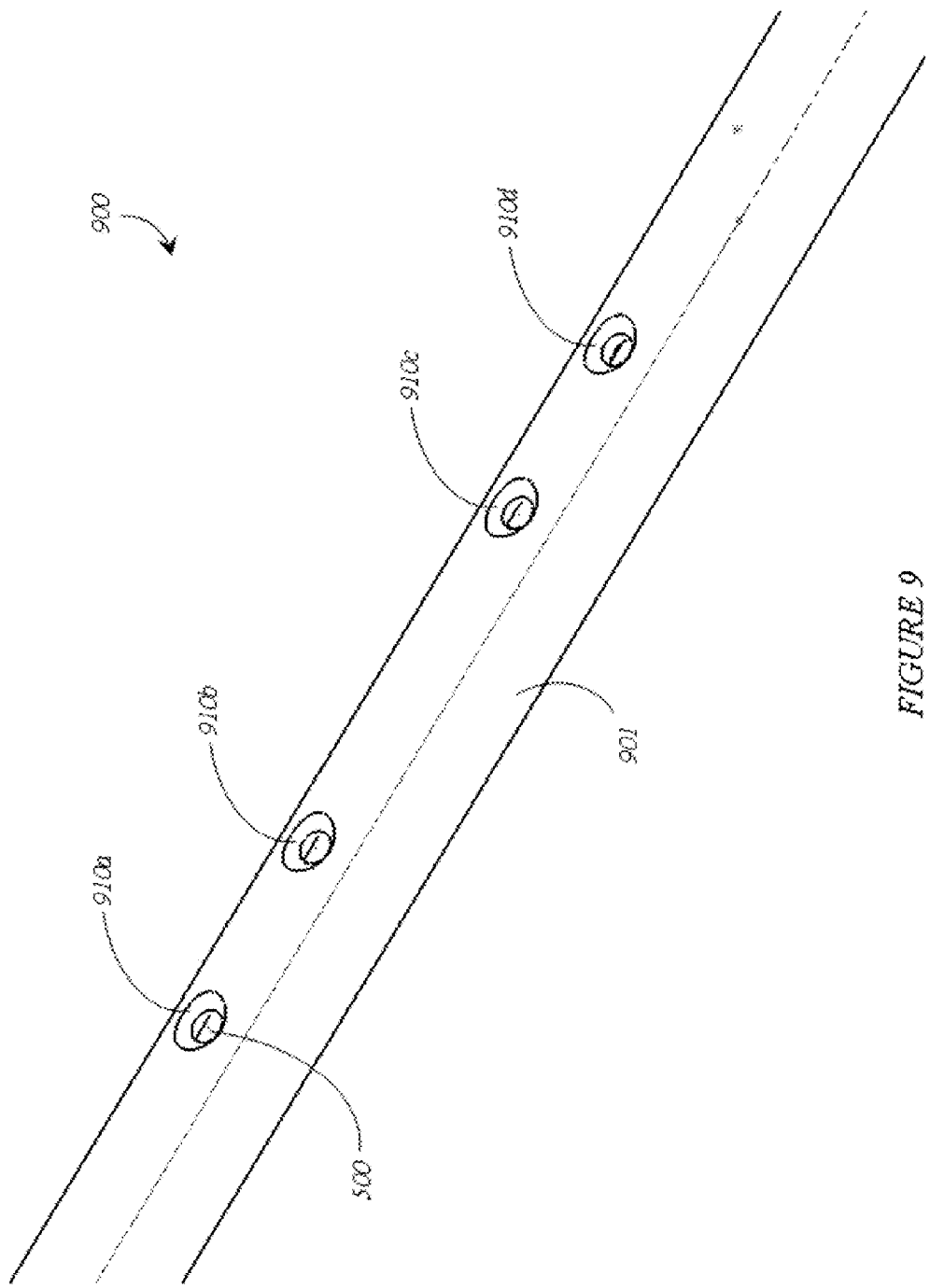
FIG. 9 is an isometric view of a portion of an embodiment of a tubular filter structure, showing the alignment of the filtering device within the cylindrical body.

As previously discussed, when inserted into a cylindrical body (such as cylindrical body 801), a filtering device (such as filtering device 500) may be positioned such that each hole 810 aligns with the edge of a respective wide region (i.e., wide regions 521-523). FIG. 9 is an isometric view of a portion of an embodiment of a tubular filter structure 900, showing the alignment of the filtering device 500 within the cylindrical body 901. Each wide region 521-523 of filtering device 500 may align with a respective hole 910*a*-910*d* (collectively 910) in cylindrical body 901. In some embodiments, each wide region 521-523 of filtering device 500 may align with two respective holes 910 in cylindrical body 901 such that each capacitor 541-546 aligns with a respective hole 910 in cylindrical body 901. For example, in the illustrated embodiment holes 910*a* and 910*b* may align with the edge of PCB 510 adjacent to capacitors 541 and 542, respectively, in wide region 521. Similarly, holes 910*c* and 910*d* may align with the edge of PCB 510 adjacent to capacitors 543 and 544, respectively, in wide region 522. Filtering device 500 may be preferably positioned such that the edge that joins a side of the PCB 510 with the ground surface (i.e., 400*b*) points towards the holes 910.

Figure 10:
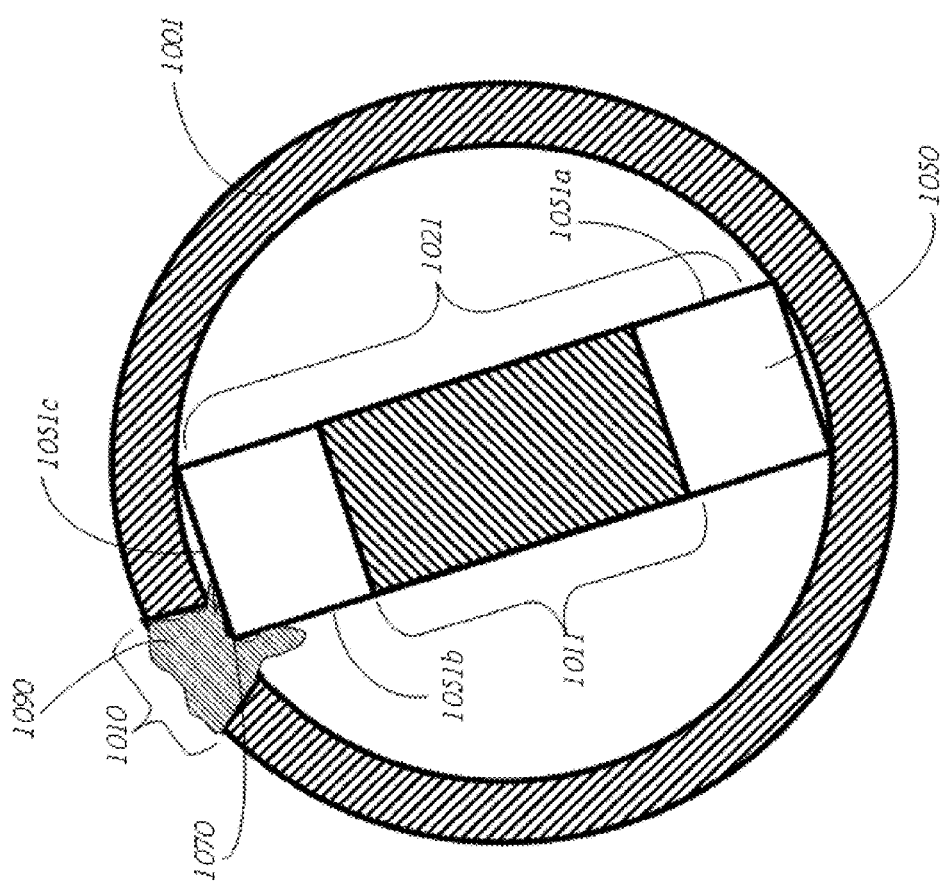
FIG. 10 is a cross-sectional view showing the alignment of a filtering device inside a cylindrical body.

FIG. 10 is a cross-sectional view showing the alignment of a filtering device 1050 inside a cylindrical body 1001. As previously described, in some embodiments it can be advantageous to position filtering device 1050 inside cylindrical body 1001 such that the edge 1070 that joins a side 1051*c* of the PCB with the ground surface 1051*b* points towards the hole 1010. FIG. 10 shows a solder connection 1090 that seals hole 1010 and establishes an electrical connection between the cylindrical body 1001 and the conductive trace that covers a portion of the ground surface 1051*b* of wide region 1021 and, in some embodiments, a portion of the side 1051*c* of the PCB. Note that the signal surface 1051*a* and the narrow region 1011 of the PCB are both electrical isolated from the solder connection 1090 and the cylindrical body 1001.

In order to ensure that the filtering device fits securely inside the cylindrical body, in some embodiments it can be advantageous to vary the widths of the wide regions of the PCB and/or stagger the wide regions such that at least one wide region physically couples to an adjacent narrow region at an off-center position along its width.

Various embodiments described herein incorporate conductive wires and conductive traces in tubular filter structures. In some applications, it may be desirable to use these tubular filter structures to filter superconducting electrical signals. Thus, in some embodiments, the various conductive wires and coiled inductors may be formed of a material that is superconducting below a critical temperature. An example of such a material is niobium, or niobium-titanium with copper cladding, though those of skill in the art will appreciate that other superconducting materials may similarly be used. Furthermore, in some embodiments, the various conductive traces may be formed of a material that is superconducting below a critical temperature. In PCB technology, a typical approach for providing superconducting traces is to first lay out the conductive traces on the surface of the PCB using a non-superconducting metal (e.g., copper) and then to plate the surface of the non-superconducting metal with a superconducting metal (e.g., tin). Again, those of skill in the art will appreciate that materials other than those given as examples herein may similarly be used.

In some embodiments that incorporate superconducting components, it can be advantageous to form superconducting connections at solder joints by implementing superconducting solder. Thus, in some embodiments, the signal paths may be entirely superconducting from input to output in a tubular filter structure. However, in alternative embodiments at least one superconducting signal path may be interrupted by non-superconducting segments.

In embodiments of the present systems, methods and apparatus that incorporate superconducting materials, it can be advantageous to ensure that the tubular body (e.g., cylindrical body 801) of the tubular filter structure is formed by a predominately non-superconducting material. Using a non-superconducting material for the tubular body may improve thermalization of the tubular filter structure.

Throughout this specification and the appended claims, various embodiments and devices are described as being "cylindrical" in geometry. However, those of skill in the art will appreciate that the concepts taught herein may be applied using alternative geometries, such as rectangular prisms, triangular prisms, curved or flexible tubes, etc.

Throughout this specification and the appended claims, the term "non-magnetic" is used to describe a material that is substantially non-ferromagnetic.

Various embodiments described herein provide input/output systems and devices for use with superconducting devices, such as superconducting computing devices. These systems and devices provide filtering, shielding, and thermalization of communication paths that connect between room temperature electronics and the superconducting devices that make up, for example, a superconducting quantum processor. Similar systems and devices are described in U.S. patent application Ser. No. 12/016,801. However, the present systems and devices differ quite substantially from those described in U.S. patent application Ser. No. 12/016,801, because the various embodiments described herein implement tubular filter structures as the primary filtering elements that may each, in some embodiments, incorporate lumped element filtering and metal powder filtering into one device as opposed to the separate lumped elements filter assembly and metal powder filter assembly described in U.S. patent application Ser. No. 12/016,801. Furthermore, the present systems and devices may preferably be adapted for use with differential signals as opposed to the single-ended signals primarily used in U.S. patent application Ser. No. 12/016,801.

Figure 11:
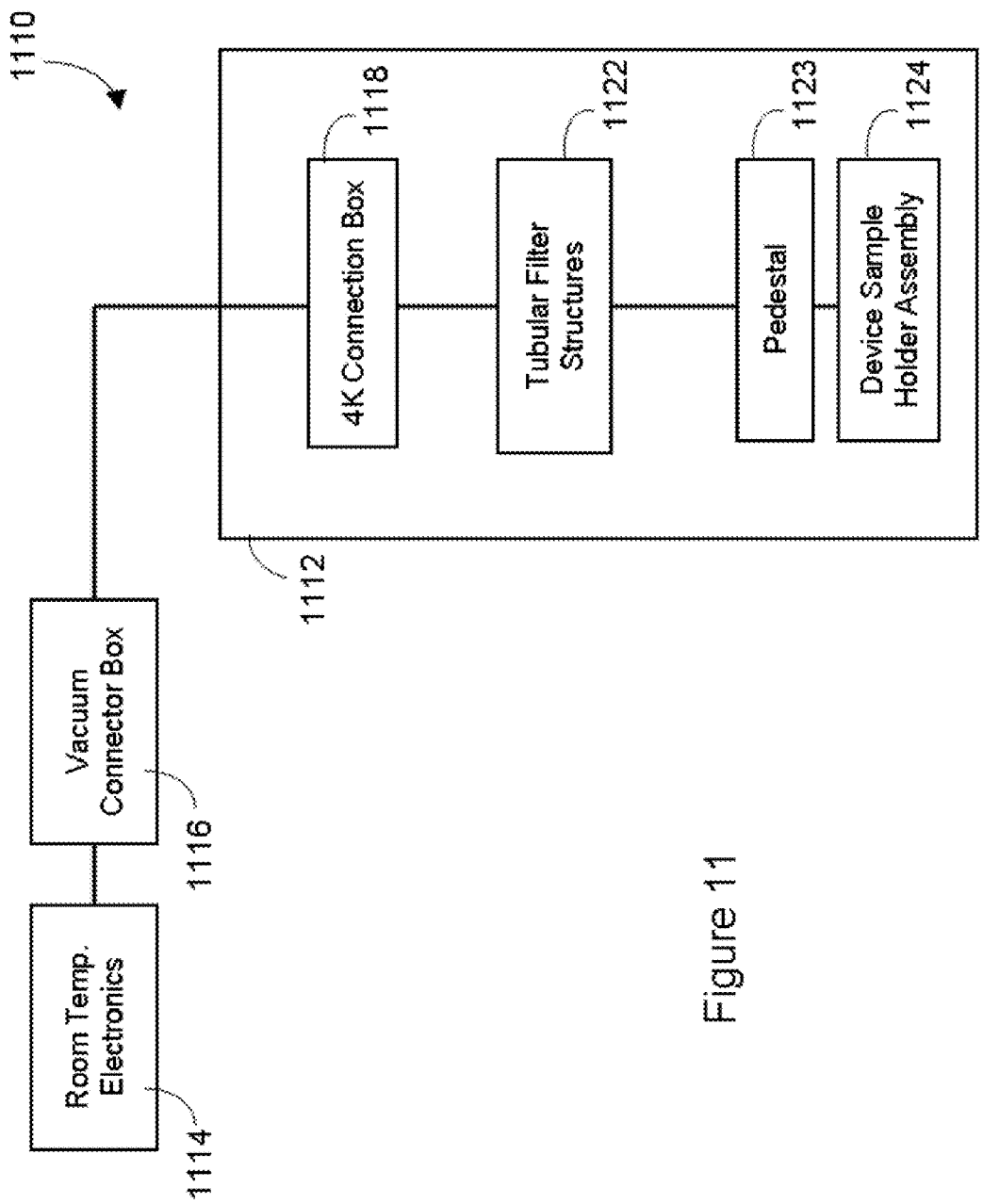
FIG. 11 is a schematic diagram showing an input/output (I/O) system for use with a superconducting device in a refrigerated environment according to one illustrative embodiment, including a set of room temperature electronics, vacuum connector box, 4K connection box, tubular filter structures, pedestal, and device sample holder assembly, where wiring passes between the various components and connectors of the system and thermalizing clamps may be included between various stages.

FIG. 11 shows an input/output (I/O) system 1110 for use with a processor in a refrigerated environment 1112 according to one illustrative embodiment.

The I/O system 1110 may interface with a set of room temperature electronics 1114, and may include a vacuum connector box 1116, and within the refrigerated environment 1112 may include an optional 4K connection box 1118, tubular filter structures 1122, pedestal 1123 and device sample or chip holder assembly 1124, each of which is discussed in more detail below. Superconducting paths are provided within the refrigerated environment 1112 to prevent heat creation, which may otherwise adversely affect performance by raising the temperature of the refrigerated environments and/or portions of the I/O system.

The refrigerated environment 1112 may provide milliKelvin temperatures to operate various superconducting components, for example the device sample (e.g., superconducting processor or superconducting quantum processor). The refrigerated environment 1112 may, for example, take the form of a dilution refrigerator, such as the Leiden Cryogenics B.V. MNK 126 series (Galgewater No. 21, 2311 VZ Leiden, The Netherlands). In some embodiments, the refrigerated environment 1112 may, for example, include a pulse-tube refrigerator and/or a pulse-tube dilution refrigerator such as the Leiden Cryogenics B.V. MNK-CF 450 series. In some embodiments all or part of the I/O system 1110 may be housed in the refrigerated environment 1112.

The room temperature electronics 1114 may include conventional I/O electronics that are not maintained at superconducting temperatures. Such electronics 1114 are not pertinent to the present disclosure so are not discussed further. Signals may be transferred from the room temperature electronics 1114 to the vacuum connector box 1116 using, for example, conductive traces carried by flexible printed circuit boards.

The vacuum connector box 1116 may provide an interface between the room temperature electronics 1114 and the portion of the I/O system 1110 that is in the evacuated refrigerated environment 1112. The vacuum connector box 1116 may provide a hermetically sealed interface between the refrigerated environment 1112 and the non-refrigerated environment, while providing electrically conductive signal paths therebetween. The vacuum connector box 1116 may include one or more circuit boards, with protecting resistors and flexible coaxial cable.

The optional 4K connection box 1118 is where transition may occur between non-superconducting materials and superconducting materials. For example, the 4K connection box 1118 may be where the transition occurs between non-superconducting coaxial (or shielded twisted-pair, for differential signals) cable and superconducting coaxial (or shielded twisted-pair) cable. For example, a shielded twisted pair cable may comprise a twisted pair of copper cladded or copper-nickel cladded niobium cables shielded by a copper braid or copper-nickel braid. In some embodiments, the signal lines that input into the 4K connector box 1118 may be formed by conductive traces carried by flexible printed circuit boards. While designated as 4K, the 4K connection box does not have to be at 4K; however, the transition from non-superconducting materials to superconducting materials should occur at a temperature that is below the critical temperature of the superconducting materials. For example, in some embodiments, the 4K connection box 1118 may be at approximately 1.2-1.4K. The 4K connection box 1118 should provide good thermal transfer (i.e., thermalizing) and should have a small volume so as to fit in the refrigerated environment 1112. In some embodiments, a noise filter may be mounted in the connection between the two sets of wires.

The tubular filter structures 1122 form the primary filtering stage of the I/O system 1110. The tubular filter structures may provide low-pass filtering by incorporating lumped element filtering (i.e., using inductors and capacitors) and, in some embodiments, high frequency dissipation by incorporating metal powder filtering. The tubular filter structures may, in some embodiments, filter noise from approximately 1 MHz, 3 MHz, or 5 MHz to approximately optical frequencies, ensuring that only signals of interest are transferred. In some embodiments, at least some of the tubular filter structures used may include the single-ended tubular filter structures described in US Patent Publication No. 2008-0176751. In some embodiments, at least some the tubular structures used may include the differential tubular filter structures described herein.

The pedestal 1123 provides a mounting platform for the device sample holder assembly 1124. The device sample holder assembly 1124 carries the device sample, which may take the form of a superconducting processor, for example a superconducting quantum processor. The device sample holder assembly 1124 may provide thermal conductivity and electrically superconductive signal paths to the device sample, as well as a stable magnetic environment. The device sample holder assembly 1124 may be selectively mounted and dismounted from the pedestal 1123 to provide easy and reliable loading and unloading of the device sample from the refrigerated environment 1112. The pedestal 1123 and device sample holder assembly 1124 should provide good thermal conductivity and superconducting signal paths from the I/O system 1110 to the device sample.

It is noted that at least some metal surfaces may be clamped to provide good thermal conductivity and to prevent noise from passing by the various filters. Furthermore, at least some metal surfaces may be lapped and polished to improve thermal contact between surfaces.

Figure 12A:
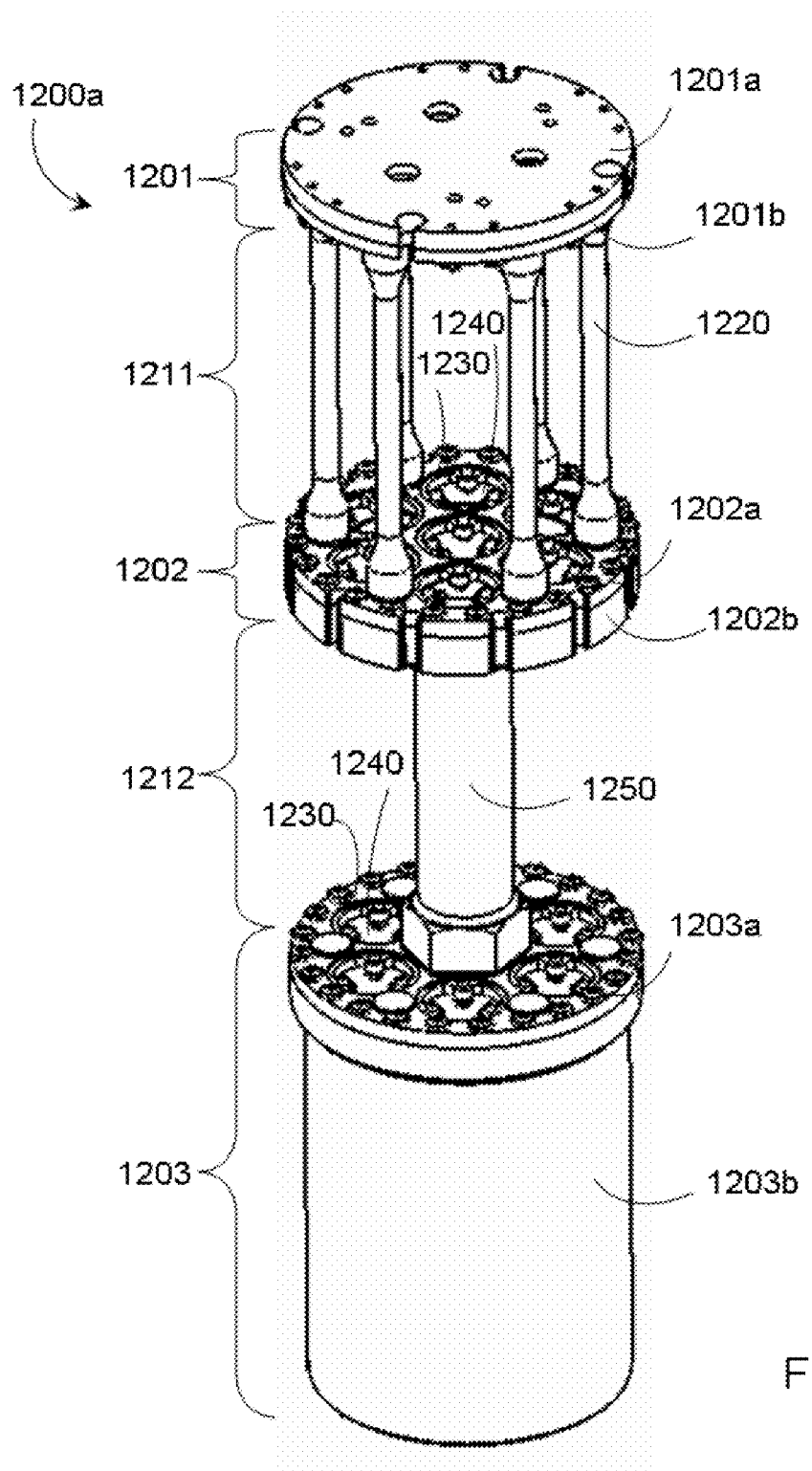
FIG. 12A is an isometric view of an embodiment of a portion of a support structure for an I/O system.

In some embodiments, the tubular filter structures 1122, the pedestal 1123 and the device sample holder assembly 1124 may all be integrated in one I/O support structure. FIG. 12A is an isometric view of an embodiment of a portion of such an I/O support structure 1200a. The portion of I/O support structure 1200a illustrated in FIG. 12A includes three composite plate structures 1201-1203 aligned along a common axis to define a first tier 1211 in between top composite plate structure 1201 and middle composite plate structure 1202, and a second tier 1212 in between middle composite plate structure 1202 and bottom composite plate structure 1203. In some embodiments, each of composite plate structures 1201-1203 may comprise thermally conductive material, for example non-superconducting metal such as copper or brass. Top composite plate structure 1201 may comprise a mounting plate 1201a for mounting to a refrigeration system, and a mating plate 1201b. In some applications, mounting plate 1201a may be mounted to a cold surface in a refrigeration system (e.g., the mixing chamber of a dilution refrigerator) and mating plate 1201b may be selectively mated to mounting plate 1201a. Mounting plate 1201a may serve as an adapter for mounting the rest of I/O support structure 1200a to a refrigeration system. In this way, I/O support structure 1200a (except for mounting plate 1201a) may be detached from the refrigeration system (e.g., for servicing) as one structural unit while leaving mounting plate 1201a attached to the refrigeration system to facilitate re-attachment of I/O support structure 1200a to the refrigeration system and reduce disruption of the refrigeration system itself.

First tier 1211 is defined by the volume in between top composite plate structure 1201 and middle composite plate structure 1202. In the illustrated embodiment, top composite plate structure 1201 and middle composite plate structure 1202 are mechanically connected by a plurality of pillars 1220 (only one called out in the Figure). Each of pillars 1220 may comprise a thermally conductive material, for example non-superconducting metal such as copper or brass. The pillars 1220 may be solid to enhance thermal conductivity. In the illustrated embodiment, six pillars 1220 are used, each having a first end connected (e.g., by threaded screw(s) or bolt(s)) to mating plate 1201b of top composite plate structure 1201 and at a second end connected (e.g., by threaded screw(s) or bolt(s)) to the top plate 1202a of middle composite plate structure 1202. The six pillars 1220 in first tier 1211 are arranged in a hexagonal pattern, though those of skill in the art will appreciate that a different number of pillars 1220 and a different arrangement of pillars 1220 may similarly be used. Pillars 1220 provide structural support in first tier 1211 of I/O support structure 1200a, while also providing thermalizing paths between top composite plate structure 1201 and middle composite plate structure 1202.

Middle composite plate structure 1202 may comprise two plates, a top plate 1202a and a bottom plate 1202b, which mate together to form a cavity (not visible in FIG. 12A) in the inner volume of middle composite plate structure 1202. Top plate 1202a may include a plurality of recesses 1230 (only one called out in the Figure) each of which includes a through-hole 1240 (only one called out in the Figure) providing access from the volume of first tier 1211 to the cavity in the inner volume of middle composite plate structure 1202. The plurality of recesses 1230 in top plate 1202a may each be used to mount a respective bundle of tubular filter structures (not shown in FIG. 12A).

The bottom plate 1202b of middle composite plate structure 1202 may connect (e.g., by threaded screw(s) or bolt(s)) to a hollow conduit 1250 which spans the length of second tier 1212 and connects (e.g., by threaded screw(s) or bolt(s)) to the top plate 1203a of bottom composite plate structure 1203. Hollow conduit 1250 may comprise thermally conductive material, for example non-superconducting metal such as copper or brass. In the illustrated embodiment, a first end of hollow conduit 1250 connects to the center of the bottom plate 1202b of middle composite plate structure 1202 and a second end of hollow conduit 1250 connects to the center of the top plate 1203a of bottom composite plate structure 1203; however, those of skill in the art will appreciate that a different number and/or a different alignment of hollow channel(s) 1250 may similarly be used. Similar to pillars 1220, hollow conduit 1250 provides structural support in second tier 1212 of I/O support structure 1200a, while also providing thermalizing paths between middle composite plate structure 1202 and bottom composite plate structure 1203. However, hollow conduit 1250 also provides an internal conduit through which conductive wires may be fed.

Bottom composite plate structure 1203 may comprise two components, a top plate 1203a that may be substantially similar to the top plate 1202a of middle composite plate structure 1202, and a hollow tube 1203b that has one open end. The open end of hollow tube 1203b mates with top plate 1203a to form a shielded enclosure therebetween, and top plate 1203a may include a plurality of recesses 1230, each of which includes a through-hole 1240 providing access from the volume of second tier 1212 to the shielded enclosure. The plurality of recesses 1230 in top plate 1203a may each be used to mount a respective bundle of tubular filter structures (not shown in FIG. 12A). The hollow tube 1203b may be cylindrical, which may provide one or more distinct advantages over other shapes.

Figure 12B:
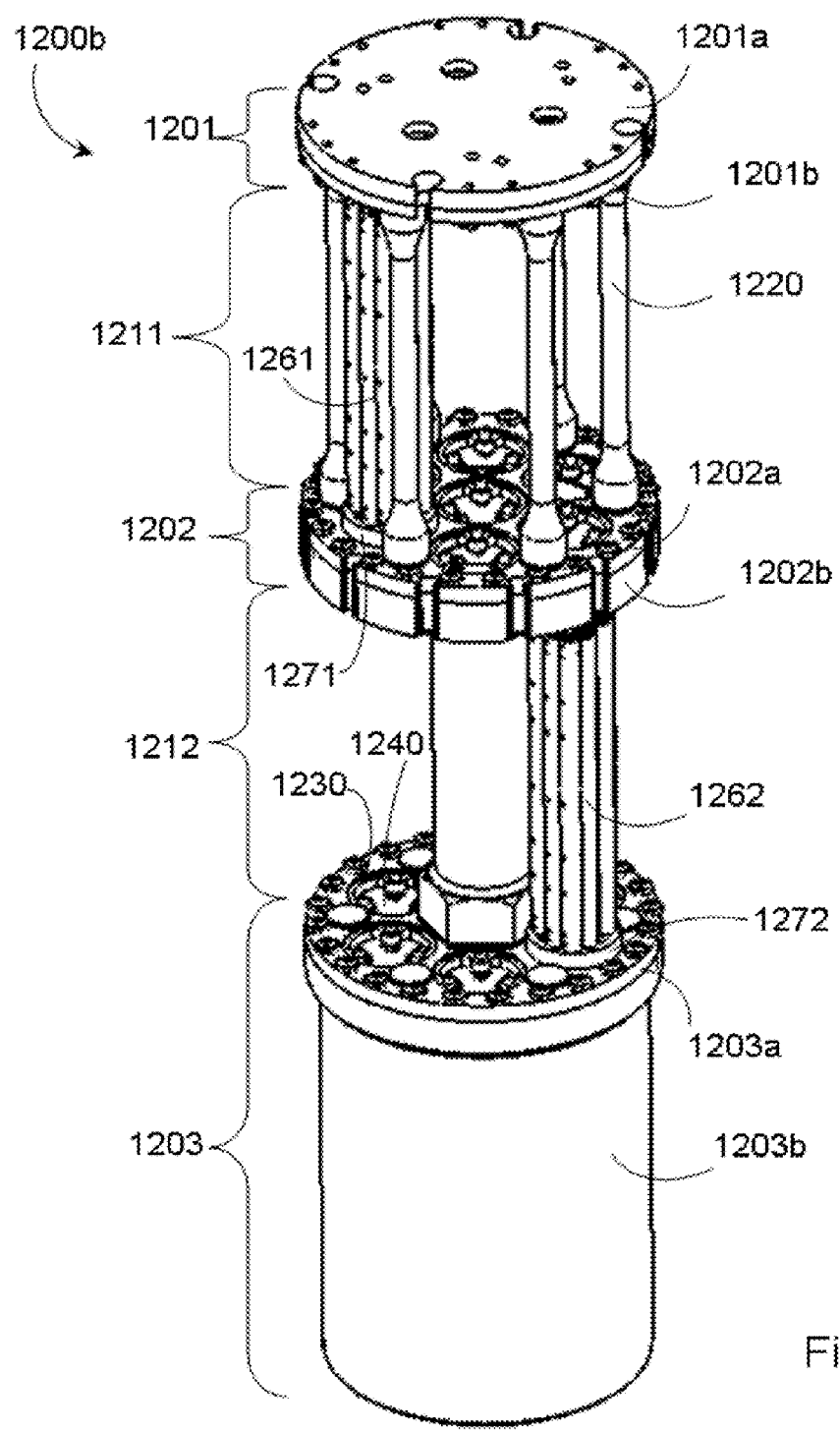
FIG. 12B is an isometric view of an embodiment of the portion of the I/O support structure from FIG. 12A, including a first bundle of tubular filter structures mounted in a first tier and a second bundle of tubular filter structures mounted in a second tier.

As previously described, tubular filter structures 1122 may be mounted in bundles in both the first tier 1211 and the second tier 1212 of I/O support structure 1200a. For the purposes of this specification, a bundle of tubular filter structures (a "bundle") comprises a plurality of individual tubular filter structures. FIG. 12B is an isometric view of a portion of an embodiment of an I/O support structure 1200b, including a first bundle 1261 mounted in first tier 1211 and a second bundle 1262 mounted in second tier 1212. As illustrated, each bundle 1261, 1262 includes a respective mounting puck 1271, 1272 (respectively) to which a plurality (e.g., sixteen) individual tubular filter structures are mounted. Mounting puck 1271 is fitted into a recess 1230 (not called out in Figure) in top plate 1202a of middle composite plate structure 1202 and mounting puck 1272 is fitted into a recess 1230 (only one called out in Figure) in top plate 1203a of bottom composite plate structure 1203. The purpose of FIG. 12B is to show the positioning of a single bundle (e.g., 1261 and 1262, respectively) into each of the first and second tiers 1211, 1212 of I/O support structure 1200b. In practice, however, multiple bundles may be mounted in each tier.

Figure 12C:
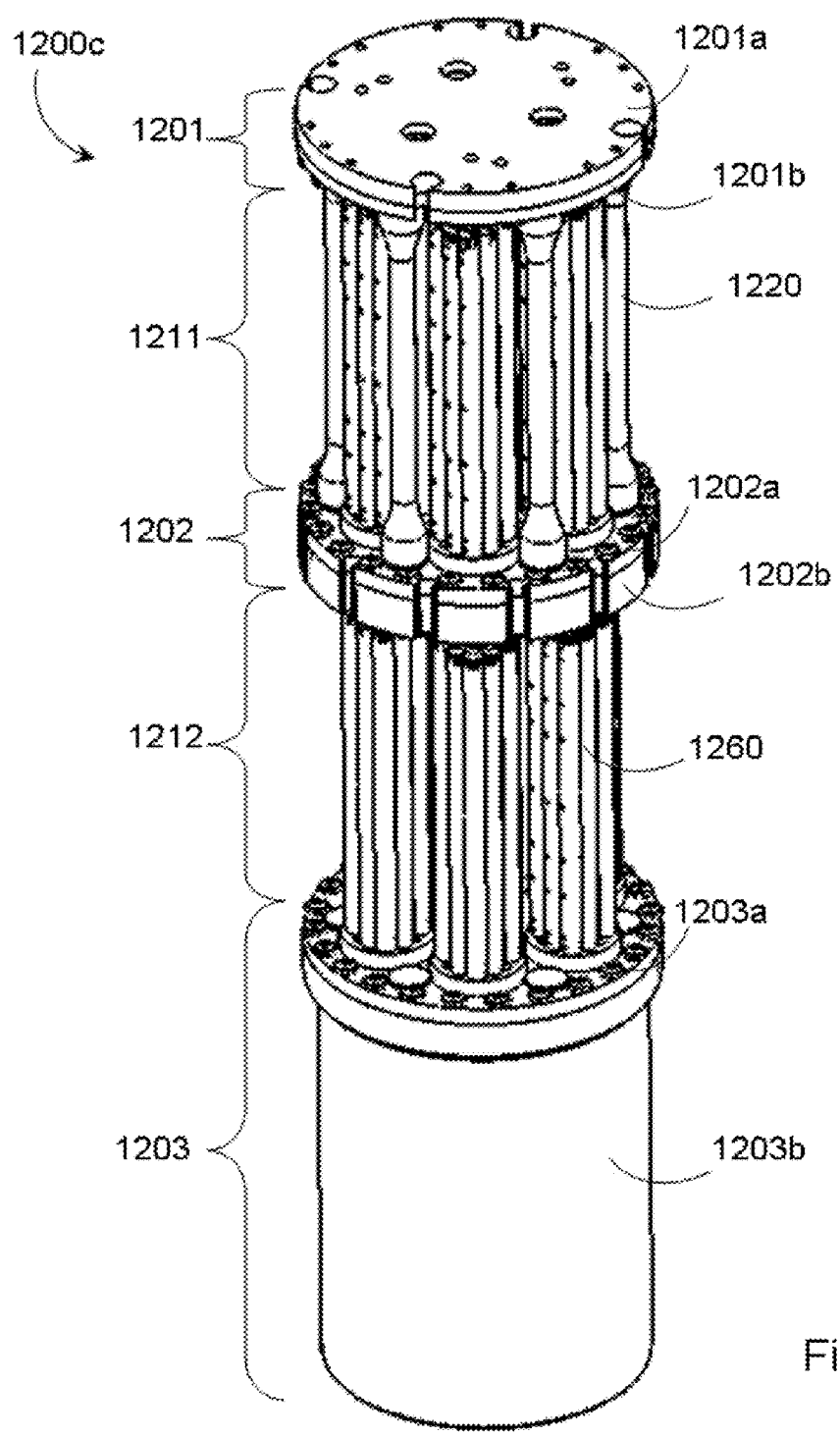
FIG. 12C is an isometric view of an embodiment a portion of the I/O support structure from FIG. 12A, where both the first tier and the second tier include multiple bundles of tubular filter structures.

FIG. 12C is an isometric view of a portion of an embodiment of an I/O support structure 1200c, where both the first tier 1211 and the second tier 1212 include multiple bundles of tubular filter structures. As illustrated, seven bundles 1260 (only one called out in the Figure) are mounted in the first tier 1211 and six bundles 1260 are mounted in the second tier 1212.

I/O support structures 1200a-1200c are each designed for use within a refrigerated environment, where the available internal volume is limited. Most refrigeration systems (e.g., dilution refrigerators and pulse-tube dilution refrigerators) are at least partially cylindrical in geometry, thus I/O support structures 1200a-1200c may be substantially cylindrical in order to fit within such refrigeration systems. Furthermore, I/O support structures 1200a-1200c each include two tiers 1211, 1212 in order to fit many bundles of tubular filter structures within the limited diameter of available cylindrical volume in typical refrigeration systems. When additional volume is desired inside a refrigeration system, it can generally be more practical to increase the length of the available cylindrical volume rather than increasing the diameter of the available cylindrical volume. Thus, the multi-tiered design of I/O support structures 1200a-1200c is adapted to fit a large number of bundles of tubular filter structures within a fixed diameter of available volume inside a refrigeration system. Furthermore, a long cylinder with a small diameter can be better suited for magnetic shielding purposes than a cylinder of comparable volume that is short with a wide diameter. Those of skill in the art, however, will appreciate that I/O support structures 1200a-1200c may be simplified as single-tiered designs (e.g., by removing second tier 1212 and middle composite plate structure 1202) or otherwise adapted to suit other geometries (e.g., rectangular geometries, hexagonal geometries, octagonal geometries, etc.). For example, some refrigeration systems may accommodate a wider diameter, and in such cases a single-tiered I/O support structure may be sufficient to provide the desired number of bundles.

In some embodiments, at least one tier may be positioned on either side of the shielded enclosure provided, for example, by bottom composite plate structure 1203. For example, some embodiments may adopt a "dog-bone" arrangement in which a first tier and a second tier are respectively positioned on either side of a shielded enclosure, such as that provided by bottom composite plate structure 1203. In such embodiments, both the first tier and the second tier may be substantially similar to first tier 1211 from I/O support structures 1200a-1200c.

The size and geometry of each of I/O support structures 1200a-1200c is influenced by the number of bundles 1260 that are desired in the system. The number of bundles that is desired in the system is influenced by the number of signal lines in the I/O system for which electrical filtering is desired. For example, first tier 1211 of I/O support structure 1200c includes seven bundles 1260, where each respective bundle includes sixteen individual tubular filter structures. Thus, first tier 1211 of I/O support structure is designed to filter one hundred twelve electrical signals. In some embodiments, each individual tubular filter structure may include a single ended-tubular filter structure such as described in US Patent Publication No. 2008-0176751 and, in such embodiments, each of the one hundred twelve electrical signals may be a respective single-ended signal carried by a respective single signal line, resulting in a total of one hundred twelve signal lines. In other embodiments, each individual tubular filter structure may include a differential tubular filter structure such as those described herein. In such embodiments, each of the one hundred twelve electrical signals may be a respective differential signal carried by a respective pair of signal lines, resulting in a total of two hundred twenty four signal lines (though signal lines may be carried in pairs in the form of shielded twisted pair cables). Some embodiments may incorporate both single-ended and differential signals and, therefore, single-ended and differential tubular filter structures within the same system.

In applications where more signal lines are required, it may be advantageous to provide multiple tiers in the I/O support structure. For example, I/O support structures 1200a-1200c each include a second tier 1212 with an additional six bundles 1260 (one less than first tier 1211 due to hollow conduit 1250), providing an additional ninety six filtering devices. In some embodiments, additional tiers (e.g., a third tier, a fourth tier, etc.) may similarly be added.

Figure 13:
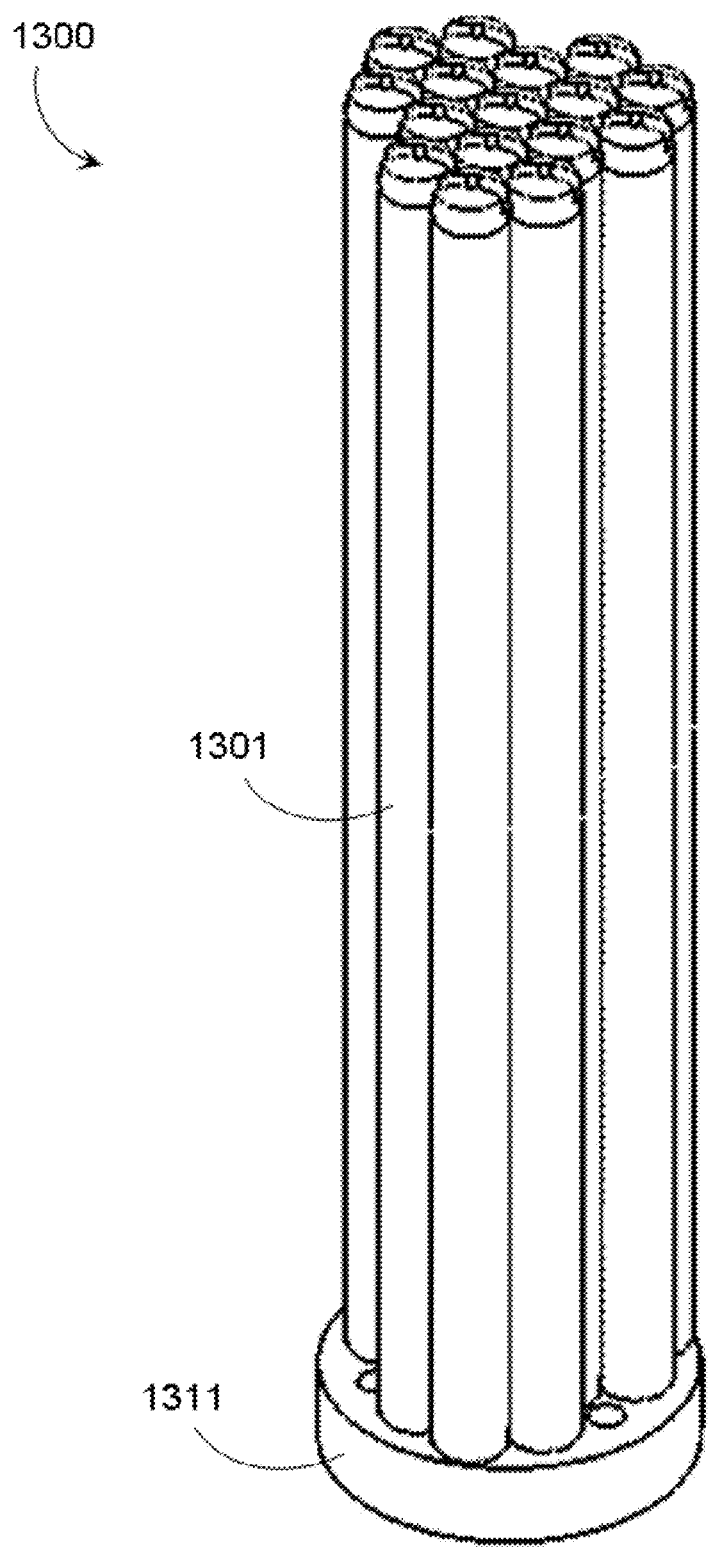
FIG. 13 is an isometric view of an embodiment of a bundle of individual tubular filter structures.

In various embodiments described herein, individual tubular filter structures (e.g., tubular filter structure 800 from FIG. 8) are described as being grouped into "bundles." FIG. 13 is an isometric view of an embodiment of a bundle 1300 of individual tubular filter structures 1301 (only one called out in the Figure). Each individual tubular filter structure 1301 is mounted to mounting puck 1311. In some embodiments, mounting puck 1311 includes a plurality of threaded holes and each individual tubular filter structure 1301 has a threaded end such that each individual tubular filter structure may be screwed directly into a respective hole in mounting puck 1311. As illustrated, bundle 1300 includes a plurality (e.g., sixteen) of individual tubular filter structures 1301, though those of skill in the art will appreciate that a bundle may similarly include any number of individual tubular filter structures 1301.

Figure 14B:
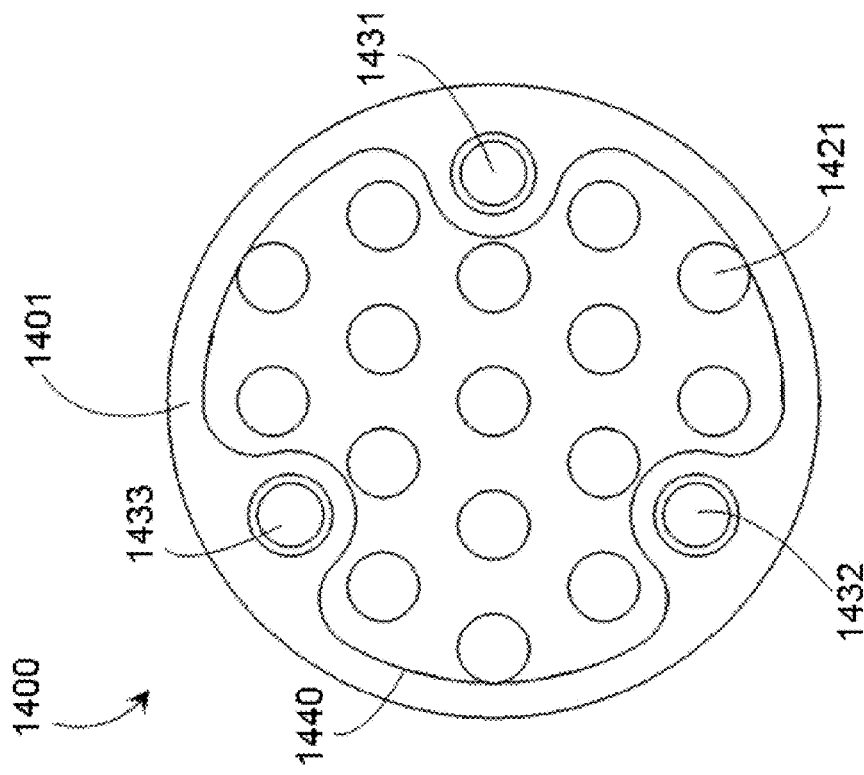
FIG. 14B shows a bottom plan view of an embodiment of a mounting puck for use in mounting a bundle of tubular filter structures.
Figure 14A:
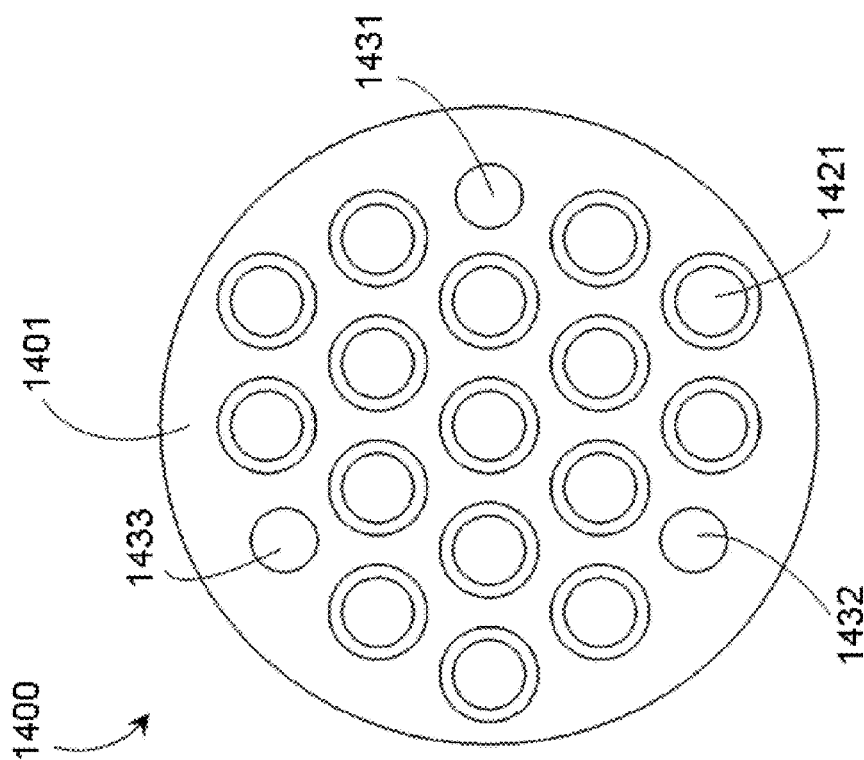
FIG. 14A shows a top plan view of an embodiment of a mounting puck for use in mounting a bundle of tubular filter structures.

FIG. 14A shows a top plan view of an embodiment of a mounting puck 1400 for use in mounting a bundle of tubular filter structures. Mounting puck 1400 comprises a solid disc 1401 of thermally conductive material, for example non-superconducting metal such as copper or brass. The solid disc 1401 of mounting puck 1400 includes sixteen filter holes 1421 (only one called out in the Figure) and three mounting holes 1431-1433. Each of filter holes 1421 may receive a respective tubular filter structure to define a bundle, such as bundle 1300 illustrated in FIG. 13. In some embodiments, each of filter holes 1421 may be threaded so that one end of a respective tubular filter structure may be screwed therein. With all the desired (e.g., sixteen) tubular filter structures mounted in mounting puck 1400 to form a bundle 1300, mounting puck 1400 may itself be mounted into one of the recesses 1230 (FIG. 12A) in either top plate 1202a of middle composite plate structure 1202 or top plate 1203a of bottom composite plate structure 1203. Each of mounting holes 1431-1433 may align with a respective receiving hole in a recess 1230. Those of skill in the art will appreciate that embodiments of mounting puck 1400 may be adapted to accommodate any number of tubular filter structures and to fit into any geometry of recess 1230.

FIG. 14B shows a bottom plan view of an embodiment of mounting puck 1400 for use in mounting a bundle of tubular filter structures. As illustrated, the bottom surface of mounting puck 1400 includes a recess 1440 that matches the through-hole 1240 (FIGS. 12A and 12B) in each recess 1230 of I/O support structures 1200a and 1200b. In some embodiments, each tubular filter structure that is mounted in a respective filter hole 1421 of mounting puck 1400 may include at least one output wire that extends through the filter hole 1421 and out through recess 1440 of mounting puck 1400. In some embodiments, recess 1440 may have a different geometry than illustrated. In some embodiments, recess 1440 may be omitted.

Figure 15:
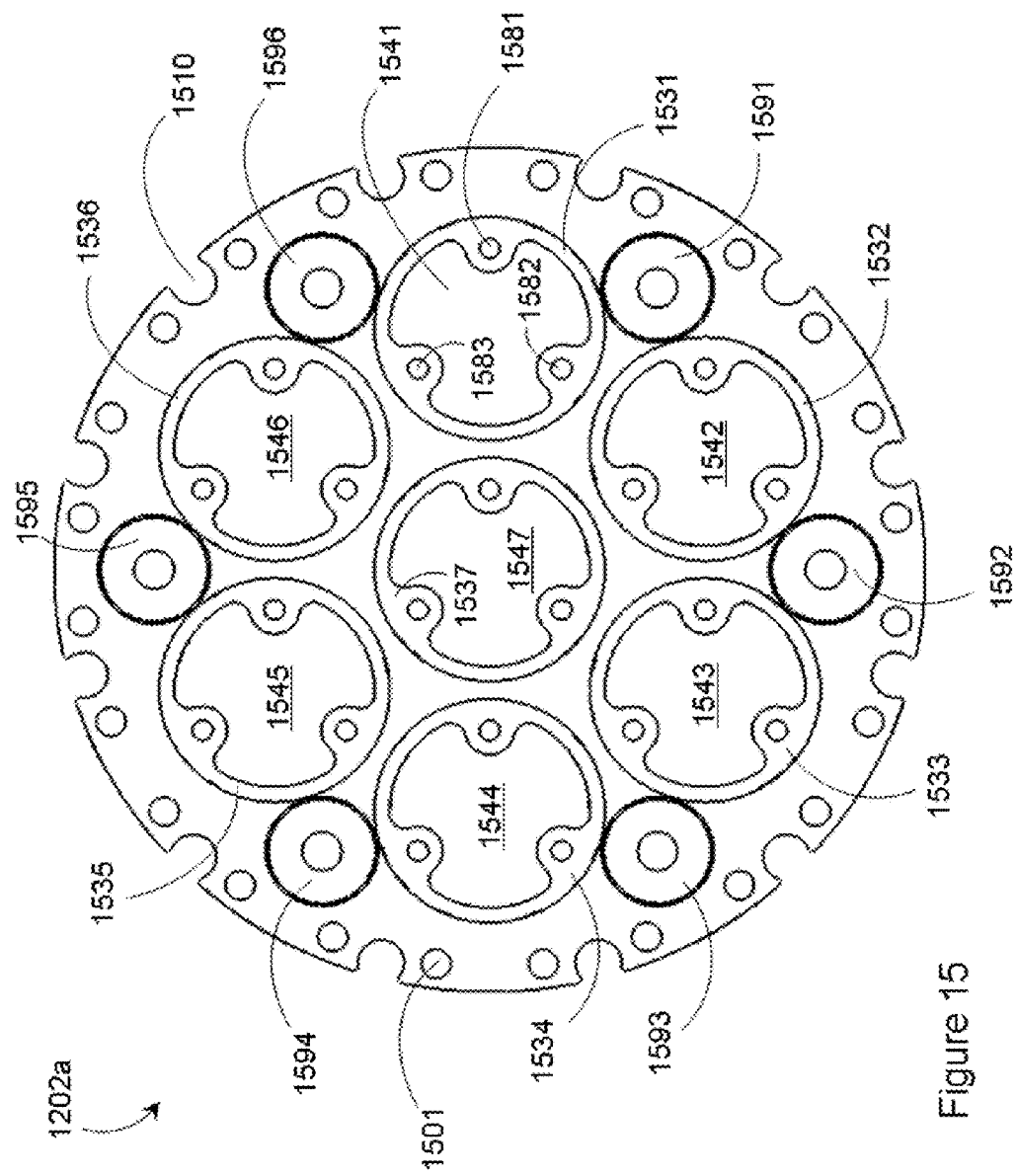
FIG. 15 is a top plan view of an embodiment of a top plate of a middle composite plate structure from FIGS. 12A-12C.

As previously described, mounting puck 1400 may be fitted into a recess 1230 in either top plate 1202a of middle composite plate structure 1202 or top plate 1203a of bottom composite plate structure 1203. FIG. 15 is a top plan view of an embodiment of top plate 1202a of middle composite plate structure 1202 from FIGS. 12A-12C. Top plate 1202a includes seven recesses 1531-1537, each with a respective through-hole 1541-1547 and three respective receiving holes 1581-1583 (only called out for recess 1531). A respective mounting puck, such as mounting puck 1400, may be fitted into each recess 1531-1537 so that the mounting holes 1431-1433 each align with a respective receiving hole 1581-1583. Each mounting puck 1400 may then be held in place by screws or bolts received through mounting holes 1431-1433 into receiving holes 1581-1583, which also serves to improve thermalization between the components. Top plate 1202a also includes six pillar recesses 1591-1596 for mounting pillars 1220 in first tier 1211, a plurality of through-holes 1501 (only one called out in the Figure) for receiving screws and/or bolts to mate top plate 1202a with bottom plate 1202b to form middle composite plate structure 1202, and a plurality of grooves 1510 (only one called out in the Figure) in its outer edge.

Figure 16:
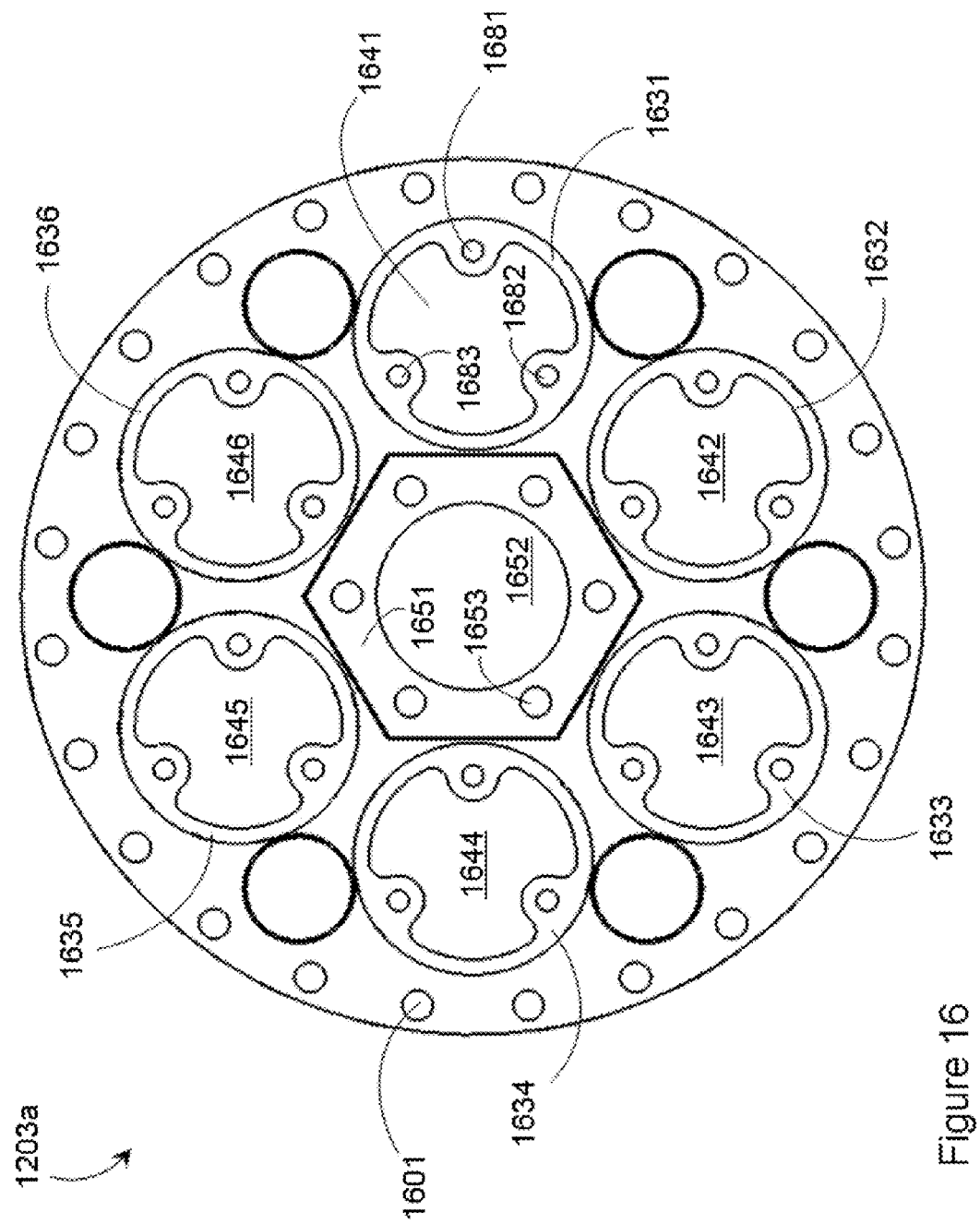
FIG. 16 is a top plan view of an embodiment of a top plate of a bottom composite plate structure from FIGS. 12A-12C.

In applications that require a large number of signal lines, it can be advantageous to use a multi-tiered I/O support structure such as I/O support structures 1200a-1200c. For example, I/O support structures 1200a-1200c each include a second tier 1212 that ends with top plate 1203a of bottom composite plate structure 1203. FIG. 16 is a top plan view of an embodiment of top plate 1203a of bottom composite plate structure 1203 from FIGS. 12A-12C. Top plate 1203a includes six recesses 1631-1636, each with a respective through-hole 1641-1646 and three respective receiving holes 1681-1683 (only called out for recess 1631). A respective mounting puck, such as mounting puck 1400, may be fitted into each recess 1631-1636 so that the mounting holes 1431-1433 each align with a respective receiving hole 1681-1683. Each mounting puck 1400 may then be held in place by screws or bolts received through mounting holes 1431-1433 into receiving holes 1681-1683, which also serves to improve thermalization between the components. Top plate 1203a also includes a central recess 1651 with a through-hole 1652. Recess 1651 may receive one end of hollow conduit 1250 from FIGS. 12A-12C and includes mounting holes 1653 (only one called out in the Figure) for securing screws and/or bolts to hollow conduit 1250. Top plate 1203a also includes a plurality of through-holes 1601 (only one called out in the Figure) for receiving screws and/or bolts to mate top plate 1203a with hollow tube 1203b to form bottom composite plate structure 1203.

Figure 17A:
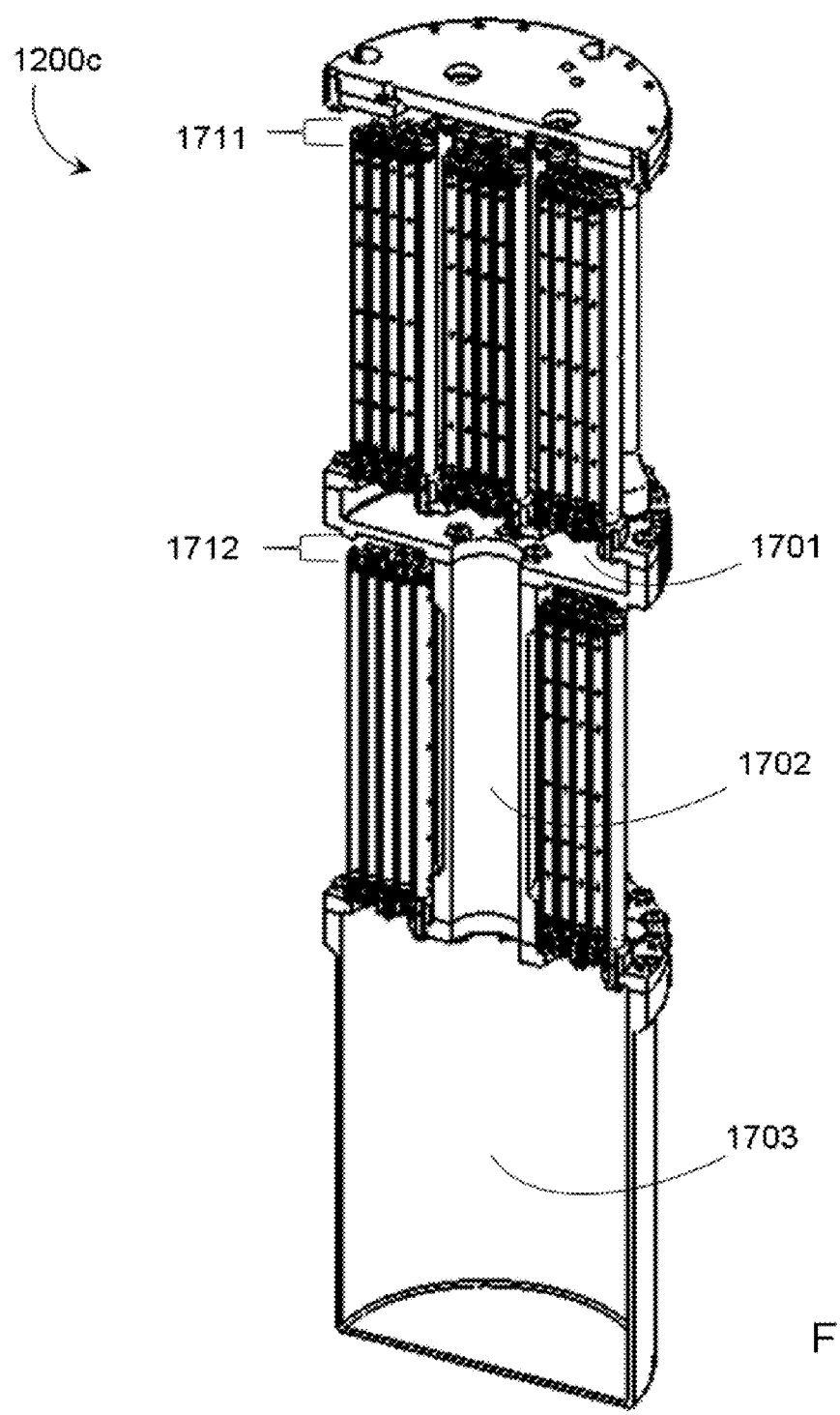
FIG. 17A is a cross-sectional view of the I/O support structure from FIG. 12C.

The various embodiments of I/O support structures described herein provide thermalizing structural support for tubular filter structures and the signal lines (e.g., wires) connected thereto/therefrom. FIG. 17A is a cross-sectional view of I/O support structure 1200c from FIG. 12C. The cross-sectional view of FIG. 17A allows a cavity 1701 in the inner volume of middle composite plate structure 1202, a channel 1702 inside hollow conduit 1250, and a shielded enclosure

1703 inside bottom composite plate structure 1203 all to be visible. Furthermore, FIG. 17A shows a gap 1711 in between bundles 1261 in the first tier 1211 and bottom plate 1201*b* of top composite plate structure 1201, and a similar gap 1712 in between bundles 1262 in the second tier 1212 and bottom plate 1202*b* of middle composite plate structure 1202. The cavity 1701, channel 1702, shielded enclosure 1703, and gaps 1711, 1712 are all included to provide spaces for signal lines (e.g., wires) within I/O support structure 1200*c*.

Figure 17B:
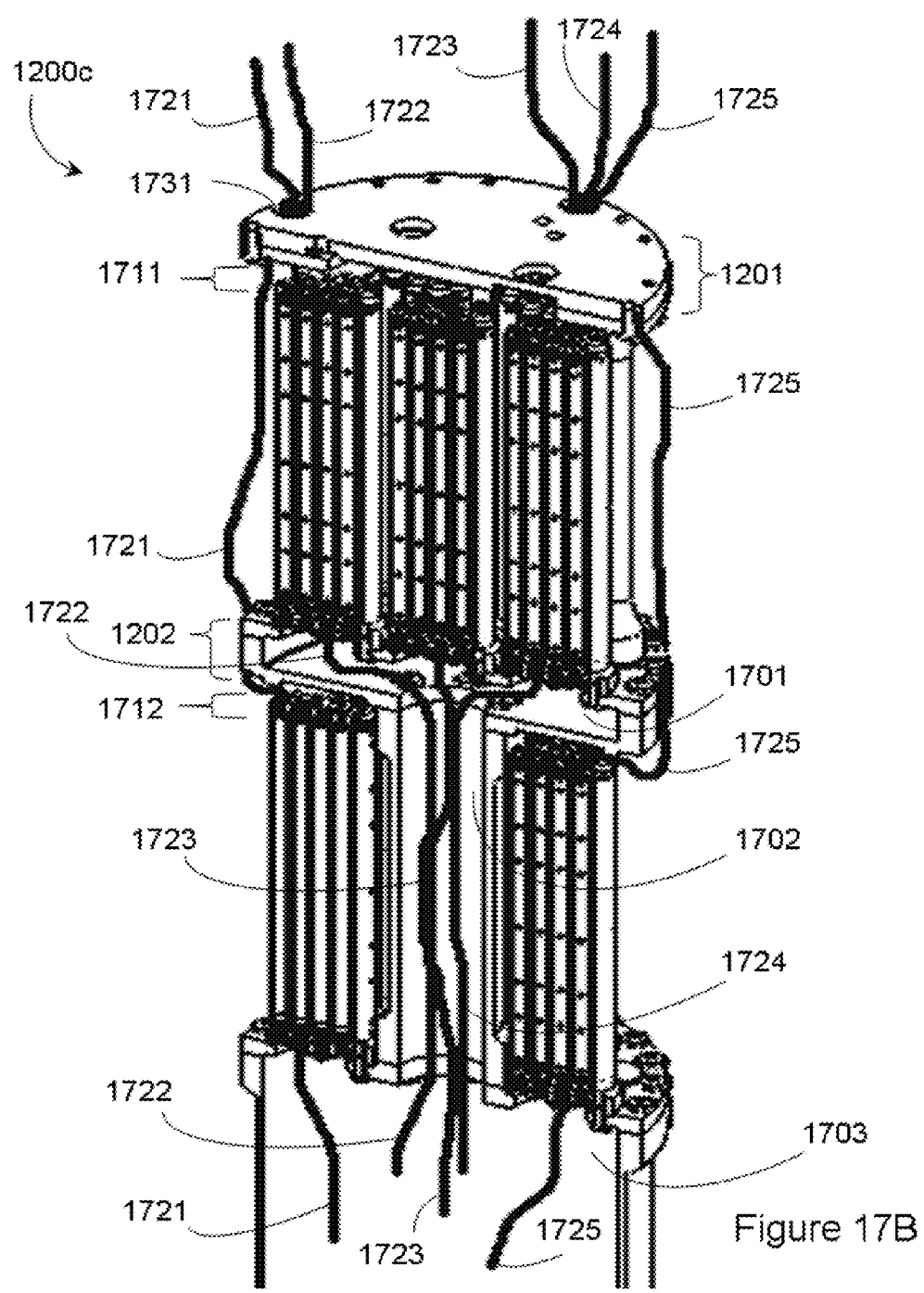
FIG. 17B is a cross-sectional view of the I/O support structure from FIG. 12C, showing exemplary signal lines.

FIG. 17B is a cross-sectional view of I/O support structure 1200*c* showing exemplary signal lines 1721-1725. In some embodiments, each of signal lines 1721-1725 may be formed by coaxial cable. In embodiments that employ differential signals, each of signal lines 1721-1725 may be formed by shielded twisted pair cable. Signal line 1721 enters I/O support structure 1200*c* through a notch or groove 1731 in the side of top composite plate structure 1201. In some embodiments, I/O support structure 1200*c* may be tightly fit within a cylindrical magnetic shield and/or vacuum can such that the circumferential edge of each of composite plate structures 1201-1203 is flush against the sides of the cylindrical shield and/or vacuum can. In such embodiments, notches or grooves 1731 (only one called out in the Figure) may be used as channels through which signal lines (e.g., signal lines 1721-1725) may enter/exit I/O support structure 1200*c*. However, in embodiments in which there is space around the circumferential edge of each of composite plate structures 1201-1203, signal lines (e.g., signal lines 1721-1725) may enter/exit I/O support structure 1200*c* from the sides and notches or grooves 1731 might not be used, and may be omitted from the design.

Signal line 1721 carries a signal that is filtered in the second tier 1212 of I/O support structure 1200*c*. From notch or groove 1731, signal line 1721 passes along the outside of first tier 1211. In some embodiments, signal line 1721 may physically contact an outer surface of at least one bundle 1260 in first tier 1211 for the purpose of thermalization and volume reduction. Adhesive tape (not shown), for example a KAPTON or TEFLON tape, may secure signal line 1721 against the bundles 1260 of tier 1211. In this respect, it is noted that TEFLON shrinks as temperature lowers, so will hold the wiring tighter as the temperature decreases. From first tier 1211, signal line 1721 may pass through a notch or groove (not shown, but including a notch or groove 1510 in top plate 1202*a* as shown in FIG. 15) in the circumferential edge of middle composite plate structure 1202. Signal line 1721 then enters gap 1712, where it enters an individual tubular filter structure in a bundle 1260 in second tier 1212. The signal(s) carried by signal line 1721 propagate through this individual tubular filter structure, where undesired signal frequencies are removed. Signal line 1721 then continues from the output of the individual tubular filter structure, through the mounting puck 1400 that holds the bundle 1300 to which the individual tubular filter structure belongs, and into shielded enclosure 1703.

Similarly, signal line 1725 also carries a signal that is filtered in the second tier 1212 of I/O support structure 1200*c*. The path followed by signal line 1725 is generally similar to that followed by signal line 1721, except the signal line 1725 passes through a different notch or groove 1731 in top composite plate structure 1201, a different notch or groove (not shown) in middle composite plate structure 1202, and a different individual tubular filter structure belonging to a different bundle 1260 in second tier 1212. The respective paths of signal lines 1721 and 1725 are illustrated as examples only, and through-holes may replace the notches or grooves. In practice, multiple signal lines may pass through the same notch or groove 1731 in top composite plate structure 1201, the same notch or groove (not shown) in middle composite plate structure 1202, and the same bundle 1260. However, each signal line does generally connect to and from a unique individual tubular filter structure in I/O support structure 1200*c*.

Signal lines 1722-1724 each carry a respective signal that is filtered in the first tier 1211 of I/O support structure 1200*c*. As illustrated, each of signal lines 1722-1724 passes through a notch or groove 1731 or other opening in top composite plate structure 1201 (note that signal lines 1723 and 1724 pass through the same notch or groove) and enter into gap 1711 in first tier 1211. Here, each of signal lines 1722-1724 connects to the input of a respective individual tubular filter structure in at least one bundle 1260. The respective signal(s) carried by each of signal lines 1722-1724 each propagate through a respective individual tubular filter structure, where undesired signal frequencies are removed. Each of signal lines 1722-1724 then respectively resumes from the output of an individual tubular filter structure in first tier 1211 and passes through the mounting puck 1400 to which the particular individual tubular filter structure is mounted. Signal lines 1722-1724 then extend into the cavity 1701 in the inner volume of middle composite plate structure 1202, where the filtered signals are shielded from noise outside of cavity 1701. Middle composite plate structure 1202 connects to hollow conduit 1250 such that cavity 1701 connects to channel 1702. Thus, signal lines 1722-1724 each extend from cavity 1701 and through channel 1702. Hollow conduit 1250 connects to bottom composite plate structure 1203 such that channel 1702 connects to shielded enclosure 1703. Thus, signal lines 1722-1724 each extend through channel 1702 into shielded enclosure 1703. Cavity 1701 and channel 1702 provide a shielded space inside I/O support structure 1200*c* through which signal lines (e.g., signal lines 1722-1724) that are filtered in first tier 1211 may extend into shielded enclosure 1703 while avoiding any substantial coupling to noise outside of shielded enclosure 1703 (e.g., noise picked up by crosstalk with signal lines 1721 and 1725 before signal lines 1721 and 1725 are filtered in second tier 1212).

In some embodiments, each of signal lines 1721-1725 may include a shield layer (e.g., a braided shield). In many cryogenic applications, it is preferred for such a shield layer to have a low thermal conductivity (e.g., a copper-nickel alloy), otherwise the signal lines may provide thermal shorts between various cooling stages of the refrigeration system. This same principle applies in some embodiments of the present systems and devices. However, each of signal lines 1721-1725 includes a segment that extends from an output of a respective tubular filter structure and propagates through channel 1702 and/or shielded enclosure 1703. Channel 1702 and shielded enclosure 1703 define environments of substantially uniform temperature where there are no connections between different thermal stages; thus, the segments of signal lines 1721-1725 that propagate through these environments may include shield layers that are not limited to materials of low thermal conductivity. Indeed, in some embodiments it may be advantageous to use a material with a high thermal conductivity (e.g., copper) as the braided shield on the segments of signal lines 1721-1725 that propagate through channel 1702 and/or shielded enclosure 1703. This can result in both improved shielding performance (e.g., reduced crosstalk between signal lines 1721-1725) and, because copper is diamagnetic, reduced remnant magnetic fields in the environments of channel 1702 and shielded enclosure 1703.

The I/O systems and devices described herein may be used to provide superconducting electrical communication with at least one superconducting device. The I/O systems and devices described herein may also serve to provide thermalization and shielding of the at least one superconducting device for which superconducting electrical communication is desired. The I/O systems and devices described herein may be particularly well-suited for use in providing superconducting electrical communication with (as well as thermalization and shielding of) at least one superconducting processor chip, such as a superconducting quantum processor chip. However, the various embodiments described herein may be used to provide I/O systems and devices for a wide range of different superconducting devices. Throughout the remainder of this specification, the at least one superconducting device for which superconducting electrical communication is desired is referred to as the "device sample."

In the various embodiments described herein, the device sample (e.g., a superconducting processor chip) is positioned inside shielded enclosure 1703 in bottom composite plate structure 1203. It is for this reason that each signal line (e.g., signal lines 1721-1725) leads to shielded enclosure 1703. Structural support, thermalization, and the electrical communication interface with the device sample are provided by a pedestal 1123 and device sample holder assembly 1124.

Figure 18:
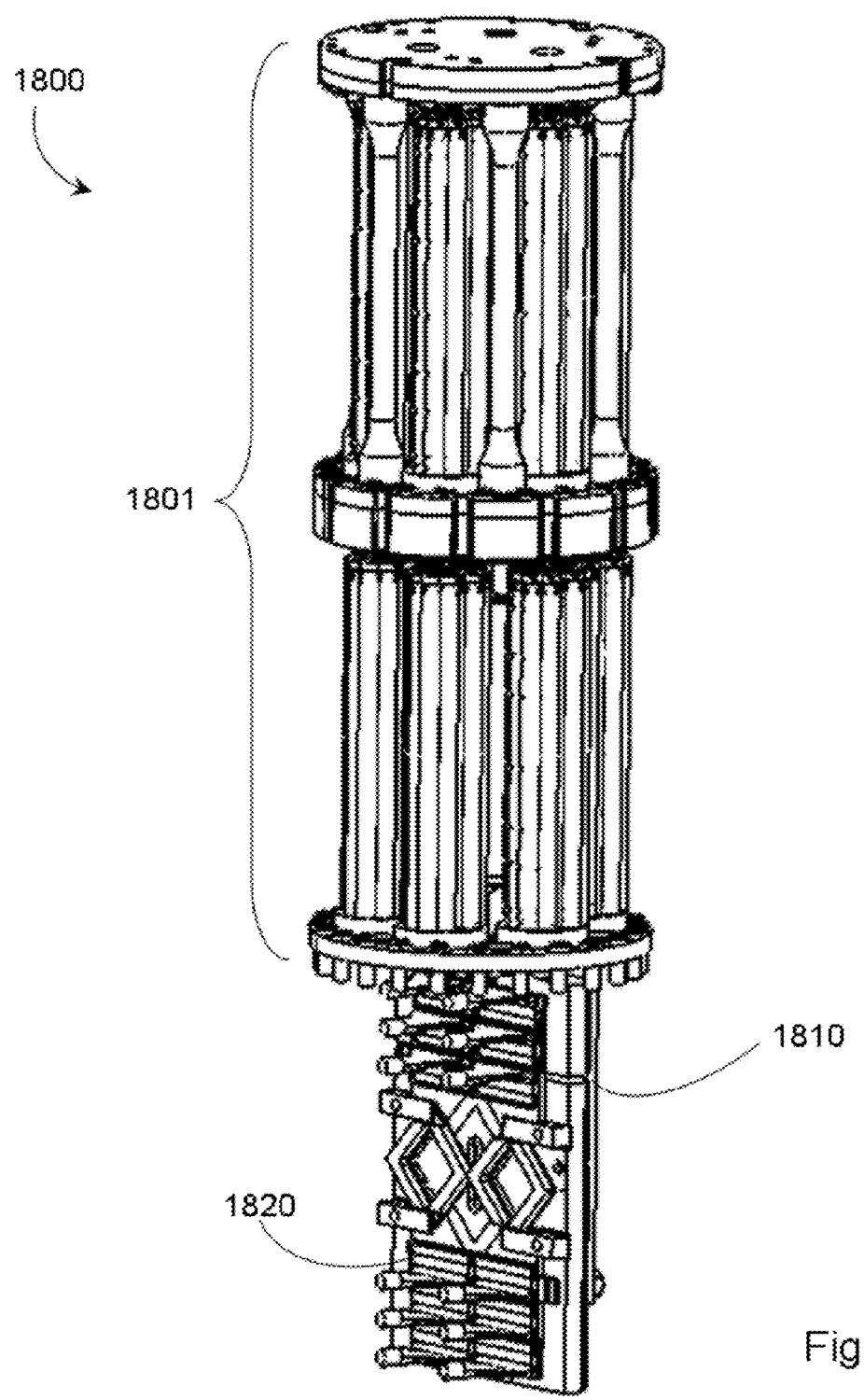
FIG. 18 is an isometric view of an embodiment of a portion of an I/O system including a pedestal and a device sample holder assembly.

FIG. 18 is an isometric view of a portion of an embodiment of an I/O system 1800 including a pedestal 1810 and a device sample holder assembly 1820. The top portion 1801 of I/O system 1800 is substantially similar to I/O support structure 1200*c* from FIG. 12C, except that hollow tube 1203*b* is removed from FIG. 18 to reveal the pedestal 1810 and device sample holder assembly 1820 inside shielded enclosure 1703. Though not visible in the Figure, the pedestal 1810 connects to the top plate 1203*a* of bottom composite plate structure 1203 and the device sample holder assembly 1820 is carried by the pedestal 1810. The pedestal 1810 provides structural support and thermalization of the device sample holder assembly 1820, and allows the device sample holder assembly 1820 to be easily removed from the I/O system 1800 for maintenance and/or for replacing the device sample itself.

Figure 19:
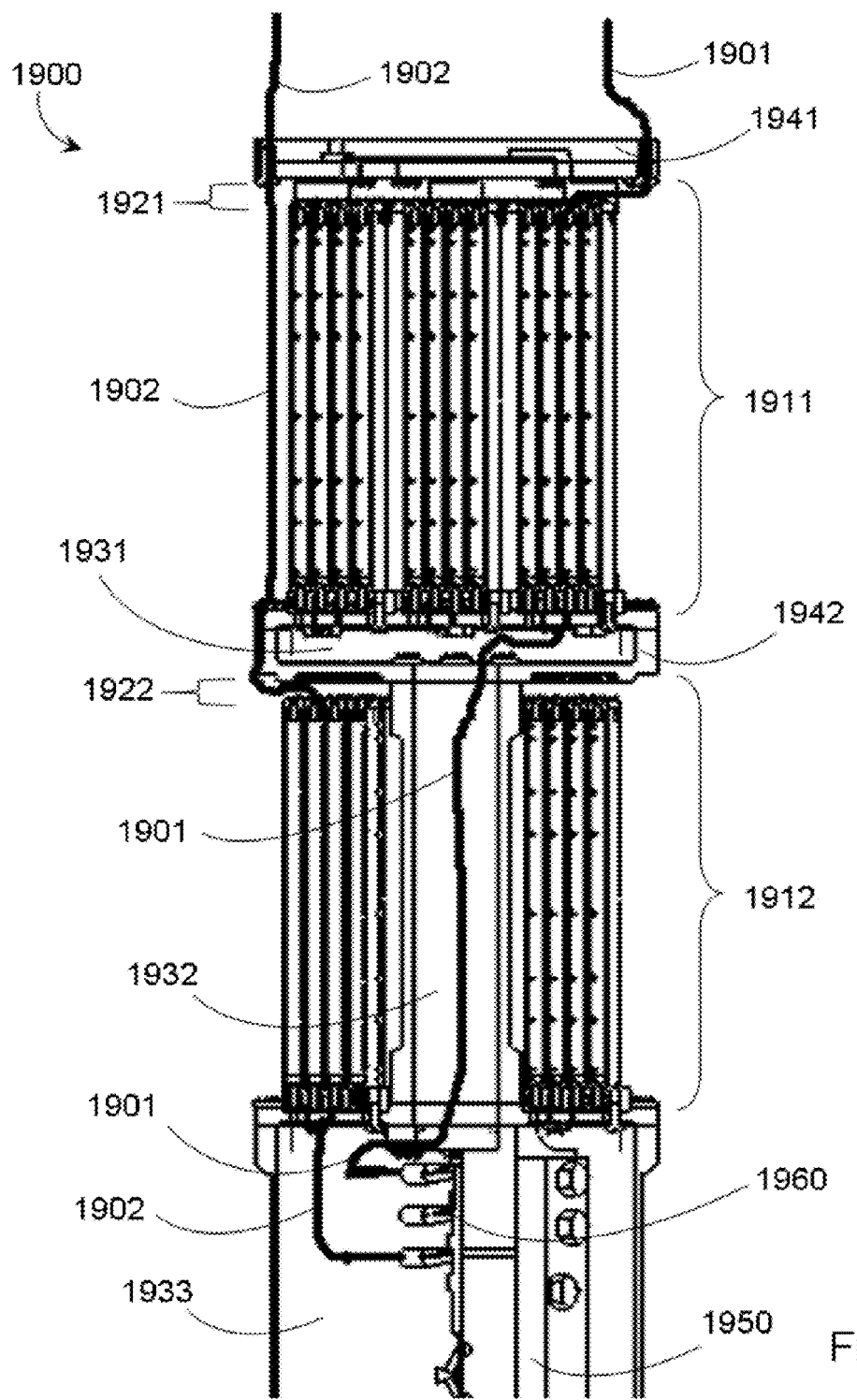
FIG. 19 is a cross-sectional view of an embodiment of a portion of an I/O system showing exemplary signal lines.

In some embodiments, each signal line in the I/O system is electrically coupled to the device sample holder assembly 1820 such that each signal line ultimately provides an electrical signal to the device sample itself. FIG. 19 is a cross-sectional view of a portion of an embodiment of an I/O system 1900 showing exemplary signal lines 1901 and 1902. Signal line 1901 is filtered in the first tier 1911 of I/O system 1900. Signal line 1901 passes through top composite plate structure 1941 and enters gap 1921, where signal line 1901 connects to the input of an individual tubular filer structure in a bundle (e.g., bundle 1300). The individual tubular filter structure filters the unwanted frequencies from the signal(s) carried by signal line 1901. Signal line 1901 then continues from the output of the individual tubular filter structure into the cavity 1931 in the inner volume of middle composite plate structure 1942. Signal line 1901 then extends through channel 1932 into shielded enclosure 1933, where it is connected to device sample holder assembly 1960. Device sample holder assembly 1960 is carried by pedestal 1950.

Signal line 1902 is filtered in the second tier 1912 of I/O system 1900. Signal line 1902 passes through top composite plate structure 1941 and along the outside of at least one bundle in first tier 1911. As previously described, signal line 1902 may be thermally coupled to at least one bundle in first tier 1911. Signal line 1902 then passes through a notch or groove (not shown) in the outer edge of middle composite plate structure 1942 and into gap 1922, where it connects to the input of an individual tubular filter structure in a bundle (e.g., bundle 1300) in second tier 1912. The individual tubular filter structure filters the unwanted frequencies from the signal(s) carried by signal line 1902. Signal line 1902 then continues from the output of the individual tubular filter structure into shielded enclosure 1933, where the signal line 1902 is connected to device sample holder assembly 1960. Device sample holder assembly 1960 is positioned inside shielded enclosure 1933 in order to increase the isolation of the device sample from external noise.

The I/O systems and devices described herein are compatible with a wide variety of device sample holder assemblies, and are adaptable with a wide variety of device samples. The present systems and devices provide device sample holder assemblies that are particularly well-suited for use with superconducting processors, for example superconducting quantum processors. Those of skill in the art will appreciate, however, that the present systems and devices may be adapted to provide I/O communication with other superconducting devices.

Figure 20:
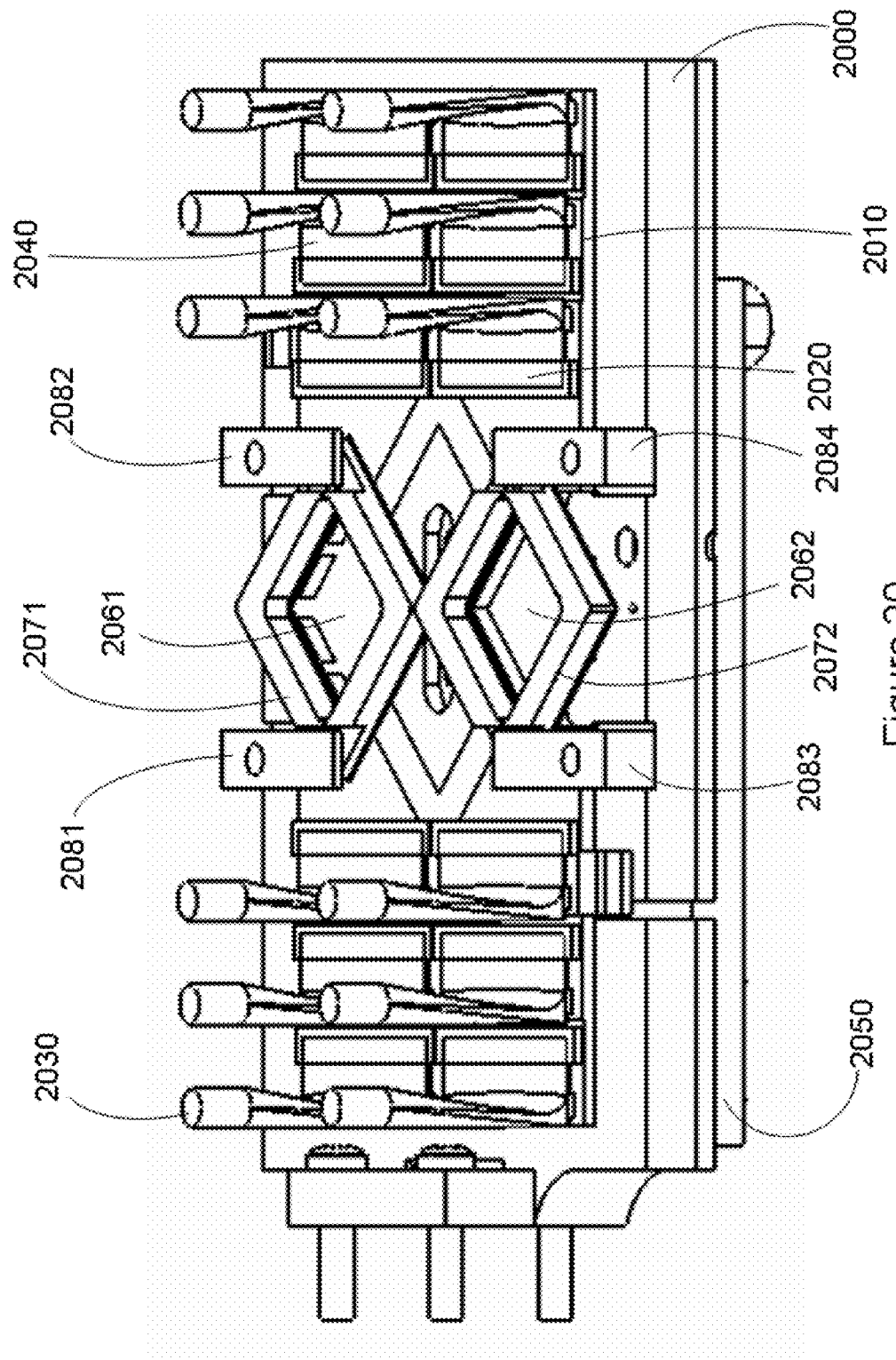
FIG. 20 is an isometric view of an embodiment of a device sample holder assembly carried by a pedestal.

FIG. 20 is an isometric view of an embodiment of a device sample holder assembly carried by a pedestal 2050. The device sample holder assembly comprises a plate 2000 formed by a thermally conductive material, for example non-superconducting metal such as copper or brass, and at least one printed circuit board ("PCB") 2010 (only one called out in the Figure) arranged on a first surface of the plate 2000. A second surface of plate 2000 is mounted (e.g., by screws or bolts) on the pedestal 2050, and the pedestal is connected to the top plate (e.g., top plate 1203*a*) of the bottom composite plate structure (e.g., bottom composite plate structure 1203). The at least one PCB 2010 carries a plurality of (super) conductive traces, at least some of which electrically couple to a zero-insertion force ("ZIF") socket 2020 on the PCB 2010. ZIF sockets 2020 (only one called out in the Figure) provide part of a connection interface between the (super)conductive traces carried by the PCBs 2010 and the signal lines that enter into shielded enclosure 1933 as illustrated in FIG. 19. In FIG. 20, these signal lines are represented by wire groups 2030 (only one called out in the Figure). Each wire group 2030 comprises a plurality of signal lines (e.g., signal lines 1721-1725, 1901, 1902). The plurality of signal lines may be grouped together and then fan out (as illustrated) to each connect to an edge card 2040. Each wire group 2030 may connect to a respective edge card 2040, and each edge card may insert into a respective ZIF socket 2020. Thus, the connection interface between a particular signal line of the I/O system and a particular (super)conductive trace on a PCB 2010 comprises an edge card 2030 and a ZIF socket 1120.

From each ZIF socket 2020, (super)conductive traces carry signals on PCB 2010 to/from the device sample itself. In FIG. 20, the device sample holder assembly is adapted to accommodate two device samples, one in position 2061 and another in position 2062. A device sample may be secured in place in position 2061 using an overlying frame 2071 and a pair of clamps 2081, 2082. With overlying frame 2071 removed, a device sample may be placed in position 2061 and then overlying frame 2071 may be placed on top of the device sample. Clamps 2081 and 2082 may then be used to press down on overlying frame 2071 and hold the device sample in position 2061. Similarly, overlying frame 2072 and clamps 2083, 2084 may be used to secure a device sample in position 2062. Electrical communication between the (super)conductive traces on the PCBs 2010 and the device samples (not shown) in positions 2061 and 2062 may be achieved by, for example, wire bonds. In some embodiments, each (super)conductive trace carried by the PCBs 2010 may be wire-bonded to at least one device sample.

Figure 21:
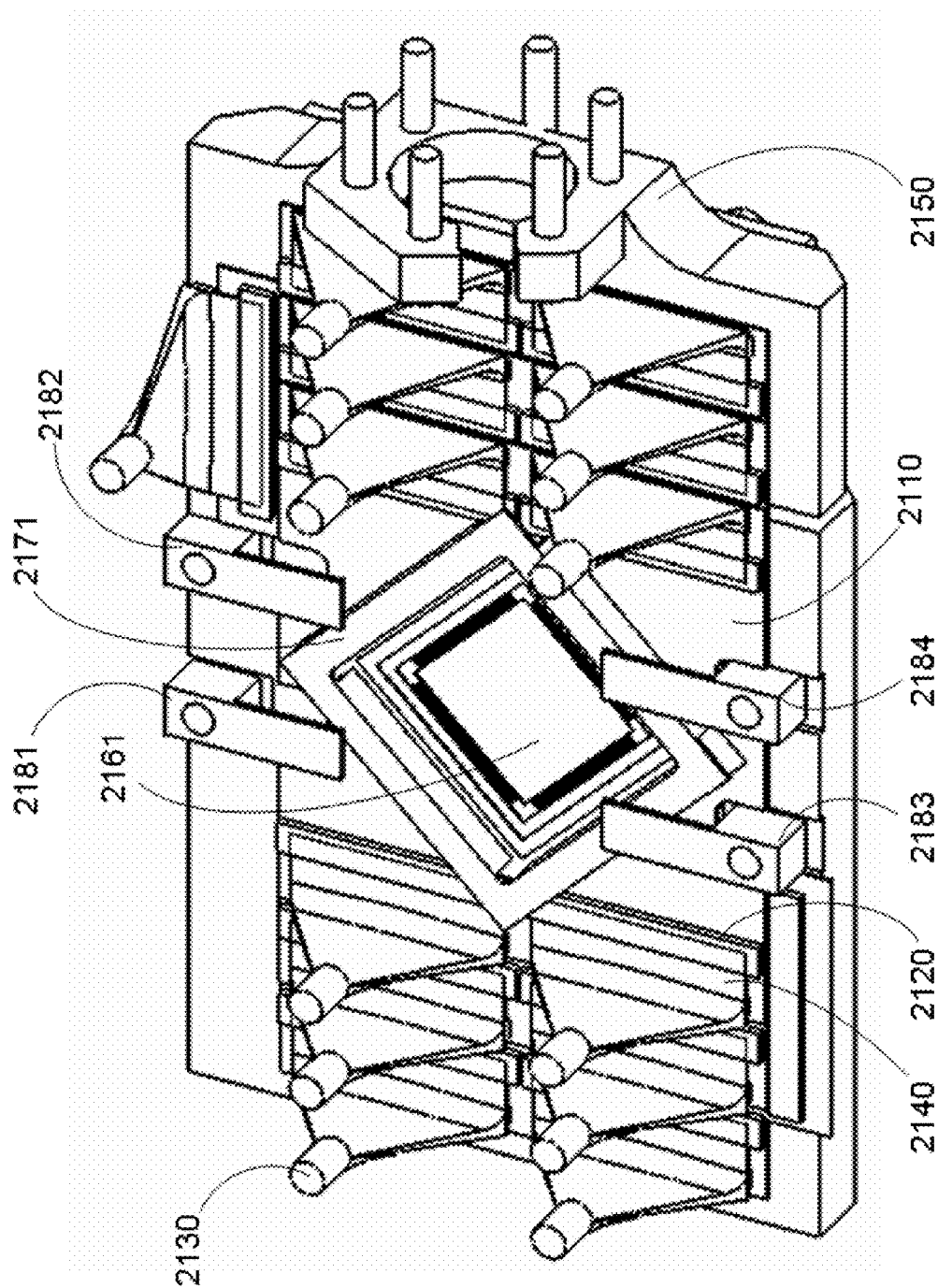
FIG. 21 is an isometric view of another embodiment of a device sample holder assembly carried by a pedestal.

While the device sample holder assembly shown in FIG. 20 is adapted to accommodate two device samples (a respective one in each of positions 2061 and 2062), a device sample holder assembly may accommodate only one device sample. FIG. 21 is an isometric view of an embodiment of a device sample holder assembly carried by a pedestal 2150. The device sample holder assembly shown in FIG. 21 is substantially similar to that illustrated in FIG. 20, a difference being that the device sample holder assembly shown in FIG. 21 has only one position 2161 for receiving a device sample. Otherwise, the device sample holder assembly shown in FIG. 21 includes PCBs 2110, ZIF sockets 2120, wire groups 2130, edge cards 2140, overlying frame 2171, and clamps 2181-2184 to the same result as that described for the device sample holder assembly shown in FIG. 20. Clear details of the wire-bonding, signal line to (super)conductive trace interface, and clamping are illustrated in FIG. 22.

Figure 22:
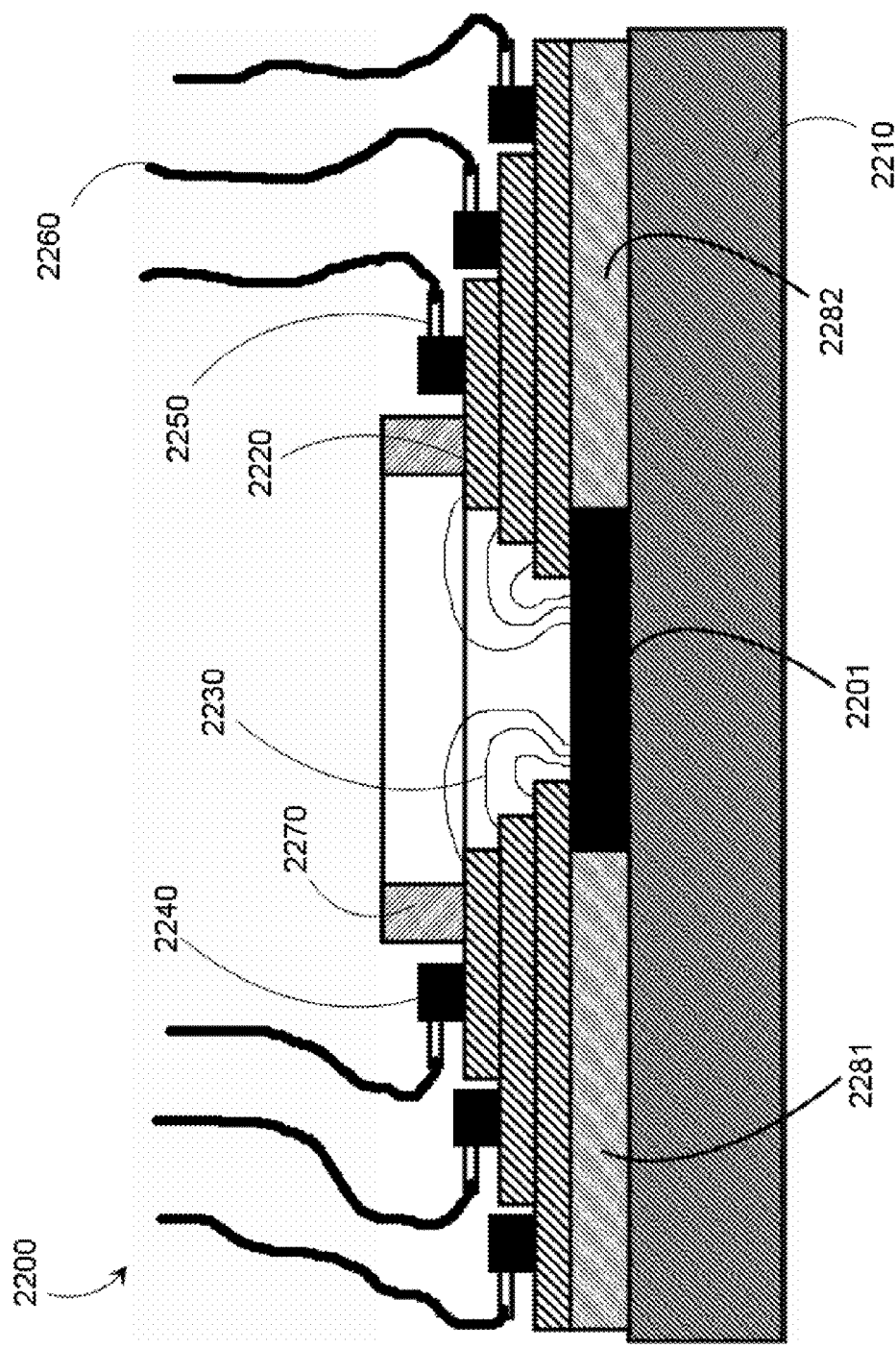
FIG. 22 is a sectional diagram of a device sample holder assembly for accommodating a single device sample.

FIG. 22 is a sectional diagram of a device sample holder assembly 2200 for accommodating a single device sample 2201. Device sample holder assembly 2200 includes a plate 2210 that is selectively mountable to/from (i.e., releasably coupleable) a pedestal (not shown in FIG. 22). Plate 2210 is formed of a thermally conductive material, for example non-superconducting metal such as copper or brass. The device sample 2201 (e.g., a superconducting quantum processor chip) is positioned on a surface of plate 2210 to provide thermal coupling therebetween. PCBs 2220 (only one called out in the Figure) of varying sizes are layered on top of the perimeter of device sample 2201, leaving a gap at the center where wire bonds 2230 (only one called out in the Figure) may be established. The PCBs 2220 are offset in their layering over device sample 2201 so that wire bonds 2230 may be established with (super)conductive traces on the top surface of each PCB 2220. These (super)conductive traces (not shown) are carried on the top surface of each PCB 2220 and each electrically couple to a ZIF socket 2240 (only one called out in the Figure). In some embodiments, the (super)conductive traces may be carried on interior surfaces of the PCBs 2220 in place of, or in addition to, the top surface. Each PCB 2220 has at least one corresponding ZIF socket 2240. In each ZIF socket 2240 is inserted a respective edge card 2250 (only one called out in the Figure), to which the signal lines 2260 (only one called out in the Figure) of at least one wire group (e.g., wire group 2130 from FIG. 21) are connected.

As previously described, the PCBs 2220 are layered on top of the perimeter of the device sample 2201. The device sample 2201 is secured in place by clamps (not shown) that press down on an overlying frame 2270, which lies on top of the PCBs 2220 and overlays the device sample 2201. Thus, the clamping of overlying frame 2270 serves to secure the device sample 2201 in place, and also serves to secure the PCBs 2220 in place overtop of the device sample 2201. This clamping force also improves thermal contact between all of the components.

In some embodiments, plate 2210 may include a recess into which the device sample 2201 is positioned so that the PCBs may be layered on top of the device sample 2201 and still lay flat on the surface of plate 2210. In the illustrated embodiment, there is no such recess, and instead shims 2281, 2282 are used to level out the PCBs 2220. Shims 2281 and 2282 may each comprise a slab of material (e.g., a thermally conductive material, for example a non-superconducting metal such as copper or brass) of approximately the same thickness as the device sample 2201 to provide a substantially level plane upon which the PCBs 2220 may be layered.

In some embodiments, a device sample holder assembly 2200 may be adapted to accommodate at least one device for measuring a characteristic of the environment of the device sample. For example, device sample holder assembly 2200 may be adapted to accommodate at least one magnetometer for measuring a magnetic field in the environment of the device sample. Examples of appropriate magnetometers are described in U.S. Provisional Patent Application Ser. No. 61/104,179, filed Oct. 9, 2008 and entitled "Systems, Methods and Apparatus for Measuring Magnetic Fields." In some embodiments, at least one of PCBs 2220 may include at least one region for receiving a magnetometer and appropriate conductive traces for communicating with the magnetometer.

Some embodiments may be adapted to accommodate multiple device sample holder assemblies in a single system. For example, in some embodiments, a pedestal (such as pedestal 250 from FIG. 20) may be designed to carry a first sample holder assembly on a first surface and a second sample holder assembly on a second surface.

The various embodiments described herein provide systems and devices for modular I/O systems. In the present systems and devices, each filter device is realized by a distinct tubular filter structure. Therefore, if there is a need to adjust the filtering of any given signal line, adjustments may need only be made to the signal line itself and the single individual tubular filter structure to which the signal line corresponds. Furthermore, the "bundled" nature of the individual tubular filter structures may facilitate that removal of a single filter structure without overly disrupting the rest of the system.

As an alternative, some embodiments may employ just a superconducting wire with an appropriate cladding or sheathing as a low-pass filter. High frequency components run on the surface of a superconducting wire due to the skin-depth effect. The high frequency components of the signal could be dissipated in a resistive or grounded cladding or sheathing. For example, a niobium superconductor may carry the DC component of the signal, while a resistive (i.e., non-superconducting) material (e.g., copper nickel) may dissipate the high frequency components.

The above described embodiments provide superconducting electrical connections while also providing high thermal conductivity between the various components, even though materials at superconducting temperatures are typically thermally insulating or have poor thermal conductivity. There is essentially little or no convection, and while there is some radiation, conduction is the principal means of heat transfer in the system. A variety of approaches and structures are utilized to realize such characteristics. For example, all contacting surfaces may be lapped and polished to enhance thermal conductivity and enable complete electrically conductive enclosure. Contacting surfaces may also be gold-plated (ASTM B 488, Type II, Grade A, Class 2) to further enhance thermal conductivity.

Advantageously, the various components, including the electronics, exclude the use of substantially ferromagnetic materials. Thus, there is no use of steel fasteners, nickel or chrome plating, or stainless steel. It is noted that some alloys of copper-nickel are paramagnetic and may be used. Thus, throughout this specification and the appended claims, the term "non-magnetic" or "substantially non-magnetic" is used to describe a material that has a sufficiently low remnant magnetization so as not to adversely affect the operation of the superconducting device sample. In some embodiments, a substantially non-magnetic is a material that is non-ferromagnetic. Materials should have no or minimal iron impurities. For example, capacitors may be ceramic while inductors may be custom-made air-core aluminum wire inductors. In some instances, it may be advantageous to employ ultrasonic soldering or use of an aggressive flux in soldering techniques to create a good superconducting joint.

Low temperature glues may be employed, for example Emerson and Cummings 1266 or 2850ST glues.

Some embodiments may employ cooling fins, for example, with gold or gold-plated connections for transferring heat thereto. In some embodiments, gold-plating may, for example, have a thickness of approximate 1.5-2.5 microns.

Some embodiments may employ resistive wiring (e.g. superconducting material such as Niobium with a non-superconducting cladding such as copper and/or copper nickel) to provide some filtering, thereby reducing the need for discrete filters. The use of coaxial cables and/or shielded twisted pair cables between various stages may advantageously reduce cross talk. Some embodiments may provide for some or all the filtering to occur on the device sample.

In some embodiments, signal lines or cables may be realized by conductive traces on at least one printed circuit board, such as a flexible printed circuit board. Further details on I/O systems implementing flexible printed circuit boards may be found in U.S. patent application Ser. No. 12/256,332.

Some embodiments may employ on- or near-device sample control, for example, moving some or all of the room temperature electronics to the device sample or some other refrigerated component or section (e.g., 77K section, 4K section, etc.). Further descriptions of such systems are found in US Patent Publication No. 2008-0215850. Such may also eliminate or reduce the amount of room temperature wires or cable. Such may advantageously reduce noise levels and consequently reduce the need for filtering. Some embodiments may employ laser ablation. Some embodiments may employ flip-chip techniques, for example a ball grid array or solder bumps to attach the device sample or a separate control chip, in lieu of wire bonding. Some embodiments may employ a separate control chip. Some embodiments may use flexible fingers or prongs or spring contacts (e.g., pre-stressed metal prongs) to make attachments. The device sample and a separate control chip may be connected using a plug-in socket and pin approach, similar to the 2-prong fork and stick approach described above, or at least one ZIF socket. Some embodiments may employ probe cards. Such may include a keyed location for the device sample in a twenty-four probe card arrangement. Device samples may be thermalized using metallization of the back or the device sample and/or a plurality of needle contacts (e.g., gold tipped needles). Probe card based device sample packaging may employ Tungsten-Rhenium alloys for the needles, as described in PCT Patent Application Serial No. PCT/US09/037984. Circuit boards in the device sample holder assembly may be formed from a variety of materials, and insulator thickness may be minimized by using a circuit board made of metal rather than resistive or insulative material (e.g., metal substrate with insulated components formed or placed thereon.) The device sample holder assembly may include a lid, which may comprise a material that is superconducting below a critical temperature, such that the device sample is at least partially enclosed in a superconducting enclosure.

Throughout this specification and the appended claims, reference is often made to a refrigeration system, such as refrigeration system 1112. As previously discussed, refrigeration system 1112 may include a dilution refrigerator. In various embodiments, refrigeration system 1112 may include at least one component selected from the group consisting of: pulse tube cryocoolers, cryogenic cycle refrigerators, adsorption pumps, gas-gap heat switches, evaporation pots, condensation surfaces, liquid helium-3 coolant, liquid helium-4 coolant, and a mixture of liquid helium-3 coolant and liquid helium-4 coolant. In some embodiments, the present systems and devices may be combined with the refrigeration systems described above. In other embodiments, the present systems, methods and apparatus may be used with other forms of refrigeration systems.

Some embodiments may employ additional systems, methods and apparatus for magnetic shielding. Examples of systems, methods and apparatus for magnetic shielding that may be appropriate are described in PCT Patent Application Serial No. PCT/US09/032744, US Patent Publication No. 2009-0122508, and US Patent Publication No. 2009-0168286. Furthermore, some embodiments may incorporate non-superconducting magnetic shields within the refrigerated environment, for example mu-metal, cryoperm, and/or finemement magnetic shields. Such non-superconducting materials may be used, for example, to shield the device sample from local sources of magnetic fields, such as magnetic components within or proximate the refrigerated environment. However, these materials (e.g., mu-metal, cryoperm, and finemement) are often poor thermal conductors and efficient thermalization of magnetic shields formed of these materials can be challenging. For example, finemement is a material whose magnetic shielding capability improves with effective material thickness and/or when multiple layers are implemented (e.g., a coil of finemement material surrounding the environment being shielded), but cooling such a coil can be challenging because finemement is a poor thermal conductor. In accordance with the present systems and devices, the thermalization of a finemement magnetic shield (or any magnetic shield made of a material that is non-superconducting) may be improved by plating or laminating at least one surface of the shield material with a material that is highly thermally conductive, such as copper. This technique is particularly effective when a multi-layered (e.g., coiled) magnetic shield is implemented, since having at least one surface of the material plated or laminated with copper introduces a good thermal path throughout the volume of the shield.

Various embodiments described herein provide systems and devices for establishing electrical communication between a vacuum environment (e.g., inside a refrigeration system) and a non-vacuum environment (e.g., outside the refrigeration system). Referring again to FIG. 11, various embodiments described herein provide systems and devices for establishing electrical communication between a refrigerated environment 1112 and room temperature electronics 1114, for example, through a vacuum connector box 1116. In the preferred embodiment, the present systems and devices implement flexible printed circuit board cable in lieu of traditional cables (e.g., coaxial cables, electrical wires, shielded twisted pair cables, ribbon cables, etc.) to achieve improved thermalization, to simplify routing of the electrical signal paths, to reduce costs, to reduce crosstalk between electrical signal paths, and to reduce the number of electrical connectors in the system.

Establishing electrical communication between two environments of substantially different pressure (e.g., a vacuum environment and a non-vacuum environment) is typically achieved in the known art using hermetically sealed electrical connectors. A hermetically sealed D-Sub connector is an example of such a device.

FIG. 23A is a bottom plan view of a hermetically sealed D-Sub connector 2300. Connector 2300 includes a standard D-Sub receptacle 2301 with sockets 2310 (only one called out in the Figure) which is potted in epoxy 2330 and mounted in flange 2320. Flange 2320 may also include an "O"-ring seal 2340. D-Sub receptacle 2301 connects through the flange 2320 to a D-Sub plug (not visible in FIG. 23A) with pins as opposed to sockets 2310. Thus, connector 2300 may be mounted (using flange 2320) in a hole in the interface between a vacuum environment and a non-vacuum environment to provide a D-Sub receptacle 2301 in one environment and a D-Sub plug (not visible in FIG. 23A) in the other environment, thereby enabling an electrical connection between the two environments.

FIG. 23B is a side elevational view of the hermetically sealed D-Sub connector 2300 from FIG. 23A, showing the D-Sub receptacle 2301 connecting through the flange 2320 to the D-Sub plug 2302. As previously described, receptacle 2301 may include a plurality of sockets and plug 2302 may include a plurality of pins. Flange 2320 may be used to mount connector 2300 in a hole in the interface between a vacuum environment and a non-vacuum environment such that receptacle 2301 extends into one environment and plug 2302 extends into the other environment. The electrical connection (s) between receptacle 2301 and plug 2302 are hermetically sealed through flange 2320, thus connector 2300 provides a hermetically sealed electrical connection between the two environments.

There are several disadvantages to implementing a hermetically sealed electrical connector such as connector 2300. One disadvantage is that such a connector is typically expensive. Another disadvantage is that such a connector is often a considerable source of electrical noise and crosstalk in the electrical signal paths that connect therethrough. In systems involving highly sensitive electronics, it is desirable to mitigate all sources of electrical noise and crosstalk. Thus, there is a need in the art for a comparably inexpensive mechanism to establish electrical communication through a hermetic seal while introducing less electrical noise and crosstalk than available electrical connectors.

In accordance with the present systems and devices, electrical communication between a vacuum environment and a non-vacuum environment can advantageously be achieved using a hermetically sealed feed-through structure as opposed to an electrical connector. In this way, an electrical signal path can be carried in a continuous conductor that extends through the interface between the two environments. In the preferred embodiment, the present systems and devices implement flexible printed circuit board cables in lieu of traditional cables.

Figure 24B:
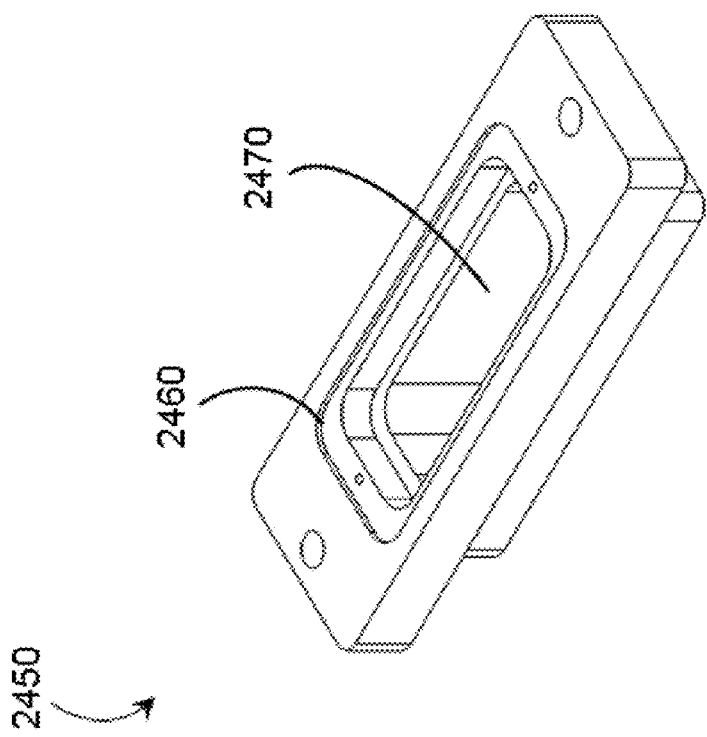
FIG. 24B is an isometric view of an embodiment of a flange for use in a hermetically sealed electrical feed-through structure.
Figure 24A:
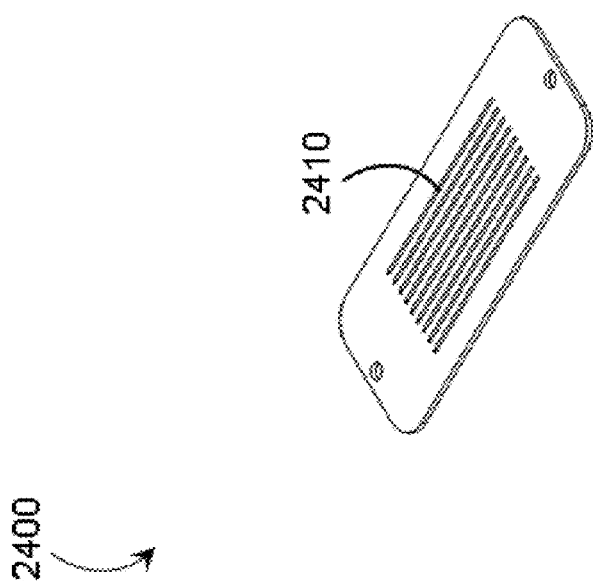
FIG. 24A is an isometric view of an embodiment of a plate for use in a hermetically sealed electrical feed-through structure.

FIG. 24A is an isometric view of an embodiment of a plate 2400 for use in a hermetically sealed electrical feed-through structure. Plate 2400 includes a plurality of elongated through-holes 2410 (only one called out in the Figure), each for receiving a respective flexible printed circuit board cable (not shown). In some embodiments, plate 2400 may be formed of metal. Plate 2400 may be mated with a flange to assemble a hermetically sealable electrical feed-through structure.

FIG. 24B is an isometric view of an embodiment of a flange 2450 for use in a hermetically sealed electrical feed-through structure. Flange 2450 includes a recess 2460 sized and dimensioned to receive and mate with plate 2400 from FIG. 24A. Flange 2450 also includes a through-hole 2470 that forms a cavity when plate 2400 is mated in recess 2460. In some embodiments, flange 2450 may be formed of metal. Flange 2450 may be mated with plate 2410 to assemble a hermetically sealable electrical feed-through structure.

Figure 25A:
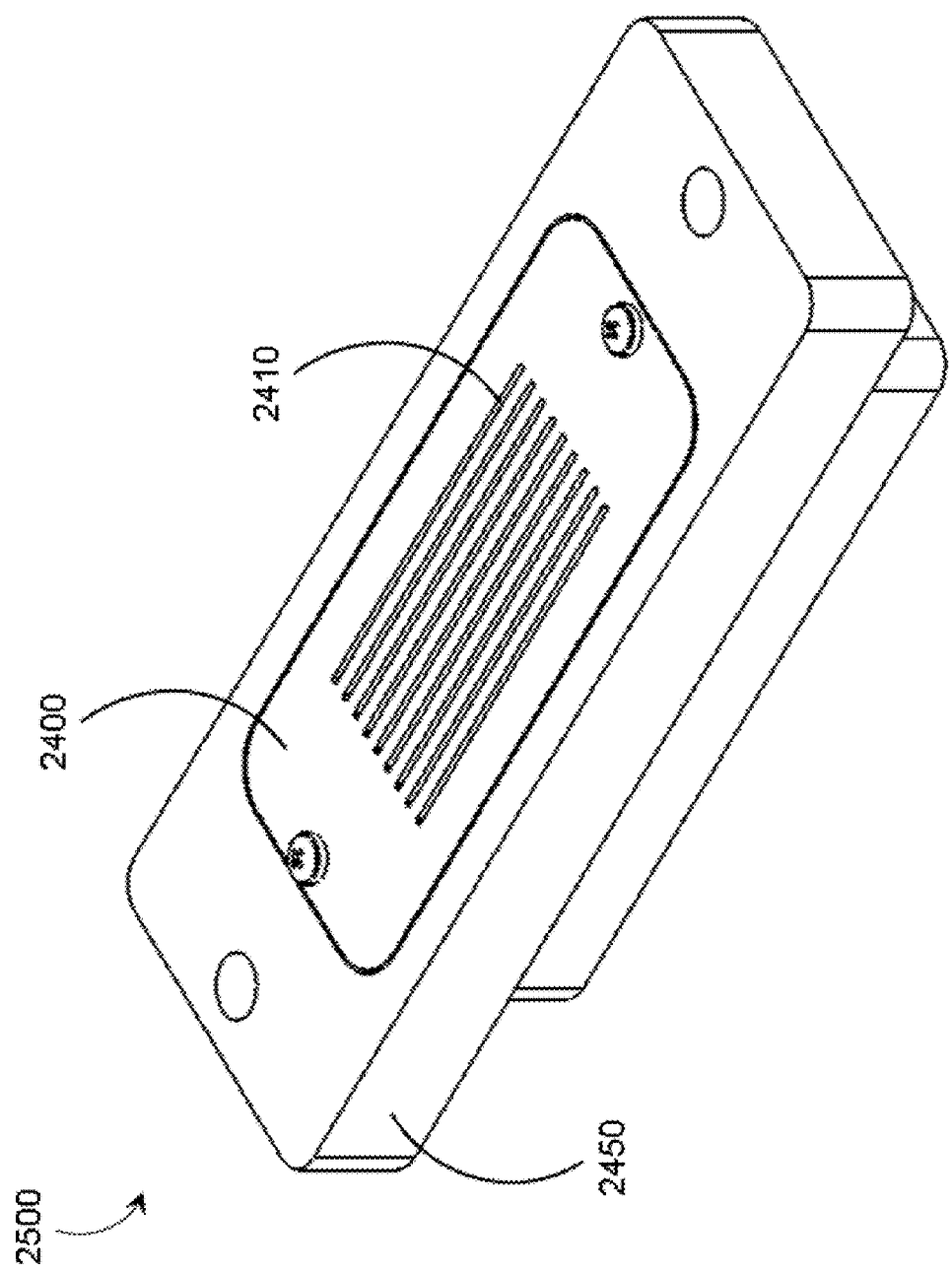
FIG. 25A is an isometric view of an embodiment of a hermetically sealable electrical feed-through structure.

FIG. 25A is an isometric view of an embodiment of a hermetically sealable electrical feed-through structure 2500. In the illustrated embodiment, feed-through structure 2500 is an assembly comprising plate 2400 mated with flange 2450. As in FIG. 24A, plate 2400 includes a plurality of elongated through-holes 2410 (only one called out in FIG. 25A) each for receiving a respective flexible printed circuit board cable (not shown). In feed-through structure 2500, plate 2400 covers the through-hole (2470 from FIG. 24B) that extends through flange 2450, thereby defining a cavity. Feed-through structure 2500 is "sealable" as opposed to "sealed" because the hermetic seal is only established after the respective flexible printed circuit board cables are fed through the elongated through-holes in plate 2400 and the cables are not shown in FIG. 25A. This hermetic seal is established, at least in part, by potting the cavity beneath plate 2400 with a sealant, such as an epoxy mixture.

Figure 25B:
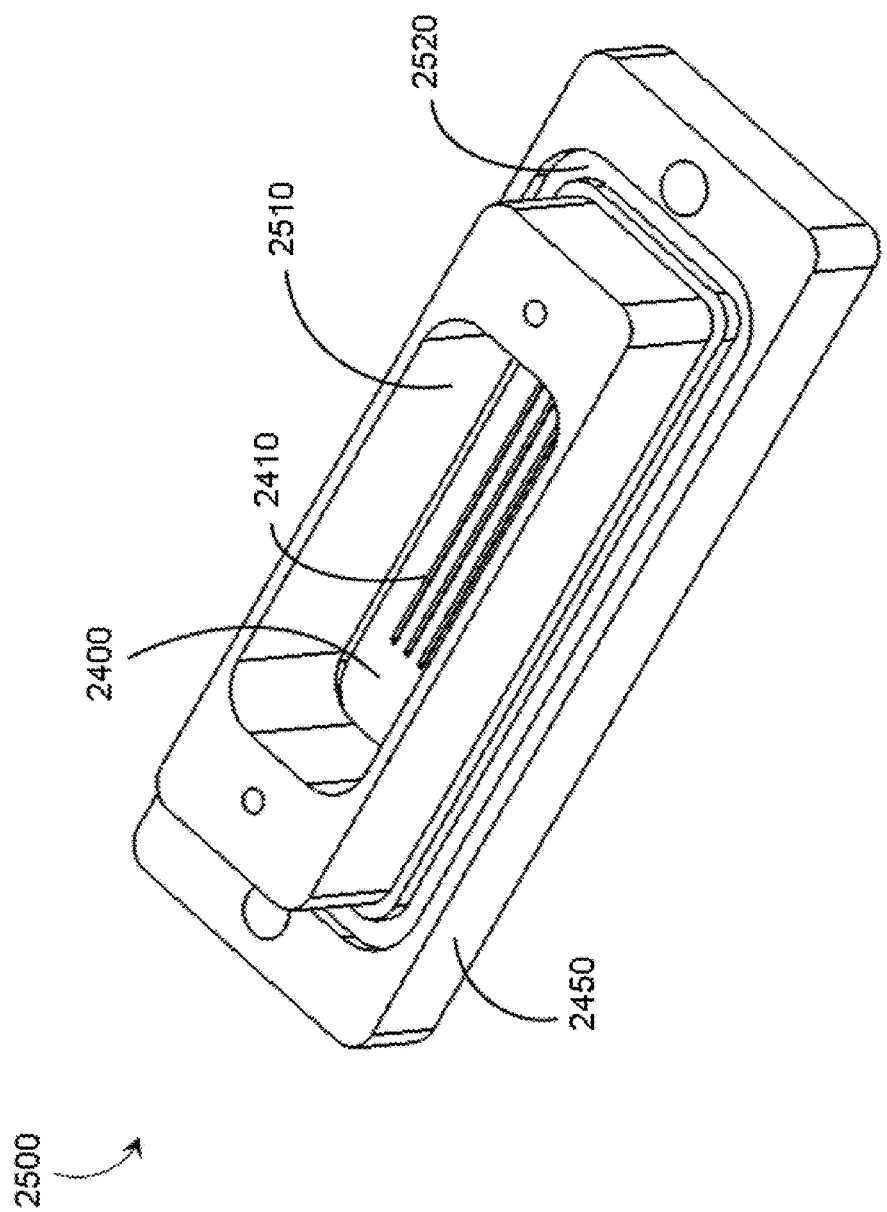
FIG. 25B is an isometric view of an embodiment of the hermetically sealable electrical feed-through structure from FIG. 25A, showing a cavity in the underside of the flange.

FIG. 25B is an isometric view of an embodiment of the hermetically sealable electrical feed-through structure 2500 from FIG. 25A, showing a cavity 2510 in the underside of the flange 2450. Cavity 2510 is formed by the through-hole (2470 from FIG. 24B) in flange 2450 and closed at one end by plate 2400. Cavity 2510 is adjacent to plate 2400 such that each elongated through-hole 2410 in plate 2400 extends through plate 2400 and into cavity 2510. In some embodiments, feed-through structure 2500 may be hermetically sealed once a respective flexible printed circuit board cable has been fed through each of elongated through-holes 2410 by potting cavity 2510 with a sealant, such as an epoxy mixture. Flange 2450 may then be mounted in a hole in the interface between a vacuum environment and a non-vacuum environment to establish a hermetic seal. To this end, the underside of flange 2450 may include a groove 2520 for receiving an "O"-ring seal.

The embodiment of a hermetically sealable electrical feed-through structure 2500 shown in FIGS. 25A and 25B is an assembly comprising at least two components: a plate 2400 and a flange 2450. In alternative embodiments, a similar structure may be formed of a single piece of material with a plurality of elongated through-holes feeding into (i.e., adjacent to) a cavity. That is, an alternative embodiment may be formed by a plate having a first surface and a second surface opposite the first surface, wherein the first surface of the plate includes at least one elongated through-hole for receiving a flexible printed circuit board cable. The at least one elongated through-hole extends out through the second surface of the plate. The plate may have a sufficient thickness to accommodate a cavity that is adjacent to the second surface of the plate such that the at least one elongated through-hole extends through the plate and into the cavity.

Figure 26A:
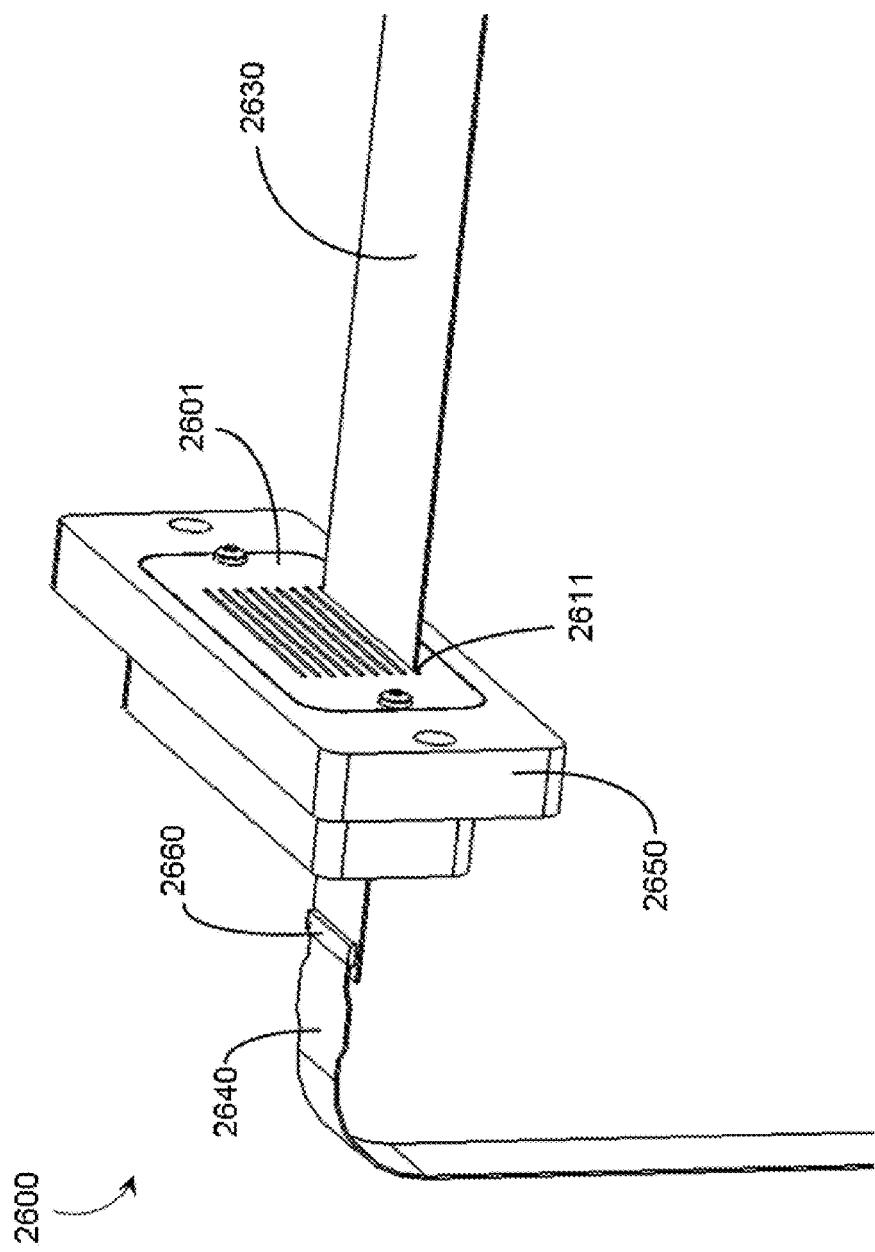
FIG. 26A is an isometric view of an embodiment of a hermetically sealable electrical feed-through structure showing a flexible printed circuit board cable received by an elongated through-hole.

As previously described, each elongated through-hole 2410 in a hermetically sealable electrical feed-through structure 2500 is sized and dimensioned to receive a respective flexible printed circuit board cable. FIG. 26A is an isometric view of an embodiment of a hermetically sealable electrical feed-through structure 2600 showing a flexible printed circuit board cable 2630 received by an elongated through-hole 2611. Similar to feed-through structure 2500 from FIGS. 25A and 25B, feed-through structure 2600 is an assembly comprising a plate 2601 and a flange 2650. Cable 2630 passes through an elongated through-hole 2611 in plate 2601 and through an adjacent cavity (not visible, but similar to cavity 2510 from FIG. 25B) in flange 2650. In the illustrated embodiment, a portion of cable 2630 extends out of the back of flange 2650 and is electrically coupled to another flexible printed circuit board cable 2640 through a connector 2660. Connector 2660 may include, for example, a zero-insertion force connector. In some embodiments, cable 2640 may include at least one superconducting trace such that connector 2660 provides an interface between non-superconducting traces carried by cable 2630 and superconducting traces carried by cable 2640. In such embodiments, cable 2640 is positioned within a refrigerated environment while cable

2640 may be positioned outside of the refrigerated environment. In alternative embodiments, cable 2640 may be replaced by one or a plurality of traditional cables, such as coaxial cables, shielded twisted pair cables, wires, and the like. In still other embodiments, cable 2630 may be sufficiently long that cable 2640 is not needed.

Figure 26B:
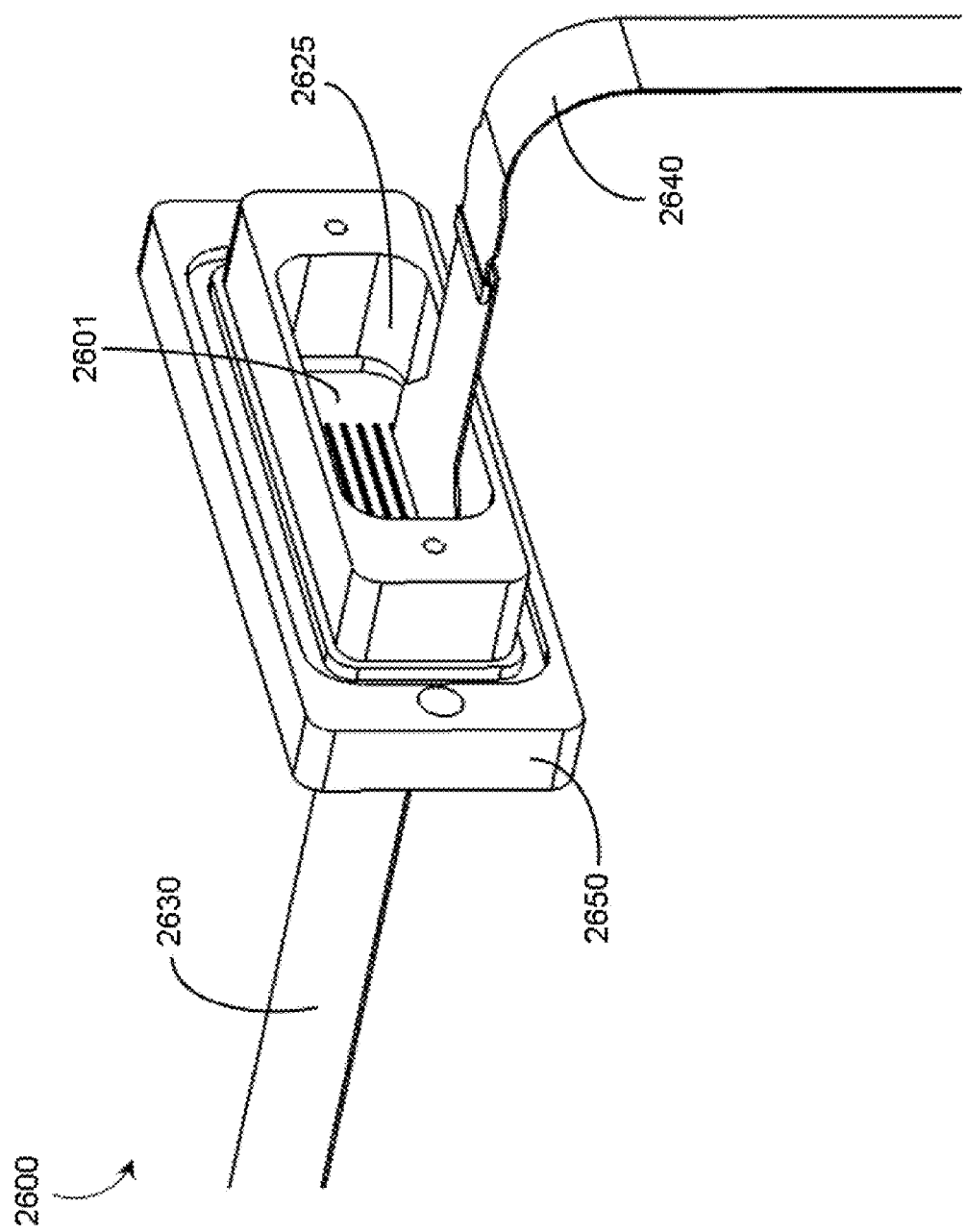
FIG. 26B is an isometric view of an embodiment of the hermetically sealable electrical feed-through structure from FIG. 26A, showing a flexible printed circuit board cable extending through the cavity in the flange.

FIG. 26B is an isometric view of an embodiment of the hermetically sealable electrical feed-through structure 2600 from FIG. 26A, showing flexible printed circuit board cable 2630 extending through a cavity 2625 in the flange 2650. Once a respective flexible printed circuit board cable is fed through each elongated through-hole in the plate 2601, cavity 2625 may be potted with a sealant such that cavity 2625 is hermetically sealed. In some embodiments, the sealant may comprise an epoxy mixture. In some applications, it may be desirable to reduce the transmission of electromagnetic interference through the feed-through structure. Such transmission may be reduced by including a quantity of metal powder in the sealant. Thus, in some embodiments, the sealant may comprise a mixture of metal powder and epoxy. The metal powder may comprise, for example, copper powder or brass powder. In some applications, not all of the elongated through-holes in the plate 2601 will receive a flexible printed circuit board cable. In such applications, the sealant may seal those elongated through-holes which do not receive a respective flexible printed circuit board cable.

In some embodiments, it may be advantageous to include at least one electrical connection between the flange 2650 and the shielding metal of the flexible printed circuit board cable.

Figure 27:
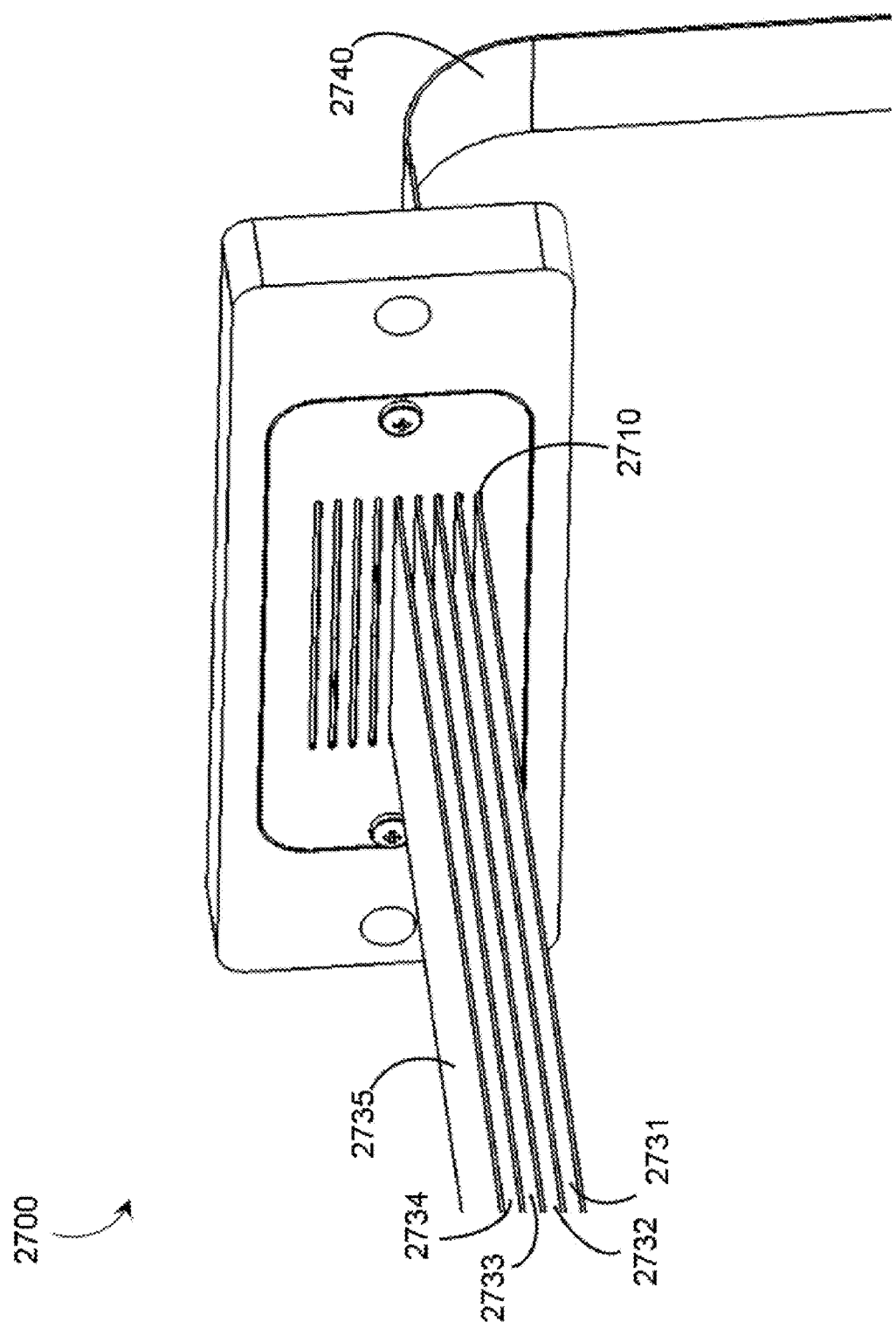
FIG. 27 is an isometric view of an embodiment of a hermetically sealable electrical feed-through structure showing a plurality of flexible printed circuit board cables each received by a respective elongated through-hole.

As previously described, a hermetically sealed/sealable electrical feed-through structure may include a plate with a plurality of elongated through-holes, where each elongated through-hole is for receiving a respective flexible printed circuit board cable. FIG. 27 is an isometric view of an embodiment of a hermetically sealable electrical feed-through structure 2700 showing a plurality of flexible printed circuit board cables 2731-2735 each received by a respective elongated through-hole 2710 (only one called out in the Figure). While a total of nine elongated through-holes 2710 are included in feed-through structure 2700, those of skill in the art will appreciate that any number of elongated through-holes, and any number of corresponding flexible printed circuit board cables, may similarly be employed. FIG. 27 also shows a single flexible printed circuit board cable 2740 extending from the back of the flange 2750. In practice, each of flexible printed circuit board cables 2731-2735 may connect to a respective flexible printed circuit board cable (e.g., 2740) after passing through feed-through structure 2700. As previously described, in alternative embodiments each of flexible printed circuit board cables 2731-2735 may couple to at least one traditional cable (e.g., coaxial cable, shielded twisted pair cable, wire, etc.) as opposed to coupling to another flexible printed circuit board cable 2740.

Various embodiments described herein provide systems and devices for hermetically sealed electrical feed-through structures. The embodiments shown in FIGS. 25A, 25B, 26A, 26B, and 27 are all described as being hermetically "sealable" as opposed to hermetically "sealed" because each of those illustrated embodiments includes at least one elongated through-hole that is not filled by a flexible printed circuit board cable. In order for a hermetically "sealable" electrical feed-through structure to be hermetically "sealed", each elongated through-hole in the feed-through structure must be hermetically sealed with a flexible printed circuit board cable and/or sealant.

Figure 28:
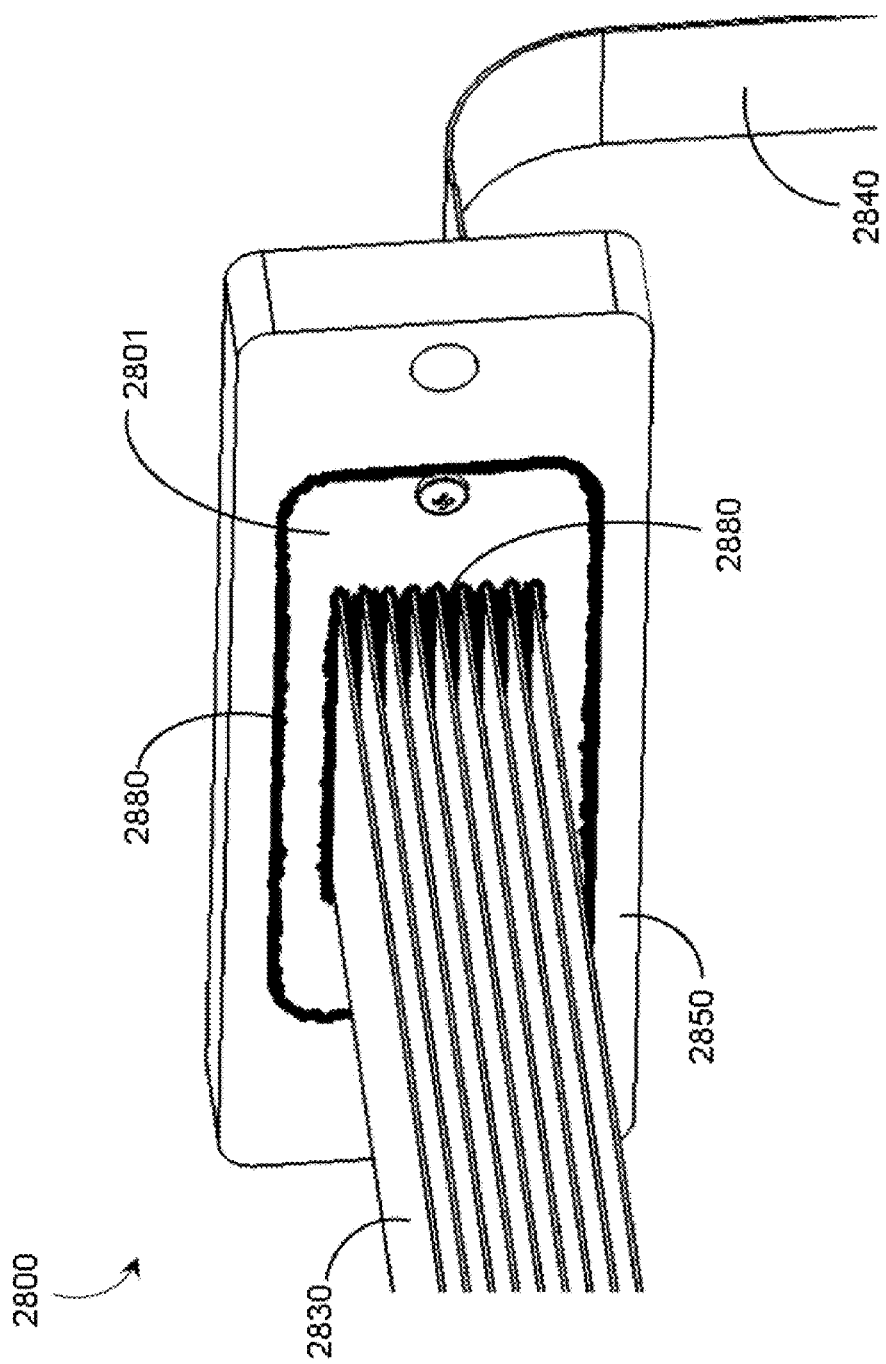
FIG. 28 is an isometric view of an embodiment of a hermetically sealed electrical feed-through structure for providing electrical communication between two environments that are at substantially different pressures.

FIG. 28 is an isometric view of an embodiment of a hermetically sealed electrical feed-through structure 2800 for providing electrical communication between two environments that are at substantially different pressures. In the illustrated embodiment, nine flexible printed circuit board cables 2830 (only one called out in the Figure) are each fed through a respective elongated through-hole (not visible) adjacent a first side of feed-through structure 2800. Each of the nine flexible printed circuit board cables 2830 extends through feed-through structure 2800 and may couple to a respective flexible printed circuit board cable 2840 (only one shown in the Figure to reduce clutter) adjacent a second side of feed-through structure 2800. Towards establishing a hermetic seal, the volume of each elongated through-hole (not visible) that remains unfilled after a flexible printed circuit board cable is fed therethrough may be sealed using a sealant 2880. In some embodiments, the sealant may comprise a glue, such as a UV glue that is cured by exposure to UV radiation. While sealant 2880 may directly contribute to the hermetic seal of feed-through structure 2800, sealant 2880 also facilitates the potting of the cavity in feed-through structure 2800 (not visible, but similar to cavity 2510 from FIG. 25B) with epoxy by preventing the epoxy from passing through the elongated through-holes. To this end, sealant 2880 may also be applied around the perimeter of the plate 2801 to ensure it is hermetically mated with the flange 2850.

Figure 29:
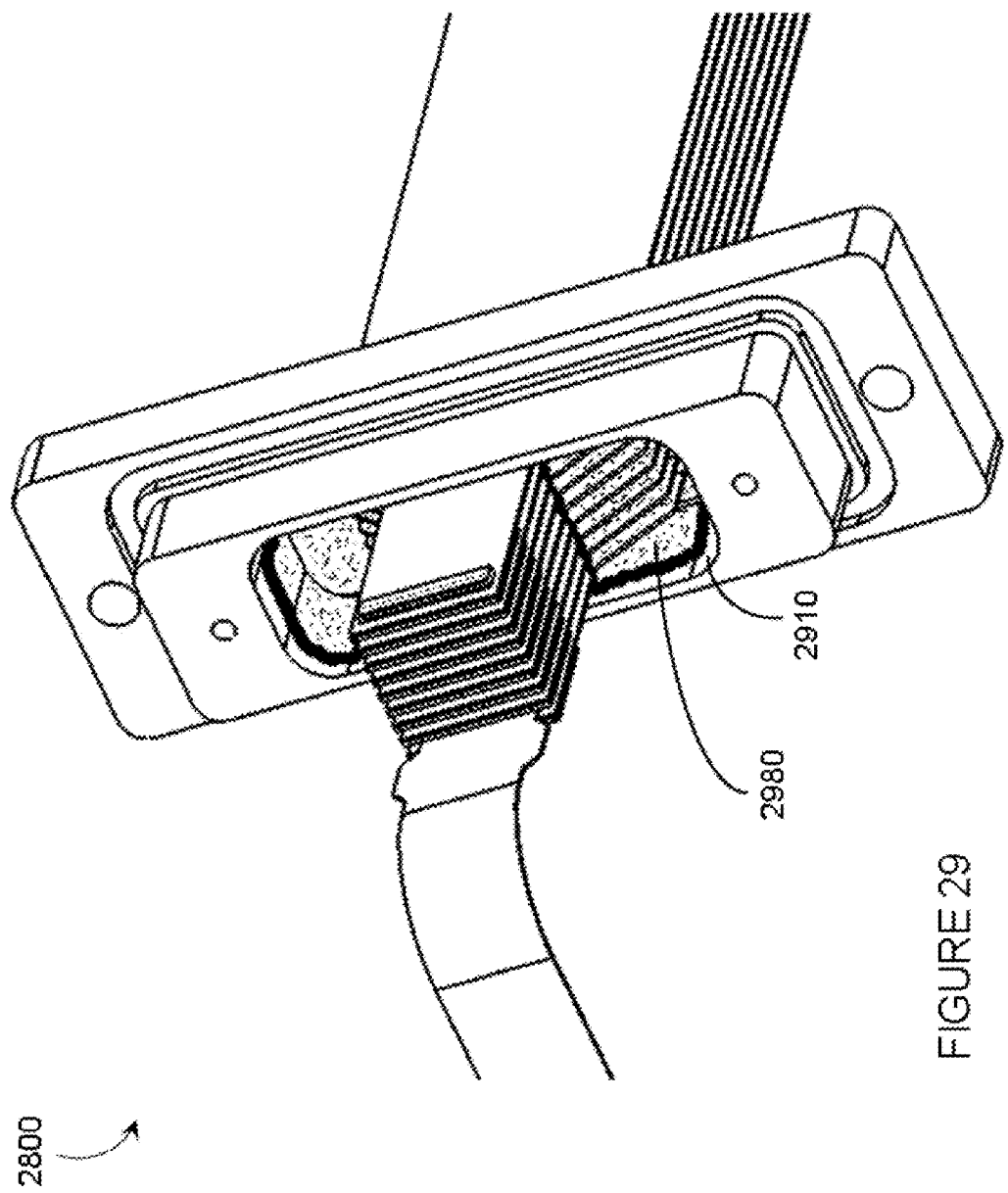
FIG. 29 is an isometric view of the hermetically sealed electrical feed-through structure from FIG. 28, showing a cavity potted with an epoxy.

Sealant 2880 serves, at least in part, to facilitate the potting of the cavity in feed-through structure 2800 with epoxy. FIG. 29 is an isometric view of hermetically sealed electrical feed-through structure 2800 from FIG. 28, showing the cavity 2910 potted with an epoxy 2980. As previously described, in some embodiments it may be advantageous to achieve an electromagnetic shielding effect by including a quantity of metal powder (e.g., copper powder or brass powder) mixed in with the epoxy 2980. To this end, similar or additional electromagnetic shielding effects may be achieved by encasing feed-through structure 2800 with a metallic shell to block electromagnetic radiation.

Figure 30:
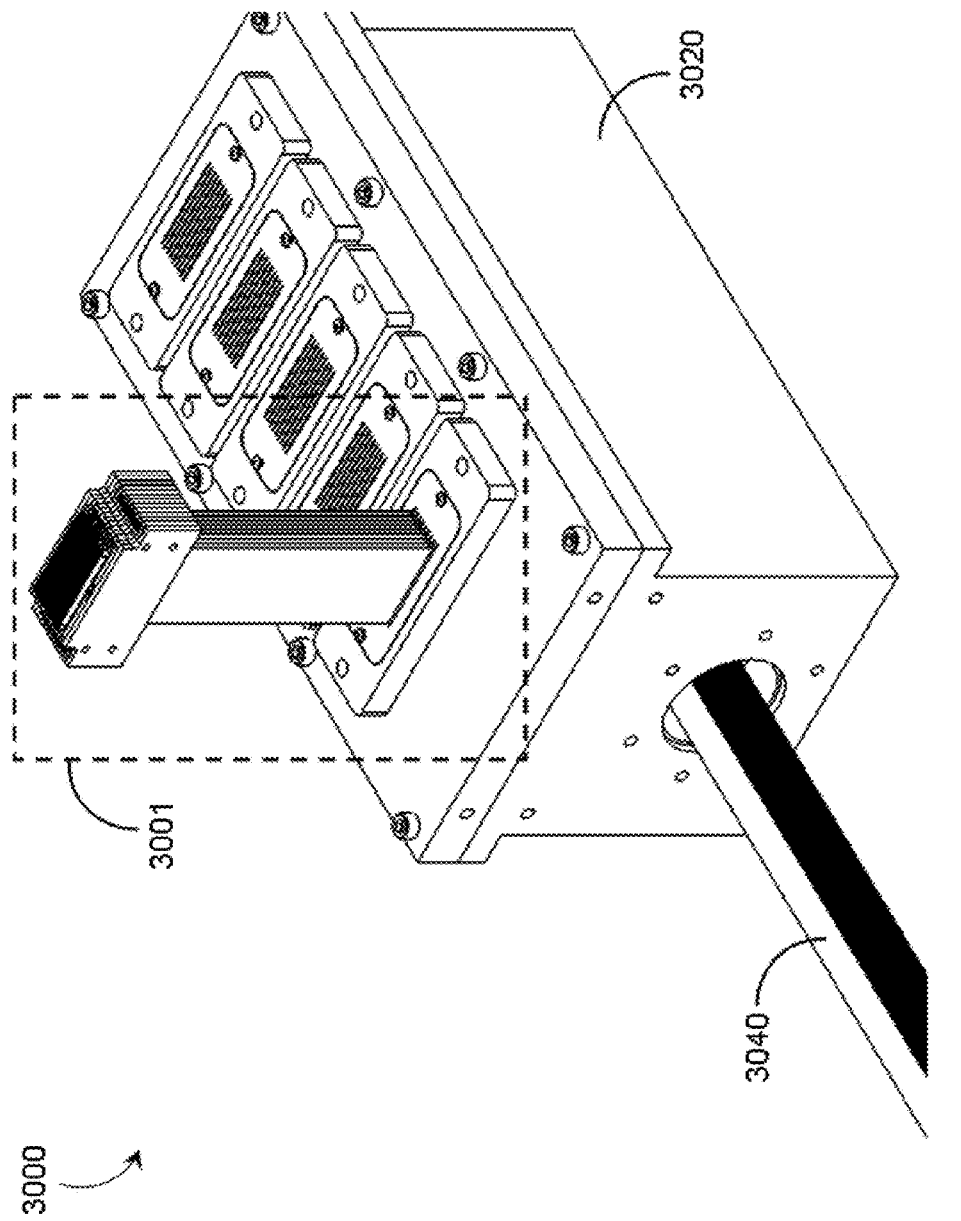
FIG. 30 is an isometric view of an embodiment of a hermetically sealed electrical communication interface comprising a plurality of hermetically sealed electrical feed-through structures all mounted to a vacuum box.

In some embodiments, a plurality of hermetically sealed electrical feed-through structures, such as feed-through structure 2800, may be mounted to a single vacuum box (e.g., vacuum connector box 1116 from FIG. 11). FIG. 30 is an isometric view of an embodiment of a hermetically sealed electrical communication interface 3000 comprising a plurality of hermetically sealed electrical feed-through structures 3001 (only one fully illustrated and called out in the Figure to reduce clutter) all mounted to a vacuum box 3020. Vacuum box 3020 includes a plurality of openings (not visible in the Figure) each for receiving a respective feed-through structure 3001. Vacuum box 3020 is also hollow to accommodate electrical cables (e.g., flexible printed circuit board cables 3040) that transmit through each feed-through structure 3001. Feed-through structure 3001 may be substantially similar to feed-through structure 2800 from FIGS. 28 and 29, and flexible printed circuit board cables 3040 may extend within the refrigerated environment (not shown) to provide electrical communication with devices therein. In embodiments for which electromagnetic shielding is desired, the hollow volume of vacuum box 3020 may be at least partially filled with a metal wool, such as brass wool, to block the transmission of electromagnetic radiation through the feed-through structures 3001.

Various embodiments described herein provide systems and devices for establishing electrical communication between two environments that are at substantially different pressures. The implementation of hermetically sealed electrical feed-through structures as opposed to electrical connectors enables an electrical signal path to be carried through a continuous conductor that extends through the interface between the two environments without passing through a noisy connector. In the preferred embodiment, the present systems and devices implement flexible printed circuit board cables in lieu of traditional cables.

As will be apparent to those skilled in the art, the various embodiments described above can be combined to provide further embodiments. Aspects of the present systems, devices, and methods can be modified, if necessary, to employ systems, methods, apparatus and concepts of the various patents, applications and publications to provide yet further embodiments of the systems, devices, and methods. For example, the various systems, devices, and methods may include a different number of metal or dielectric layers than set out in the illustrated embodiments, such as three or more metal layers and two or more insulating dielectric layers alternating with the metal layers, the layers may be disposed in a different order or area, or the embodiments may omit some elements, and/or employ additional elements.

All of the U.S. patents, U.S. patent application publications, U.S. patent applications, foreign patents, foreign patent applications and non-patent publications referred to in this specification including, but not limited to: U.S. Provisional Patent Application Ser. No. 61/080,996, filed Jul. 15, 2008, entitled "Input/Output System and Devices for Use with Superconducting Devices"; U.S. Provisional Patent Application Ser. No. 61/080,997, filed Jul. 15, 2008, entitled "Systems, Methods, and Apparatus for Differential Electrical Filters"; U.S. Provisional Patent Application Ser. No. 61/110,382, filed Oct. 31, 2008, entitled "Systems and Devices for Hermetically Sealed Electrical Feed-Throughs"; US Patent Publication No. 2006-0225165; US Patent Publication No. 2008-0176750; U.S. patent application Ser. No. 12/266,378; PCT Patent Application Serial No. PCT/US09/37984; U.S. patent application Ser. No. 12/016,801; US Patent Publication No. 2008-0176751; U.S. Provisional Patent Application Ser. No. 61/104,179, filed Oct. 9, 2008, entitled "Systems, Methods and Apparatus for Measuring Magnetic Fields"; U.S. patent application Ser. No. 12/256,332; US Patent Publication No. 2008-0215850; PCT Patent Application Serial No. PCT/US09/032744; US Patent Publication No. 2009-0122508; and US Patent Publication No. 2009-0168286, are incorporated herein by reference, in their entirety and for all purposes. Aspects of the embodiments can be modified, if necessary, to employ systems, circuits and concepts of the various patents, applications and publications to provide yet further embodiments.

These and other changes can be made to the present systems, devices, and methods in light of the above description. In general, in the following claims, the terms used should not be construed to limit the systems, devices, and methods to the specific embodiments disclosed in the specification and the claims, but should be construed to include all possible embodiments along with the full scope of equivalents to which such claims are entitled. Accordingly, the systems, devices, and methods are not limited by the disclosure, but instead its scope is to be determined entirely by the following claims.

We claim:

1. An electrical filter device comprising:
 a dielectric substrate including a signal surface and a ground surface distinct from the signal surface, the dielectric substrate having an input end and an output end, at least a first wide region between the input and the output ends, the first wide region having a first through-hole and a second through-hole, and at least a first narrow region between the input and the output ends;
 a first input conductive trace and a second input conductive trace carried by the signal surface at least proximate the input end of the dielectric substrate;
 a first output conductive trace and a second output conductive trace carried by the signal surface at least proximate the output end of the dielectric substrate;
 a first signal conductive trace and a second signal conductive trace carried by the signal surface in the first wide region of the dielectric substrate;
 a first ground conductive trace carried by the ground surface in the first wide region of the dielectric substrate, such that the first and the second signal conductive traces are electrically insulated from the first ground conductive trace;
 a first length of conductor, wherein at least a portion of the first length of conductor is wound about the first narrow region of the dielectric substrate to form a first bottom coil;
 a second length of conductor, wherein at least a portion of the second length of conductor is wound about the at least a portion of the first length of conductor that is wound about the first narrow region of the dielectric substrate to form a first top coil, wherein the first top coil is wound about the first bottom coil to form a first top-bottom coil pair;
 a first capacitor and a second capacitor;
 an enclosure including a first open end and a second open end, wherein the enclosure is formed by substantially non-magnetic metal that separates an inner volume of the enclosure from an exterior thereof, and wherein the dielectric substrate, the first top-bottom coil pair, the first capacitor, and the second capacitor are received in the inner volume of the enclosure;
 an input connector electrically connected to at least one of the first and the second input conductive traces, wherein the input connector physically couples to the enclosure, thereby closing the first open end of the enclosure; and
 an output connector electrically connected to at least one of the first and the second output conductive traces, wherein the output connector physically couples to the enclosure, thereby closing the second open end of the enclosure, and wherein:
 the first narrow region is interrupted by a first coiling tab that divides the first narrow region into a first leftmost section and a first rightmost section;
 the first length of conductor and the second length of conductor are both wound about the first leftmost section in a same coiling direction with respect to one another;
 one of the first length of conductor or the second length of conductor is wound at least partially around the first coiling tab; and
 the first length of conductor and the second length of conductor are wound about the first rightmost section in opposite coiling directions with respect to one another.

2. The electrical filtering device of claim 1 wherein:
 the first length of conductor is wound about both the first leftmost section and the first rightmost section in a first coiling direction, such that the first bottom coil is wound entirely in the first coiling direction about the first narrow region;
 the second length of conductor is wound about the first leftmost section in the first coiling direction such that a first section of the first top coil is wound in the first coiling direction on top of the first bottom coil;
 the second length of conductor is wound at least partially around the first coiling tab; and the second length of conductor is wound about the first rightmost section in a second coiling direction that is opposite to the first coiling direction, such that a second section of the first top coil is wound in the second coiling direction on top of the first bottom coil.

3. The electrical filter device of claim 1 wherein the first capacitor is at least partially received in the first through-hole of the first wide region and the second capacitor is at least partially received in the second through-hole of the first wide region, and further comprising:
   an electrical connection between a first end of the first capacitor and the first signal conductive trace and an electrical connection between a second end of the first capacitor and the first ground conductive trace, thereby providing a capacitive coupling between the first signal conductive trace and the first ground conductive trace; and
   an electrical connection between a first end of the second capacitor and the second signal conductive trace and an electrical connection between a second end of the second capacitor and the first ground conductive trace, thereby providing a capacitive coupling between the second signal conductive trace and the first ground conductive trace.

4. The electrical filter device of claim 3, further comprising:
   a damping resistor electrically coupled to both the first signal conductive trace and the second signal conductive trace.

5. The electrical filter device of claim 3 wherein the enclosure includes a first hole that connects the inner volume of the enclosure to the exterior thereof, and wherein the dielectric substrate is positioned inside the enclosure such that the first wide region aligns with the first hole in the enclosure, and further comprising:
   a piece of solder that seals the first hole in the enclosure and that provides an electrical connection between the first ground conductive trace and the enclosure.

6. The electrical filter device of claim 5, further comprising:
   an epoxy mixture that includes an epoxy and a metal powder that is predominately non-superconducting and substantially non-magnetic, wherein at least a portion of the inner volume of the enclosure is filled with the epoxy mixture such that at least a portion of the first top-bottom coil pair is embedded in the epoxy mixture.

7. The electrical filter device of claim 3, further comprising:
   an electrical connection between the first length of conductor and the first input conductive trace;
   an electrical connection between the first length of conductor and the first signal conductive trace;
   an electrical connection between the second length of conductor and the second input conductive trace; and
   an electrical connection between the second length of conductor and the second signal conductive trace.

8. The electrical filter device of claim 7, further comprising:
   an electrical connection between the first length of conductor and the first output conductive trace; and
   an electrical connection between the second length of conductor and the second output conductive trace.

9. The electrical filter device of claim 3 wherein the dielectric substrate further includes a second wide region between the first wide region and the output end, the second wide region having a third and a fourth through-hole, and a second narrow region between the first and the second wide regions, the electrical filter device further comprising:
   a third signal conductive trace and a fourth signal conductive trace carried by the signal surface of the second wide region of the dielectric substrate;
   a second ground conductive trace carried by the ground surface of the second wide region of the dielectric substrate, such that the third and the fourth signal conductive traces are electrically insulated from the second ground conductive trace;
   a third length of conductor, wherein at least a portion of the third length of conductor is wound about the second narrow region of the dielectric substrate to form a second bottom coil;
   a fourth length of conductor, wherein at least a portion of the fourth length of conductor is wound about the at least a portion of the third length of conductor that is wound about the second narrow region of the dielectric substrate to form a second top coil, wherein the second top coil is wound about the second bottom coil to form a second top-bottom coil pair; and
   a third capacitor and a fourth capacitor.

10. The electrical filtering device of claim 9 wherein:
   the second narrow region is interrupted by a second coiling tab that divides the second narrow region into a second leftmost section and a second rightmost section;
   the third length of conductor is wound about both the second leftmost section and the second rightmost section in the first coiling direction, such that the second bottom coil is wound entirely in the first coiling direction about the second narrow region;
   the fourth length of conductor is wound about the second leftmost section in the first coiling direction such that a first section of the second top coil is wound in the first coiling direction on top of the second bottom coil;
   the fourth length of conductor is wound at least partially around the second coiling tab; and
   the fourth length of conductor is wound about the second rightmost section in the second coiling direction that is opposite to the first coiling direction, such that a second section of the second top coil is wound in the second coiling direction on top of the second bottom coil.

11. The electrical filter device of claim 9 wherein the third capacitor is at least partially received in the third through-hole of the second wide region and the fourth capacitor is at least partially received in the fourth through-hole of the second wide region, and further comprising:
   an electrical connection between a first end of the third capacitor and the third signal conductive trace and an electrical connection between a second end of the third capacitor and the second ground conductive trace, thereby providing a capacitive coupling between the third signal conductive trace and the second ground conductive trace; and
   an electrical connection between a first end of the fourth capacitor and the fourth signal conductive trace and an electrical connection between a second end of the fourth capacitor and the second ground conductive trace, thereby providing a capacitive coupling between the fourth signal conductive trace and the second ground conductive trace.

12. The electrical filter device of claim 11, further comprising:
   a first damping resistor electrically coupled to both the first signal conductive trace and the second signal conductive trace; and a second damping resistor electrically coupled to both the third signal conductive trace and the fourth signal conductive trace.

13. The electrical filter device of claim 11 wherein the enclosure includes a first hole and a second hole that each connect the inner volume of the enclosure to the exterior thereof, and wherein the dielectric substrate is positioned inside the enclosure such that the first wide region aligns with the first hole in the enclosure and the second wide region aligns with the second hole in the enclosure, and further comprising:
   a first piece of solder that seals the first hole in the enclosure and that provides an electrical connection between the first ground conductive trace and the enclosure and a second piece of solder that seals the second hole in the enclosure and that provides an electrical connection between the second ground conductive trace and the enclosure.

14. The electrical filter device of claim 13, further comprising:
   an epoxy mixture that includes an epoxy and a metal powder that is predominately non-superconducting and substantially non-magnetic, wherein at least a portion of the inner volume of the enclosure is filled with the epoxy mixture such that at least a portion of the second top-bottom coil pair is embedded in the epoxy mixture.

15. The electrical filter device of claim 11, further comprising:
   an electrical connection between the third length of conductor and the first length of conductor;
   an electrical connection between the third length of conductor and the third signal conductive trace;
   an electrical connection between the fourth length of conductor and the second length of conductor; and
   an electrical connection between the fourth length of conductor and the fourth signal conductive trace.

16. The electrical filter device of claim 15, further comprising:
   an electrical connection between the third length of conductor and the first output conductive trace; and
   an electrical connection between the fourth length of conductor and the second output conductive trace.

17. The electrical filter device of claim 11, further comprising:
   an electrical connection between the third length of conductor and the second length of conductor;
   an electrical connection between the third length of conductor and the third signal conductive trace;
   an electrical connection between the fourth length of conductor and the first length of conductor; and
   an electrical connection between the fourth length of conductor and the fourth signal conductive trace.

18. The electrical filter device of claim 17, further comprising:
   an electrical connection between the third length of conductor and the first output conductive trace; and
   an electrical connection between the fourth length of conductor and the second output conductive trace.

19. The electrical filtering device of claim 1 wherein at least one of the lengths of conductors is a conductive wire that includes a material that is superconducting below a critical temperature.

20. The electrical filtering device of claim 1 wherein at least one of the conductive traces includes a material that is superconducting below a critical temperature.

21. The electrical filtering device of claim 1 wherein at least one of the input connector and the output connector is selected from the group consisting of: a coaxial cable, a coaxial connector, an ultra-miniature coaxial cable, an ultra-miniature coaxial cable connector, a single conductor wire, a conductive pin, a solder connection, a spring contact, and an SMA connector.

\* \* \* \* \*